(12) United States Patent
Li

(10) Patent No.: US 7,741,918 B1
(45) Date of Patent: Jun. 22, 2010

(54) SYSTEM AND METHOD FOR AN ENHANCED NOISE SHAPING FOR SPREAD SPECTRUM MODULATION

(75) Inventor: Shuliang Li, Lynnwood, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 134 days.

(21) Appl. No.: 11/590,287

(22) Filed: Oct. 30, 2006

Related U.S. Application Data

(63) Continuation-in-part of application No. 11/172,691, filed on Jun. 30, 2005, now Pat. No. 7,405,629.

(51) Int. Cl.
*H03B 29/00* (2006.01)
*H03L 7/18* (2006.01)

(52) U.S. Cl. ............................. 331/16; 331/1 A; 331/78

(58) Field of Classification Search .................. 331/1 A, 331/16, 18, 25, 78
See application file for complete search history.

(56) References Cited

U.S. PATENT DOCUMENTS

| | | | |
|---|---|---|---|
| 3,868,597 | A | 2/1975 | Gollinger |
| 4,857,866 | A | 8/1989 | Tateishi |
| 4,965,531 | A | 10/1990 | Riley |
| 5,021,754 | A | 6/1991 | Shepherd et al. |
| 5,036,216 | A | 7/1991 | Hohmann et al. |
| 5,036,294 | A | 7/1991 | McCaslin |
| 5,055,802 | A | 10/1991 | Hietala et al. |
| 5,084,685 | A | 1/1992 | Moller et al. |
| 5,117,206 | A | 5/1992 | Imamura |
| 5,182,528 | A | 1/1993 | Zuta |
| 5,457,433 | A | 10/1995 | Westwick |
| 5,483,558 | A | 1/1996 | Leon et al. |
| 5,486,795 | A | 1/1996 | Spence et al. |
| 5,566,093 | A | 10/1996 | Holzer |
| 5,631,920 | A | 5/1997 | Hardin |
| 5,703,540 | A | 12/1997 | Gazda et al. |
| 5,764,112 | A | 6/1998 | Bal et al. |

(Continued)

FOREIGN PATENT DOCUMENTS

EP     1345375     9/2003

(Continued)

OTHER PUBLICATIONS

Shuliang Li, Application entitled: "A Phase Lock Loop Control System and Method", Filing date: Oct. 30, 2006, U.S. Appl. No. 11/590,385.

(Continued)

*Primary Examiner*—David Mis

(57) ABSTRACT

A frequency synthesizer is described. In particular, the frequency synthesizer includes a modulator circuit for producing a signal of modulated frequency. The frequency synthesizer includes an accumulator for summing a plurality of errors in the modulator circuit. An error sum value is generated. More particularly, the accumulator increases the rate of sign change of the plurality of errors. An error signal modulator is coupled to the accumulator and modulates an index that is associated with a current error based on the error sum value. The index that is modulated is used for selecting a feedback loop divider count value used for dividing a frequency of the signal. As a result, the error noise around a target signal shows an increased sign change of error, which moves the error noise to higher frequencies. This improves EMI performance.

22 Claims, 41 Drawing Sheets

U.S. PATENT DOCUMENTS

| | | | |
|---|---|---|---|
| 5,781,044 A | 7/1998 | Riley et al. | |
| 5,861,766 A | 1/1999 | Baumer et al. | |
| 6,104,257 A | 8/2000 | Mann | |
| 6,154,158 A | 11/2000 | Walker | |
| 6,167,245 A | 12/2000 | Welland et al. | |
| 6,181,218 B1 | 1/2001 | Clark et al. | |
| 6,236,703 B1 | 5/2001 | Riley | |
| 6,285,264 B1 | 9/2001 | Mann | |
| 6,308,055 B1 | 10/2001 | Welland et al. | |
| 6,377,646 B1 | 4/2002 | Sha | |
| 6,456,164 B1 | 9/2002 | Fan | |
| 6,509,800 B2 | 1/2003 | Stockton | |
| 6,563,390 B1 | 5/2003 | Kizziar | |
| 6,707,855 B2 | 3/2004 | Patana | |
| 6,779,010 B2 | 8/2004 | Humphreys et al. | |
| 6,919,744 B2* | 7/2005 | Paist et al. | 327/115 |
| 7,015,733 B2 | 3/2006 | Giuroiu | |
| 7,042,258 B2 | 5/2006 | Booth et al. | |
| 7,065,172 B2 | 6/2006 | Xiu et al. | |
| 7,119,630 B1 | 10/2006 | Li | |
| 7,123,101 B2 | 10/2006 | Puma et al. | |
| 7,126,436 B1 | 10/2006 | Li | |
| 7,127,225 B2 | 10/2006 | Jaehne et al. | |
| 7,323,916 B1 | 1/2008 | Sidiropoulos et al. | |
| 7,330,078 B1 | 2/2008 | Li et al. | |
| 7,356,107 B2 | 4/2008 | Xiu et al. | |
| 7,382,817 B2 | 6/2008 | Ojard et al. | |
| 7,405,629 B2 | 7/2008 | Li | |
| 2003/0058055 A1 | 3/2003 | Sridharan | |
| 2003/0142838 A1 | 7/2003 | Brennan et al. | |
| 2004/0022340 A1 | 2/2004 | Jaehne et al. | |
| 2005/0017887 A1 | 1/2005 | Nagaso et al. | |

FOREIGN PATENT DOCUMENTS

| | | |
|---|---|---|
| WO | 99/14859 | 3/1999 |

OTHER PUBLICATIONS

Shuliang Li, Application entitled: "Spread Spectrum Frequency Synthesizer With Improved Frequency Shape by Adjusting the Length Ofa Standard Curve Used for Spread Spectrum Modulation", Filing Date: Oct. 30, 2006, U.S. Appl. No. 11/590,483.

Shuliang Li, Application entitled: "A Phase Lock Loop Control Error Selection System and Method":, Filing Date: Oct. 30, 2006, U.S. Appl. No. 11/590,361.

Shuliang Li, Application entitled: "Phase Lock Loop control System and Method with Non-Consecutive Feedback Divide Values", Filing Date: Oct. 30, 2006, U.S. Appl. No. 11/590,362.

Shuliang Li, Application entitled: "Spread Spectrum Frequency Synthesizer with First Order Accumulation For Frequency Profile Generation", Filing Date: Oct. 30, 2006, U.S. Appl. No. 11/590,433.

Shuliang Li, Application entitled: "Spread Spectrum Frequency Synthesizer With Higher Order Accumulation For Frequency Profile Generation", Filing Date: Oct. 30, 2006, U.S. Appl. No. 11/590,149

Shuliang Li, Application entitled: "A Simplified Phase Lock Loop Control Model System and Method", Filing Date: Oct. 30, 2006, U.S. Appl. No. 11/590,078.

Shuliang, Li, Application entitled: "Spread Spectrum Frequency Synthesizer With Improved Frequency Profile by Adjusting the Shape of a Standard Curve Used for Spread Spectrum Modulation", Filing Date: Oct. 30, 2006, U.S. Appl. No. 11/590,481.

Shuliang, Li, Application entitled: "Frequency Modulator, Circuit, and Method That Uses Multiple Vector Accumulation to Achieve Fractional-n. Frequency Synthesis", Filing Date: Jun. 30, 2005, U.S. Appl. No. 11/172,691.

DeMuer et al., "A 1.8 Ghz CMOS Fractional-N. Synthesizer, "EP Solid-State Circuits Conference, 2001, 4 pages.

Ahola et al., "A 2GHz Fractional-n. Frequency Synthesizer in 0.35 CMOS," EP Solid-State Circuits Conference, 2000 4 pages.

Lin et al., "A 900-MHz 2.5-mA CMOS Frequency Synthesizer with an Automatic SC Tuning Loop," IEEE Journal of Solid-States Circuits, vol. 36, No. 3, Mar. 2001, pp. 424-431.

Schmitt et al., Designing an EMC-Compliant UHF Oscillator, RF Design, Oct. 2000, 8 pages.

Heuberger et al., "Integrated RF Transmitter Based on Saw Oscillator," EP Solid-State Circuits Conference, 1997, 4 pages.

Texas Instruments, Technical Brief SWRA029, "FractionallInteger-N PLL Basics," Aug. 1999, pp. 1-54.

International Search Report. PCT/US2006/02476, mailed Oct. 12, 2006.

USPTO Notice of Allowance for U.S. Appl. No. 10/947,518 dated Jun. 2, 2006; 4 pages.

USPTO Non-Final Rejection for U.S. Appl. No. 10/947,518 dated Dec. 28, 2005; 5 pages.

USPTO Notice of Allowance for U.S. Appl. No. 10/947,519 dated Jun. 9, 2006; 6 pages.

USPTO Non-Final Rejection for U.S. Appl. No. 10/947,519 dated Dec. 20, 2005; 5 pages.

USPTO Notice of Allowance for U.S. Appl. No. dated Mar. 19, 2008; 8 pages.

USPTO Final Rejection for or U.S. Appl. No. 11/172,691 dated Jul. 19, 2007; 7 pages.

USPTO Non-Final Rejection for U.S. Appl. No. 11/172,691 dated Feb. 2, 2007; 9 pages.

USPTO Final Rejection for U.S. Appl. No. 11/590.385 dated Jan. 15, 2009; 7 pages.

USPTO Non-Final Rejection for U.S. Appl. No. 11/590,385 dated Jul. 17, 2008; 8 pages.

USPTO Final Rejection for U.S. Appl. No. 11/590,361 dated Dec. 4, 2008; 8 pages.

USPTO Non-Final Rejection for U.S. Appl. No. 11/590,361 dated May 13, 2008; 7 pages.

USPTO Non-Final Rejection for U.S. Appl. No. 11/590,481 dated Nov. 26, 2008; 8 pages.

USPTO Final Rejection for U.S. Appl. No. 11/590,078 dated Jan. 15, 2009; 8 pages.

USPTO Non-Final Rejection for U.S. Appl. No. 11/590,078 dated Jul. 17, 2008. 8 pages.

USPTO Final Rejection for U.S. Appl. No. 11/590,362 dated Jan. 14, 2009; 7 pages.

USPTO Non-Final for U.S. Appl. No. 11/590,362 dated Jul. 17, 2008; 8 pages.

USPTO Notice of Allowance for U.S. Appl. No. 11/590,483 dated Jan. 16, 2009; 4 pages.

USPTO Notice of Allowance for U.S. Appl. No. 11/590,483 dated Aug. 12, 2008; 5 pages.

USPTO Notice of Allowance for U.S. Appl. No. 11/590,483 dated May 11, 2008: 6 pages.

USPTO Advisory Action for U.S. Appl. No. 11/590,385 dated Mar. 25, 2009; 3 pages.

USPTO Non-Final Rejection for U.S. Appl. No. 11/590,385 dated Jun. 25, 2009; 10 pages.

USPTO Non-Final Rejection for U.S. Appl. No. 11/590,361 dated Mar. 30, 2009; 8 pages.

USPTO Notice of Allowance for U.S. Appl. No. 11/590,481 dated Jun. 4, 2009; 6 pages.

USPTO Advisory Action for U.S. Appl. No. 11/590,078 dated Mar. 25, 2009; 3 pages.

USPTO Non-Final Rejection for U.S. Appl. No. 11/590,078 dated Jun. 25, 2009; 10 pages.

USPTO Advisory Action for U.S. Appl. No. 11/590,362 dated Apr. 3, 2009; 3 pages.

USPTO Non-Final Rejection for Application No. 11/590,362 dated Jun. 15, 2009; 11 pages.

USPTO Notice of Allowance for Application No. 11/590,483 dated May 7, 2009; 5 pages.

U.S. Appl. No. 09/753,063: "Digitally Compensated Voltage Controlled Oscillator," John Kizziar; filed Dec. 29, 2000; 27 pages.

U.S. Appl. No. 09/120,536: "Spread Spectrum at Phase Lock Loop (PLL) Feedback Path Mthod and System," I-TEH SHA; filed Jul. 12, 1998; 37 pages.

USPTO Notice of Allowance fot U.S. Appl. No. 09/753,063 dated Dec. 3, 2002; 2 pages.

USPTO Non-Final Rejection for U.S. Appl. No. 09/753.063 dated Jun. 26, 2002; 3 pages.

USPTO Non-Final Rejection for U.S. Appl. No. 09/753,063 dated Dec. 5, 2001; 3 pages.

USPTO Notice of Allowance for U.S. Appl. No. 09/120,536 dated Aug. 22, 2001; 1 page.

USPTO Non-Final Rejection for U.S. Appl. No. 09/120,536 dated May 4, 2001; 5 pages.

USPTO Restriction for Requirement/Election for U.S. Appl. No. 09/120,536 dated Mar. 12, 2001; 3 pages.

"Spread Spectrum Clock Generator," W42C31/32, IC Works, Revision 0.1, Mar. 1997, Appendix A-C; 20 pages.

USPTO Notice of Allowance for U.S. Appl. No. 08/995,485 dated Mar. 29, 2000; 2 pages.

USPTO Non-Final Rejection for U.S. Appl. No. 08/995,485 dated Dec. 17, 1999; 7 pages.

USPTO Final Rejection for U.S. Appl. No. 08/995,485 dated Aug. 18, 1999: 9 pages.

USPTO Final Rejection U.S. Appl. No. 08/995,485 dated Apr. 7, 1999; 5 pages.

USPTO Non-Final Rejection tor U.S. Appl. No. 081995,485 dated Oct. 27, 1998; 3 pages.

USPTO Notice of Allowance for U.S. Appl. No. 09/638,100 dated Apr. 12, 2001; 1 page.

USPTO Non-Final Rejection for U.S. Appl. No. 09/638,100 dated Nov. 30, 2000; 5 pages.

USPTO Notice of Allowance for Application No. 11/590,481 dated 12/1812009; 4 pages.

USPTO Final Rejection for Application No. 11/590,361 dated Nov. 16, 2009; 8 pages.

USPTO Final Rejection for Application No. 11/590,078 dated Jan. 13, 2010; 11 pages.

USPTO Final Rejection for Application No. 11/590,362 dated Nov. 24, 2009; 12 pages.

USPTO Notice of Allowance for Application No. 11/590,483 dated Aug. 16, 2009; 5 pages.

USPTO Notice of Allowance for U.S.Appl. No. 11/590,483 dated Nov. 18, 2009; 5 pages.

USPTO Final Rejection for U.S. Appl. No. 11/590,385 dated Jan. 13, 2010; 11 pages.

USPTO Notice of Allowance for U.S. Appl. No. 11/590,361 dated Jan. 27, 2010; 6 pages.

* cited by examiner

1325

1800A

SYSTEM AND METHOD FOR AN ENHANCED NOISE SHAPING FOR SPREAD SPECTRUM MODULATION

CROSS REFERENCE TO RELATED APPLICATIONS

This application is a continuation in part and claims the benefit of and is related to U.S. patent application Ser. No. 11/172,691 by Shuilang Li filed on Jun. 30, 2005 now U.S. Pat. No. 7,405,629 "$F_R$ EQUENCY MODULATOR CIRCUIT AND METHOD THAT USES MULTIPLE VECTOR ACCUMULATION TO ACHIEVE $F_R$ ACTIONAL-N $F_R$ EQUENCY SYNTHESIS", all of which are assigned to the assignee of the present invention, which are incorporated herein by reference.

This application is related to the following co-pending Applications:

U.S. patent application Ser. No. 11/590,385 entitled "A PHASE LOCK LOOP CONTROL SYSTEM AND METHOD" by Shuilang Li filed on Oct. 30, 2006;

U.S. patent application Ser. No. 11/590,361 entitled "A PHASE LOCK LOOP CONTROL ERROR SELECTION SYSTEM AND METHOD" by Shuilang Li filed on Oct. 30, 2006;

U.S. patent application Ser. No. 11/590,362 entitled "A PHASE LOCK LOOP CONTROL SYSTEM AND METHOD WITH NON-CONSECUTIVE FEEDBACK DIVIDE VALUES" by Shuilang Li filed on Oct. 20, 2006;

U.S. patent application Ser. No. 11/590,433 entitled "SPREAD SPECTRUM FREQUENCY SYNTHESIZER WITH FIRST ORDER ACCUMULATION FOR FRQUENCY PROFILE GENERATION" by Shuilang Li filed on Oct. 30, 2006;

U.S. patent application Ser. No. 11/590,149 entitled "SPREAD SPECTRUM FREQUENCY SYNTHESIZER WITH HIGH ORDER ACCUMULATION FOR FRQUENCY PROFILE GENERATION" by Shuilang Li filed on Oct. 3, 2006;

U.S. patent application Ser. No. 11/590,483 entitled "SPREAD SPECTRUM FREQUENCY SYNTHESIZER WITH IMPROVED FREQUENCY SHAPE BY ADJSTING THE LENGTH OF A STANDARD CURVE USED FOR SPREAD SPECTRUM MODULATION" by Shuilang Li filed on Oct. 30, 2006;

U.S. patent application Ser. No. 11/590,078 entitled "A SIMPIFIED PHASE LOCK LOOP CONTROL MODEL SYSTEM AND METHOD" by Shuilang Li filed on Oct. 3, 2006; and U.S. patent application Ser. No. 11/590,481 entitled "SPREAD SPECTRUM FREQUENCY SYNTHESIZER WITHIMPROVED FREQENCY PROFILE BY ADJUSTING THE SHPAE OF A STANDARD CURVE USED FOR SPREAD SPECTRUM MODULATION" by Shuilang Li filed on Oct. 3, 2006.

TECHNICAL FIELD

Embodiments of the present invention relate to electronic technologies. More specifically, embodiments of the present invention are related to a phase lock loop control system and method.

BACKGROUND

The following descriptions are not admitted to be prior art by virtue of their inclusion in this section.

Electronic systems and circuits have made a significant contribution towards the advancement of modern society and are utilized in a number of applications to achieve advantageous results. Numerous electronic technologies such as digital computers, calculators, audio devices, video equipment, and telephone systems facilitate increased productivity and cost reduction in analyzing and communicating data, ideas and trends in most areas of business, science, education and entertainment. However, the electronic systems that provide these advantageous results typically emit electromagnetic signals. These electronic systems are also often operated in close physical proximity to other electronic systems and interfere with the operations of the other electronic systems. However, traditional attempts at mitigating electronic emissions are often expensive and relatively resource intensive.

A number of electronic systems include phase lock loops can be utilized in attempts to perform a variety of functions. For example, some phase lock loops are utilized in frequency synthesis. In a frequency synthesizer, a phase locked loop (PLL) is usually used to multiply/divide the frequency of a selected low frequency crystal. The PLL is used to force the frequency of a voltage controlled oscillator (VCO) output to change until a feedback loop frequency and an input frequency to a phase detector have a particular phase relationship. Controlling the output of the phase lock loop can be complicated and/or involve a relatively significant amount of circuit resources.

SUMMARY OF THE INVENTION

A frequency synthesizer is described. In particular, the frequency synthesizer includes a modulator circuit for producing a signal of modulated frequency. The frequency synthesizer includes an accumulator for summing a plurality of errors in the modulator circuit. An error sum value is generated. More particularly, the accumulator increases the rate of sign change of the plurality of errors. An error signal modulator is coupled to the accumulator and modulates an index that is associated with a current error based on the error sum value. The index that is modulated is used for selecting a feedback loop divider count value used for dividing a frequency of the signal. As a result, the error noise around a target signal shows an increased sign change of error, which moves the error noise to higher frequencies. This improves EMI performance.

BRIEF DESCRIPTION OF THE DRAWINGS

The accompanying drawings, which are incorporated in and form a part of this specification, illustrate embodiments of the present invention and, together with the description, serve to explain the principles of the invention.

DETAILED DESCRIPTION OF THE INVENTION

Reference will now be made in detail to the embodiments of the present invention, systems and methods for modulating a phase lock loop (PLL) signal. While the invention will be described in conjunction with the embodiments, it will be understood that they are not intended to limit the invention to these embodiments. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Present invention phase-locked loop control systems and methods facilitate control of phase-lock loop operations. In one embodiment, phase-lock loop control systems and methods are utilized in the implementation of a modulated frequency synthesizer for facilitating efficient frequency spreading over a designated spectrum. It is appreciated that present invention embodiments can have a variety of implementations and can be compatible with vector accumulation. For example, a phase-locked loop control system or method can facilitate generation of a variety of modulation patterns, including but not necessarily limited to linear or non-linear modulation, standard or non-standard modulation, etc.

Accordingly, embodiments of the present invention facilitate generation of modulated signals. The modulation can be performed on the fly and can be scalable permitting multiple modulated patterns to be achieved (e.g., a variety of frequency spreads, a variety of fractional divisions, etc). The generation of multiple modulated signals is relatively fast and can be accomplished with utilization of a relatively small amount of resources (e.g. relatively small amount of circuits, memory, etc.). It is appreciated that the present invention can be implemented to facilitate generation of modulated signals that are compatible with a variety of different modulation schemes. In one embodiment, present invention modulation is utilized in frequency synthesis. It is also appreciated that the present invention can be compatible with facilitating realization of a number of objectives, including EMI reduction, encryption, radio communication etcetera.

General Modulated Frequency Synthesizing

Figure 1A:
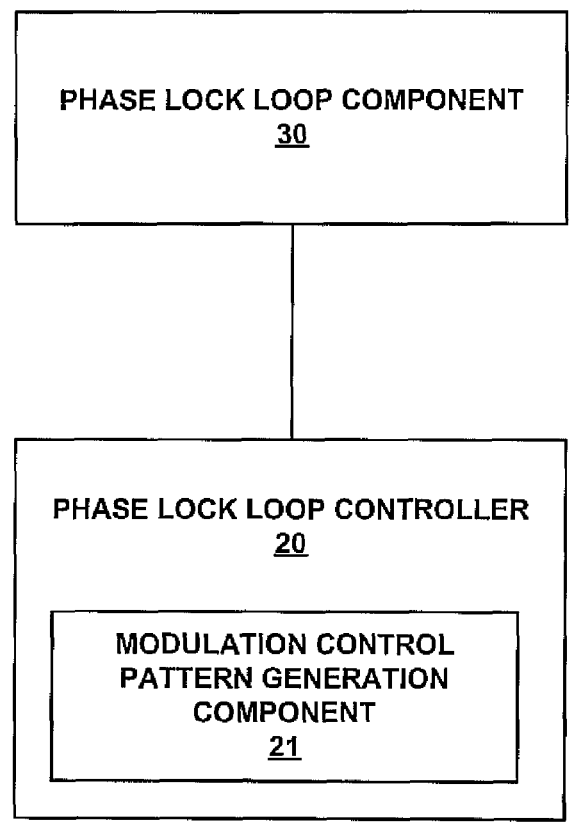
FIG. 1A is a block diagram of an exemplary modulation frequency synthesizer in accordance with one embodiment of the present invention.

FIG. 1A is a block diagram of exemplary modulation frequency synthesizer 10 in accordance with one embodiment of the present invention. In one embodiment, frequency synthesizer 10 is a modulation frequency synthesizer. Frequency synthesizer 10 includes phase lock loop controller 20 and phase lock loop component 30. Phase lock loop controller 20 is communicatively coupled to phase lock loop component 30. In one embodiment of the present invention, phase lock loop controller 20 includes modulation control pattern generation component 21.

The components of frequency synthesizer 10 cooperatively operate to perform frequency synthesis. Phase lock loop component 30 creates a modulated output signal. In one embodiment, phase lock loop component 30 creates a frequency modulated output signal. In one exemplary implementation, the frequency modulation is a spread spectrum modulation. Phase lock loop controller 20 controls phase lock loop component 30 in the generation of the output signal. Modulation control pattern generation component 21 generates a modulation control indication utilized by phase lock loop controller 20 to control the phase lock loop component 30.

It is appreciated that the modulation control indication can correspond to a variety of patterns, including cyclical, non-cyclical, standard, non-standard, linear, non-linear, etcetera. In one embodiment a standard pattern or curve is generate by mathematical calculation, which usually but not necessarily has a nice and simple repeatable shape. In one exemplary embodiment, the modulation control indication corresponds to a spread spectrum modulation. In one exemplary implementation, the modulation control indication corresponds to a fractional modulation.

Figure 1B:
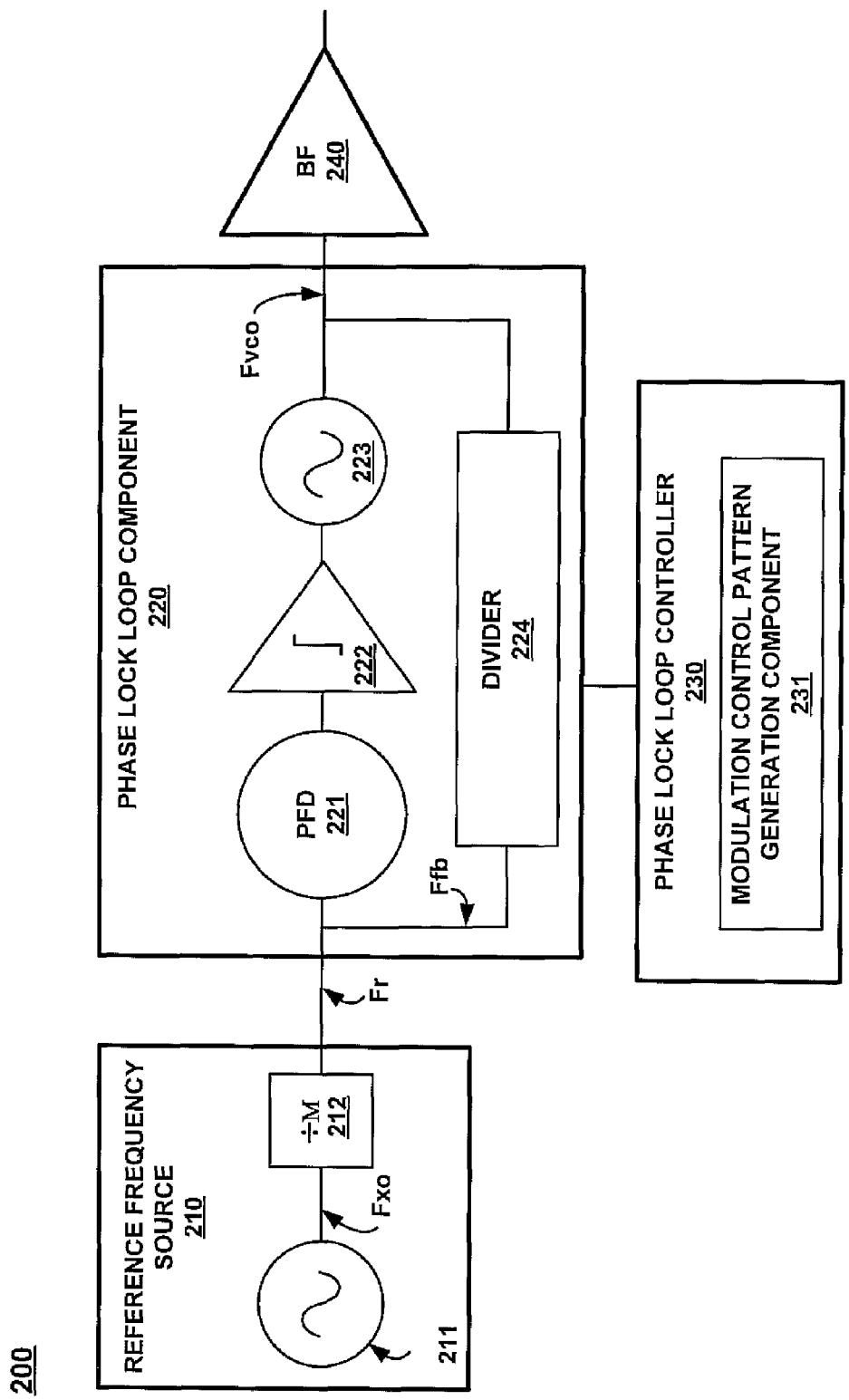
FIG. 1B is a block diagram of an exemplary modulation phase-locked loop (PLL) frequency synthesizer, in accordance with one embodiment of the present invention.

FIG. 1B is a block diagram of components of modulation phase-locked loop (PLL) frequency synthesizer 200, in accordance with one embodiment of the present invention. Modulation phase-locked loop (PLL) frequency synthesizer 200 is similar to modulation frequency synthesizer 10. For example phase lock loop component 220 is similar to one embodiment of phase lock loop component 30 and phase lock loop controller 230 is similar to one embodiment of phase lock loop controller 20. Modulation phase-locked loop (PLL) frequency synthesizer 200 includes reference frequency source 210, phase lock loop component 220, phase lock loop controller 230 and driver 240. Frequency source 210 is communicatively coupled to phase lock loop component 220 which is communicatively coupled to phase lock loop controller 230 and driver 240. In one embodiment, modulation phase-locked loop frequency synthesizer 200 is a spread spectrum modulation phase-locked loop frequency synthesizer.

In one embodiment, phase lock loop component 220 includes a phase frequency detector 221, an adjustment component 222, a voltage controlled oscillator 223, and a feedback loop divider 224. The components of phase lock loop component 220 are communicatively coupled sequentially to form a phase lock loop. Phase frequency detector 221 is coupled to adjustment component 222 which is coupled to voltage controlled oscillator 223. Voltage controlled oscillator 223 is coupled to feedback loop divider 224 which in turn is coupled back to phase frequency detector 221. In one embodiment, frequency synthesizer 200 facilitates the generation of multiple signal frequencies from a reference frequency $F_R$.

The reference frequency $F_R$ is provided by reference source 210. In one embodiment, multiple reference signal frequencies can be derived from a common source or time base. The time base may be forwarded from a crystal oscillator 211. As such, the output from the oscillator 211 is referred to as the initial base reference frequency $F_{XO}$. The initial base reference frequency $F_{XO}$ can be divided down. For example, an integer divider 212 can be coupled to the output of the oscillator 211 and utilized to divide the initial base reference frequency $F_{XO}$. The integer divider 212 produces a reference frequency $F_R$ which is forwarded to phase lock loop component 220.

The reference frequency $F_R$ can be tuned using, for example, a spread spectrum phase-locked loop (PLL) as part of a frequency synthesizer. Phase lock loop component 220 makes frequency modulation adjustments based upon control instructions from phase lock loop controller 230. In one embodiment, phase lock loop component 220 makes frequency adjustments directed to modulating the signal in accordance with desired patterns. For example, the desired patterns can be standard or non standard, linear or non linear, etc.

In one embodiment, phase frequency detector (PFD) 221 compares the reference frequency $F_R$ received from reference frequency source 210 with the feedback frequency $F_{FB}$. Phase frequency detector 221 generates a phase error or "error" signal based on the phase or frequency differences between the reference frequency $F_R$ and the feedback frequency $F_{FB}$. The phase and/or frequency error indication from the phase frequency detector 221 can be adjusted by adjustment component 222. In one embodiment, adjustment component 222 filters the signal. In one exemplary implementation, the phase and/or frequency error signal is forwarded to a filter included in adjustment component 222, such as a low pass filter for example. In addition to the filter, a charge pump can be included in adjustment component 222 and used to charge a voltage based on, for example, the feedback frequency leading or lagging the reference frequency $F_R$. The output of adjustment component is forwarded to voltage controlled oscillator 223.

The voltage controlled oscillator VCO 223 generates an output signal for the frequency synthesizer 200. Depending on the drive requirements, a driver 240 can be utilized to adjust the output signal power.

As shown, the feedback frequency $F_{FB}$ is a frequency from the voltage-controlled oscillator (VCO) 223 modulated by feedback loop divider 224 under the control of phase lock loop controller 230. While oscillator 223 produces an output signal $F_{VCO}$ proportional to a voltage applied thereon, the feedback loop divider 224 divides $F_{VCO}$ in accordance with modulation controls from phase lock loop controller 230. The frequency of the $F_{VCO}$ output signal from the synthesizer 200 can be tuned and/or modulated by changing the feedback loop divide value (also referred to as "P") within the feedback loop divider 224. The divide value acts as a denominator in dividing the frequency of the output signal $F_{VCO}$. In one embodiment of the present invention, feedback divider 224 is a counter and the divide value is the modulo or MOD value. It is appreciated that a variety of divider techniques, including dual modulus or multi-modulus dividers, can be utilized to implement feedback loop divider 224. The divide value is provided by modulation control pattern generation component 231.

It is appreciated that the present invention systems and methods are flexible and can be implemented in a variety of configurations. It is also appreciated an exemplary present invention phase lock loop controller can be compatible with realization of a variety of phase lock loop control schemes. In one embodiment, the modulation control indication includes an indication of a PLL control state and or control pattern. The PLL can be controlled by many signals, such as feedback divide value P, charge pump current $I_p$, VCO gain $K_{VCO}$, feedback clock delay $t_d$, etc. A set of one or a plurality of these signals or components used in modulating PLL is defined as a PLL control state. A sequence of PLL control states is also called control pattern. A set of one or a plurality of PLL operation signals, such as VCO frequency $f_{VCO}$ and voltages on several nodes of the loop filter, is defined as PLL operation state.

In one embodiment, the modulation control pattern generator 21 receives modulation information (e.g., including information derived from a desired PLL operation state sequence) as input and generates a modulation control pattern as output to control the PLL operation at a desired sequence of operation states. It is appreciated that the control pattern can include a variety of PLL control state components. In one embodiment, the control pattern is a sequence of P values. In one embodiment, the control pattern is a sequence of P values and charge pump current $I_p$'s. In one embodiment, the PLL operation state sequence comprises VCO frequency $f_{VCO}$ sequence (e.g., a frequency profile). In one embodiment, the PLL operation state comprises two voltage signals on two loop filter nodes.

The modulation control pattern generator can include a modulation feedback loop. The modulation feedback loop accepts modulation information as input and provides PLL control pattern information as an output. The modulation feedback loop can include auxiliary logic circuits that manipulate the input and output. In one embodiment, the input includes a standard Hershey Kiss pattern and modulation error compensation vectors. In one embodiment, the spread configuration information is first manipulated by a logic circuit to simplify an input interface. In one exemplary implementation, the output control pattern is first manipulated by a logic circuit to fit requirements of a PLL feedback counter interface.

Figure 1C:
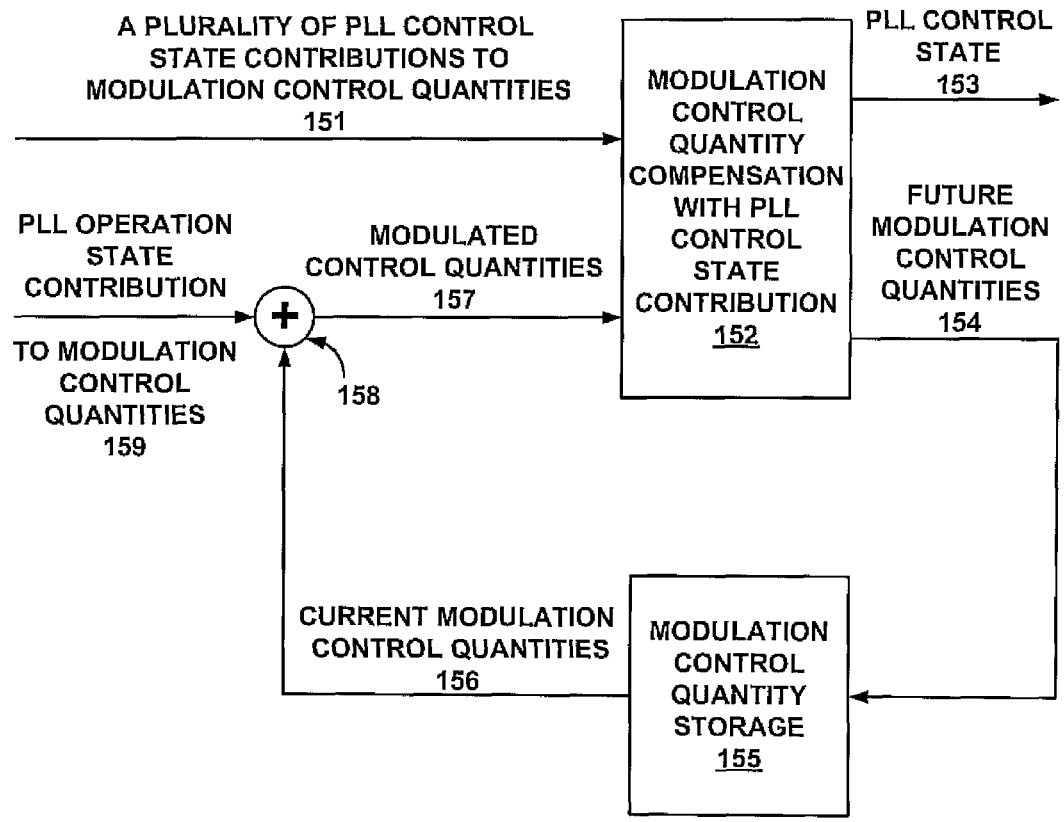
FIG. 1C is an exemplary architecture diagram of an exemplary modulation control pattern generator feedback loop in accordance with one embodiment of the present invention.

FIG. 1C is an exemplary architecture diagram of an exemplary modulation control pattern generator feedback loop 150 in accordance with one embodiment of the present invention. In one exemplary implementation, the feedback loop 150 controls at least one quantity called the modulation control quantity. The modulation control quantity is manipulated in the loop and the value of the modulation control quantity changes in accordance with the manipulation. In one embodiment, the manipulation includes modulation and compensation as a modulation control quantity propagates around the feedback loop. In one exemplary implementation, modulation is performed in accordance with a PLL operation state contribution and further compensated with a PLL control state contribution. In one embodiment, a controlled quantity is for negative feedback. The feedback loop 150 accepts modulation influence that changes the value of a control quantity. The feedback loop 150 can also further compensate the changed quantities to achieve a negative feedback loop control goal.

In FIG. 1C, mixer 158 accepts PLL operations state contributions to modulate modulation control quantities. The current modulation control quantities 156 are modulated with PLL operation state contribution signal 159 into modulated control quantity value 157 by mixer 158. The PLL operation state contribution signal 159 signal can also be called the modulation signal or modulation influence. A modulated control quantity 157 is compensated by a PLL control state contribution 151 in compensator 152 which outputs a PLL control state 153 and future modulation control quantities 154. In one exemplary implementation, for each PLL control state, there is an associated contribution. Compensation component 152 compensates modulation control quantities with PLL control state contributions and selects the associated PLL control state as a modulation pattern. The best contribution can be chosen by an algorithm implemented in the compensation circuit. Then a modulation control quantity can be compensated with the best PLL control state contribution. In one exemplary implementation, the compensated modulation control quantities are then generated by summing up the modulated control quantities and the selected best contribution. The compensated or future modulation control quantities 154 return to the starting point, for example, a storage element 155 in digital circuit, to close the loop. The quantities that come back to the starting point are referred to as "future" modulation control quantities 154, since they enter the next cycle of the loop in the future. The PLL control state output 153 associated with the modulated and compensated modulation control quantity is forwarded to the PLL control circuit.

It is appreciated a variety of algorithms can be utilized to implement the contribution selection in the compensation circuit 152 that corresponds to a modulation goal or objective. In one embodiment, the objective is to minimize the deviation from initial state of the quantities. In another embodiment, the goal is to compensate for minimum weighted error sum of compensated quantities. In another embodiment, the goal is to minimize the deviation from target quantities which can be either constants or variables. Yet in another embodiment, the goal is to minimize the quantity deviation from zero.

In one embodiment with multiple control quantities, the control loop can have alternative architecture. In one embodiment, several loops can be used to work together.

In one embodiment with multiple control quantities, the control loop can have alternative architecture. In one embodiment, several loops can be used to work together.

While it is appreciated that the control pattern can include a variety of PLL control state components, the following descriptions focus on the PLL feedback loop divide value so as not to unnecessarily obfuscate embodiments of the present invention. A PLL feedback loop usually includes a divider (e.g., 224) to divide down a VCO frequency (e.g., $F_{VCO}$). The divider is often referred to as a PLL feedback divider or feedback counter. It can also be referred to as a P counter, P divider, M divider, M counter, N divider and/or N counter. In one embodiment of modulation phase-locked loop (PLL) frequency synthesizer 200 shown in FIG. 1B, phase lock loop controller 230 forwards PLL feedback loop divide values to divider 224.

Figure 2:
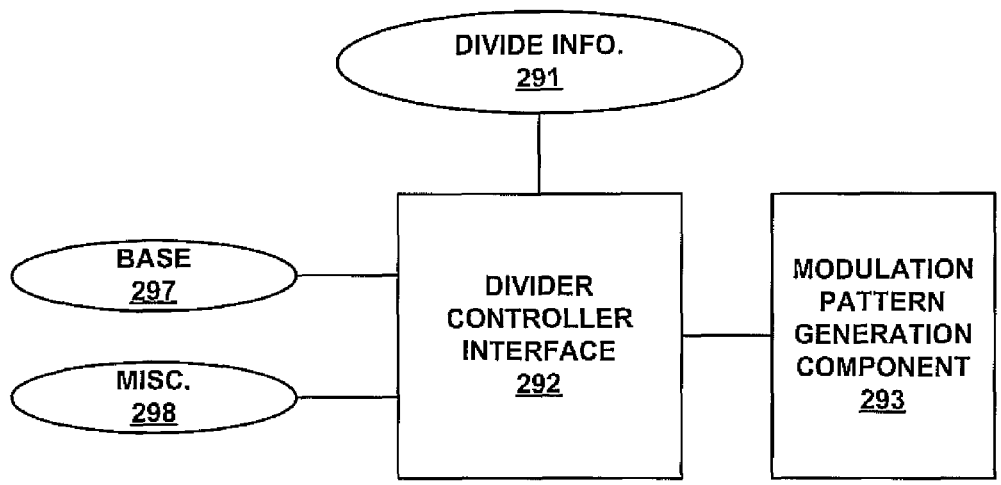
FIG. 2 is a block diagram of an exemplary phase lock loop controller in accordance with one embodiment of the present invention.

Again, it is appreciated that the present invention systems and methods are flexible and can be implemented in a variety of configurations. It is also appreciated an exemplary present invention phase lock loop controller can be compatible with realization of a variety of phase lock loop control schemes. FIG. 2 is a block diagram of exemplary phase lock loop controller 290 in accordance with one embodiment of the present invention. Phase lock loop controller 290 generates a sequence of values and forwards the values to a PLL to modulate a synthesized frequency. In one embodiment, the sequence of values are feedback divider values P which can be accepted by a straight forward integer divider. In another embodiment, the values include a base P and offset P values which can be accepted by an offset divider. In one embodiment, the phase lock loop controller 290 includes a modulation pattern generator 293 and a divider controller 292. The modulator generates the offset P values. The divider controller accepts the offset P values (PO) and base P values (Pbase), then generate total P values (P) and forwards to P divider.

The PLL feedback divider value, or P value, can be fixed or variable during frequency synthesis. When P is fixed, it is called direct synthesis. Since P counter is an integer counter, direct synthesis can multiply the reference frequency by an integer, which is P here. In one embodiment, to multiply the reference frequency by a fractional number, P values are changed in a sequence or pattern so that the average P value is expressed as Pave=N+n/d, where N, n and d are integers. This is called fractional-N synthesis. In one exemplary implementation, the circuit to change P values is called a fractional-N modulator. The straight forward P divider together with the fractional-N modulator is also called a fractional-N divider. In fractional-N synthesis, the VCO output frequency is ideally a horizontal line in time domain.

It is appreciated that embodiments of the present invention are compatible with a variety of frequency synthesis configurations. In one exemplary implementation, spread spectrum synthesis is performed. In spread spectrum synthesis, the VCO output frequency forms a special shape output (e.g., triangle shape, Hershey kiss candy shape, etc.). In one embodiment, a special shape output is utilized so that the power spectrum amplitude of VCO output is reduced. In one exemplary implementation, a special P sequence is utilized. In one embodiment, the circuit to generate the special P sequence is called a spread spectrum modulator.

Phase lock loop controller 290 can be configured to implement control indications compatible with a spread spectrum control scheme and/or a fractional control scheme. In one embodiment, the modulator is capable of generating spread spectrum control pattern. In another embodiment, the modulator is capable of generating fractional-N control pattern. It can be a 0% spread special case of a spread spectrum modulator, or one of the fractional-N modulators described in commonly owned "U.S. patent application Ser. No. 10/947,519 by Shuliang Li, filed on Sep. 22, 2004, entitled "FREQUENCY SYNTHESIZER HAVING A MORE VERSATILE AND EFFICIENT FRACTIONAL-N CONTROL CIRCUIT AND METHOD" and "FREQUENCY MODULATOR, CIRCUIT, AND METHOD THAT USES MULTIPLE VECTOR ACCUMULATION TO ACHIEVE FRACTIONAL-N FREQUENCY SYNTHESIS", application Ser. No. 11/172,691, which are incorporated herein by this reference.

Many of the following descriptions are described relative to time. In one embodiment, a spread spectrum modulator is driven by a clock. In one exemplary implementation, the clock is the PLL feedback divider output. At each active clock edge, the modulator advances one step, going from a current status or value to a new status or value. In one embodiment, the status includes values of registers and buses. In one exemplary implementation, the values correspond to modulation control quantity values. In one exemplary implementation, the status in the modulator is called "current" status before advancing a step. The expected status after the advance is called "future" status. They can also be referred to as status of "current" and "future" steps, time steps or time. In one embodiment, a spread spectrum modulator includes a feedback loop which controls at least one control value. In one embodiment, the primary control value is "modulation error", or simply "error". This "modulation error" value mimics the phase error of a PLL, but can have a different scale and/or reference point. In one exemplary implementation, at least one future error is generated based on current and/or early status at each modulation step. The best or optimized future error replaces the current error when the step advances.

The spread spectrum modulator generates at least one output value that directly or indirectly controls the PLL. As the modulator advances in time step, the output value(s) form a pattern or sequence. It is referred to as spread spectrum control pattern or sequence. In one embodiment, the value is feedback divider offset value PO. In another embodiment, it is feedback divider value P.

It is appreciated that embodiments of the present invention can be implemented on a single silicon chip. It is also appreciated that the present invention can be implemented in hardware, firmware, and/or software.

Spread spectrum clock synthesis can be utilized for a variety of applications. For example, spread spectrum clock synthesis offers an efficient solution to system electromagnetic interference (EMI) reduction. In one embodiment, a Hershey kiss shape frequency profile provides good EMI reduction since it yields flat-topped power spectrum curve in ideal condition. This means power is more evenly distributed in desired frequency band. Hence it reduces the peak value of power spectrum. In another embodiment, a triangle shape frequency profile yields a power spectrum curve with two sides high, meaning more power is distributed on the two sides. This causes its maximum value of the power spectrum to be higher than a flat-topped one yielded by Hershey Kiss shape spread of the same spread amount. Although the EMI reduction for a triangle spread may be less than Hershey Kiss spread, the triangle spread has advantages. A triangle spread is easy to implement and its frequency slew rate (absolute value) is constant. For the same spread percentage of a frequency, the triangle shape has significant smaller maximum frequency slew rate. The triangle shape allows the down stream system to track the frequency curve better and has more timing budget. In one embodiment, a Hershey kiss profile has variable slew rate and reaches maximum absolute value at its peaks, which is hard for some down stream system to handle. A triangle spread spectrum frequency curve is a linear curve. A Hershey Kiss curve is non-linear curve. For frequency curves like triangle or Hershey Kiss shape, they are also called standard curve in this patent.

For both triangle and Hershey Kiss shape frequency spread, the PLL feedback divider is modulated with a finite length pattern periodically. In conventional techniques, a look-up table that is implemented in memory on chip is used to store feedback divider patterns. Programmable memory is preferred for storing the look-up table for changing spread configuration conveniently. However, this kind of memory is large in area and usually not like circuits that are easily shrinkable with technology improvement. The memory circuit size do not usually shrink much in new process, because the storage elements of programmable memory are special. Thus, when normal circuits shrink, the area percentage of programmable memory on a clock chip increases. When traditional systems attempt to use multiple spread configurations, the programmable memory used to store the look-up tables become increasingly expensive to implement both in terms of economic cost and in physical space.

Meanwhile, the P value associated with the best vector is forwarded to the P counter controller. As the clock drives this modulation feedback loop 3000 to run cycle by cycle, a sequence of P values (PLL control pattern) is generated. The phase lock loop (PLL) P counter (e.g., divider 224) loads these P values one by one each time a full counting is finished. Thus, the desired VCO frequency curve is generated by modulating the P counter or divider. It is appreciated there are a variety of ways to implement modulation feedback loop architecture 3000.

Figure 3A:
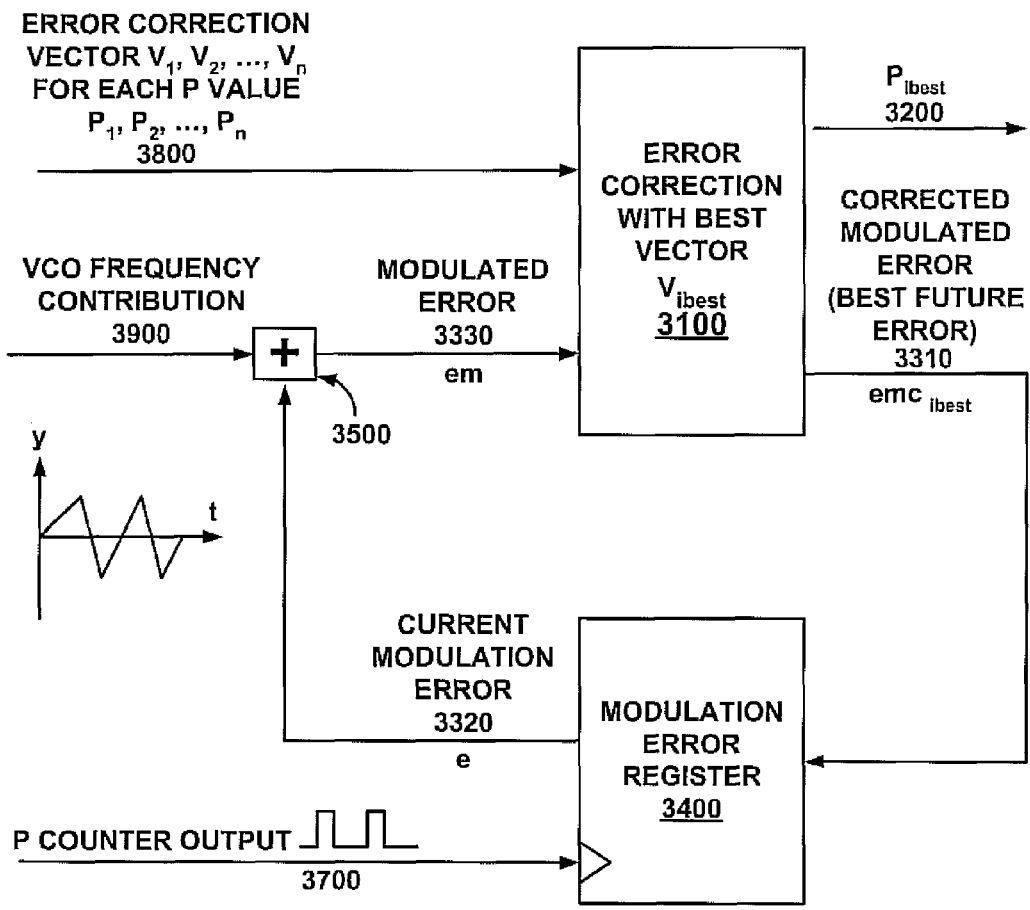
FIG. 3A is a block diagram of an exemplary frequency spreading control pattern generation system in accordance with one embodiment of the present invention.
Figure 3B:
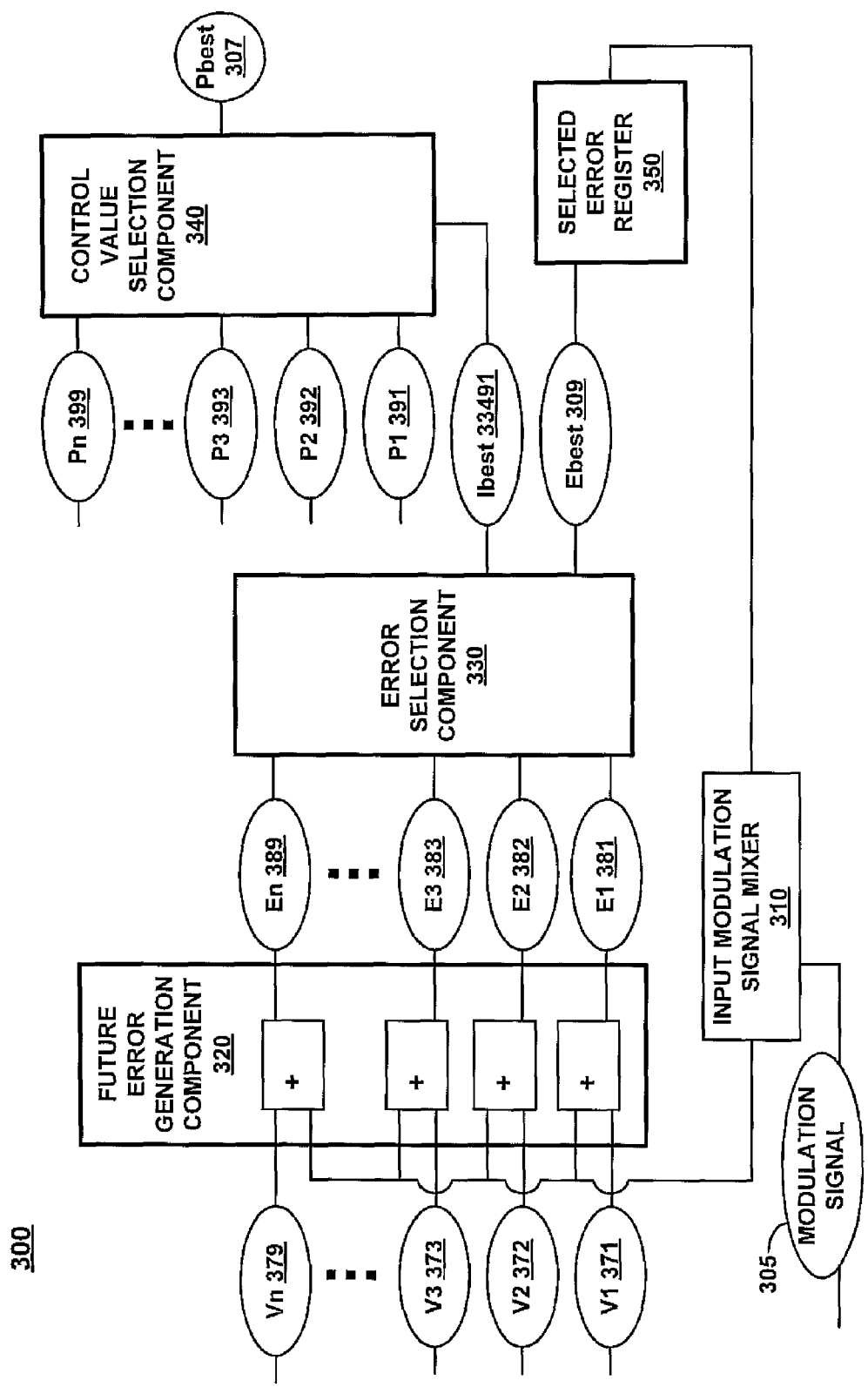
FIG. 3B is a diagram of three error vectors extending from an average P value derived from a P pattern sequence and used in determining the fractional-N value, in accordance with one embodiment of the present invention.

FIG. 3B is a block diagram of exemplary frequency control pattern generation system 300 in accordance with one embodiment of the present invention. In one embodiment, frequency control pattern generation system 300 can be utilized similar to frequency control pattern generation component 231 and/or modulation control pattern generation component 21. In one embodiment, frequency control pattern generation system 300 includes a modulation loop for introducing modulation influence on a modulation error. In one exemplary implementation, a modulation signal is input to a modulation loop. The modulation loop can also include error correction vector accumulation. In one embodiment, each potential feedback loop divide value P is associated with an error correction vector and produces associated future error.

Frequency spreading control pattern generation system 300 includes input modulation signal mixer 310, future error generation component 320, error selection component 330, pattern value selection component 340 and selected error register 350. Input modulation signal mixer 310 is communicatively coupled to future error generation component 320 which in turn is communicatively coupled to error selection component 330. Error selection component 330 is communicatively coupled to pattern value selection component 340 and selected error register 350.

The components of frequency spreading control pattern generation system 300 co-operatively operate to provide feedback loop divider information. Input modulation signal mixer 310 produces a modulated error signal. Future error generation component 320 produces a plurality of error signals based upon the modulated error signal and error adjustment vectors. Error selection component 330 selects one of the plurality of error signals. Pattern value selection component 340 selects a pattern value based upon the error selected by error selection component 330. Selected error register 350 stores the selected one of the plurality of error signals.

In one embodiment, input modulation signal mixer 310 mixes an input modulation signal or value with the "currently" selected error signal or value. In one exemplary implementation, the input modulation signal is non linear. For example, the input modulation signal can have curves and peaks (e.g., a curve similar to a Hershey kiss candy). In another exemplary implementation, the modulation signal is linear (e.g., triangular). It is appreciated that the input modulation signal can have a variety of different configurations, including standard and/or non-standard schemes (e.g., patterns, curves, etc.).

Future error generation component 320 generates potential future errors. In one embodiment, future error generation component 320 receives a plurality of error correction vectors. Error combination component 320 combines the modulated error signal with the error correction vectors. In one embodiment, the vectors are organized in a monotonic order and the output of potential future errors are organized in a corresponding monotonic order. In one exemplary implementation, each vector and potential future error are assigned corresponding indexes based upon relative position in the monotonic order.

Error selection component 330 selects an error and forwards the selected error to selected error register 350. In one embodiment, error selection component 330 includes a delta-sigma selection component. It is appreciated that the present invention is readily implemented with a variety of error selection schemes or techniques. In one exemplary implementation, a "best" error is selected. Further explanation of error selection in accordance with one embodiment of the present invention is described in other sections below. Error selection component 330 also forwards identification of the selected error signal to pattern value selection component 340.

In one embodiment, pattern value selection component 340 receives a plurality of predetermined pattern values and selects one of the predetermined pattern values based upon the information received from error selection component 330. In one embodiment, the selected pattern value contributes to the control value forwarded to feedback loop divider (e.g., feedback loop divider 224). The pattern values can be random or non-random. In one exemplary implementation, the pattern values received by pattern value selection component 340 are organized in a monotonic order corresponding to monotonic order of the plurality of error correction vectors and potential future errors. Pattern value selection component 340 utilizes an index indication of the selected error value from error selection component 330 to select the pattern value. In one embodiment of the present invention, the pattern value selection component 340 includes a multiplexer. In one exemplary implementation, the selected error identification and/or index value forwarded from error selection component 330 is utilized as the selection inputs to the multiplexer.

Figure 3C:
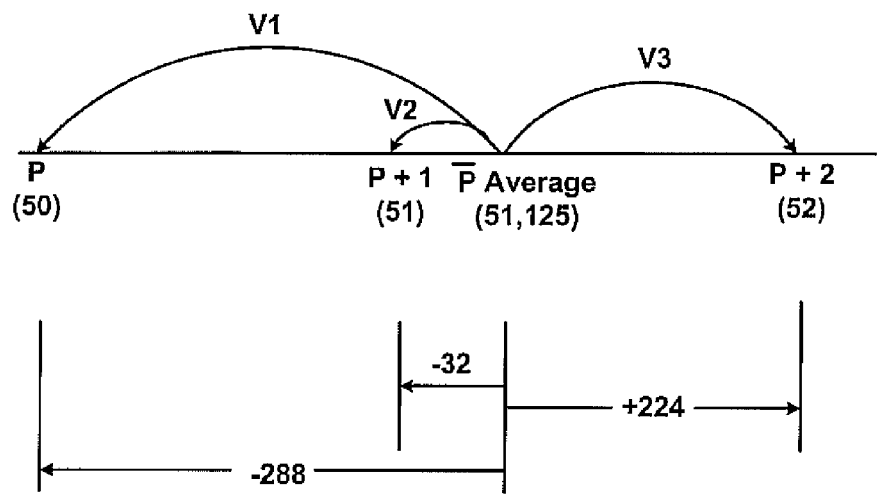
FIG. 3C a diagram showing an exemplary graphical representation of three error correction vectors in accordance with one embodiment of the present invention.

Turning now to FIG. 3C, an example is shown in which three error correction vectors are shown. That is, as shown in FIG. 3A, there are n vectors that are provided as inputs into the error combination component 320. In example of FIG. 3B, n=3, in which here error vectors $V_1$, $V_2$, and $V_3$ are chosen as an example of how the iterative selection process takes place. Specifically, two negative error vectors at P and P+1 are shown as $V_1$ and $V_2$. One positive vector P+2 is shown as $V_3$.

In the example of FIG. 3B, a resolution of 256 is chosen between P values (e.g., between P and P+1, and between P+1 and P+2). Each vector, V, is shown extending from the average P value $P_{AVERAGE}$ to the integer P values of P, P=1, and P+2. The amount of error vector $V_1$ in a negative direction is cumulative of $P_{AVERAGE}$ to P+1, and P+1 to P. The amount between $P_{AVERAGE}$ and P+1 is −32, in FIG. 6. The amount between P+1 and P is −256, making the cumulative amount of error vector $V_1$ equal to −288. The amount of error vector $V_2$ is shown as −32, and the amount of $V_3$ is 256-32, or +224. It is understood that there can be more than three error vectors and the numbers provided for each vector values are merely examples.

It is appreciated that modulation patterns are scalable. Different modulation frequencies and spread amounts can be generated by scaling one modulation curve. In one exemplary implementation, a single standard modulation curve values can be stored in a relatively small memory and multiple curves are generated (e.g., by circuits or logic). By scaling cycles in the X direction (e.g., a direction corresponding to time) the modulation frequency can be changed. By scaling in the Y direction (e.g. a direction corresponding to amplitude) the spread amount can be altered. In one embodiment, the amplitude and length of a modulation signal cycle can be altered. In one exemplary implementation, the modulation signal pattern amplitude is determined based upon the resolution, spread percentage and the average divide value. For example, the amplitude equals the resolution times spread % times average divide value. In another embodiment, resolution is scalable, and the frequency spread percentage is reverse proportional to resolution.

It is also appreciated that auxiliary circuit can be used to simplify or reduce input interface. For example, if the resolution and one vector $V_1$ are known, other vectors can be determined by math. That is, $V_2=V_1$+resolution, and $V_3=V_1$+ 2*resolution=$V_2$+resolution. So an auxiliary logic can be used to accept resolution and a vector to produce all vectors. In one embodiment, when changing the average P, only the vectors need to be changed and the resolution and one vector are enough to ascertain other vectors. In one embodiment, a modulation curve is scalable and vectors can be derived, thus only scaling factors (e.g., defining modulation frequency and spread amount), resolution and one vector (defining average P value and selectable P values) are needed to configure the modulation loop.

Figure 4:
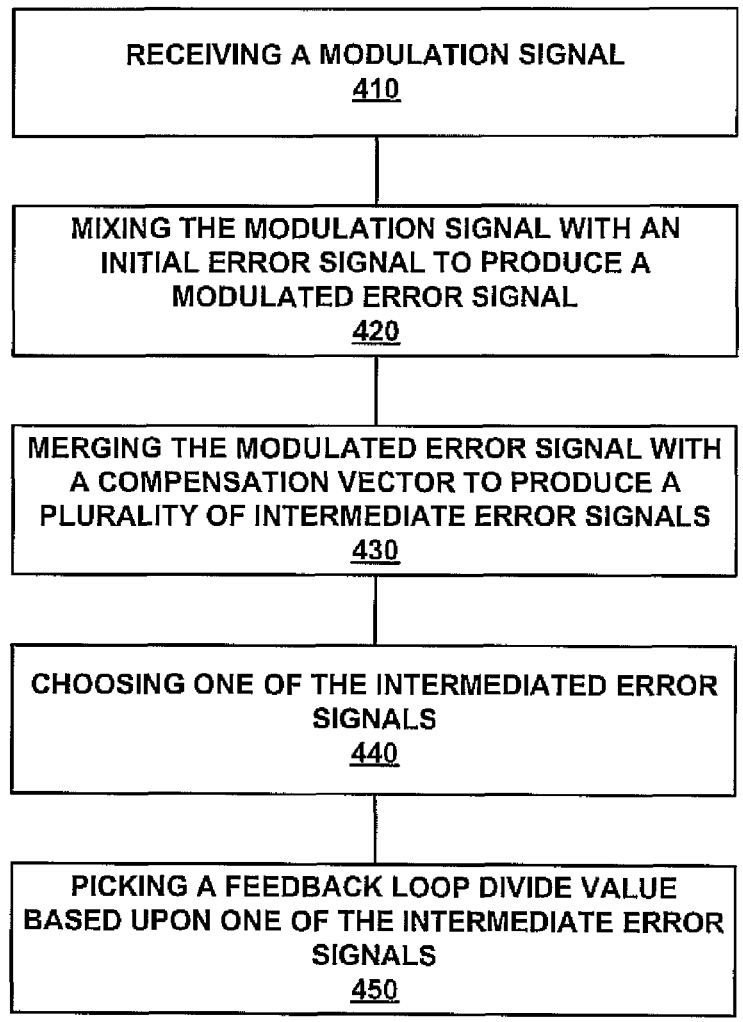
FIG. 4 is a flow chart of an exemplary frequency spreading control patter generation method, in accordance with one embodiment of the present invention.

FIG. 4 is a flow chart of exemplary frequency control pattern generation method 400 in accordance with one embodiment of the present invention. Frequency spreading control pattern generation method 400 controls modulation "error" in a modulation feedback loop and generates indication of PLL frequency adjustment. In one embodiment, the frequency adjustment indications are directed to facilitating realization of a spread spectrum output.

At block 410, a modulation signal is received. It is appreciated that the modulation signal can have a variety of configurations. The modulation signal can be linear or non-linear. The modulation signal can also have a standard or non-standard configuration. It is also appreciated that the modulation can be directed towards a number of objectives, including EMI reduction, signal encryption, radio communication, etcetera.

In block 420, the modulation signal is mixed with a present or current error signal to produce an modulated error signal. In one embodiment, the initial error signal is a present error signal or value and the modulation signal modulates or alters the present error signal. In one exemplary implementation, mixing the initial error signal with the modulation signal results in the base of the error signal "following" or tracking a modulation pattern. It is appreciated the modulation signal can be scaled in accordance with embodiments of the present invention.

The modulated error signal is merged with a plurality of error correction vectors to produce a plurality of potential "future" error signals at block 430. In one embodiment, the vector is based upon an average divide value and an offset from the average divide value with certain resolution.

At block 440, one of the potential "future" error signals is chosen. In one exemplary implementation, the chosen future error signal corresponds to a minimal error. In one embodiment, the minimal error is the error that is closest to a target error or a zero-cross point in a monotonic order.

At block 450, a feedback loop divide value is picked based upon the chosen "intermediate" error signal. In one embodiment, the chosen "future" error signal becomes a current error and is utilized in subsequent iterations of block 410 error signal and modulation signal mixing.

In one embodiment, a "best" error is one that keeps the final output signal close or tight to the modulation pattern around a target frequency. In some exemplary implementations, the selection of "best" error is directed towards an error value that provides a tight correlation with the modulation pattern. In one embodiment, a frequency synthesizer (e.g., frequency synthesizer 10) includes a zero cross error selection spectrum spreading control pattern generation component for generating a spread spectrum control pattern utilized by the phase lock loop controller to control the phase lock loop component. In one embodiment of the present invention the resources (e.g., circuits) utilized to implement best error selection are relatively small and fast. It is appreciated that present invention "best" error selection techniques can be utilized with a variety of different modulation schemes, including fractional-N and spread spectrum modulation schemes.

Zero Crossing Best Error Selection

Figure 5A:
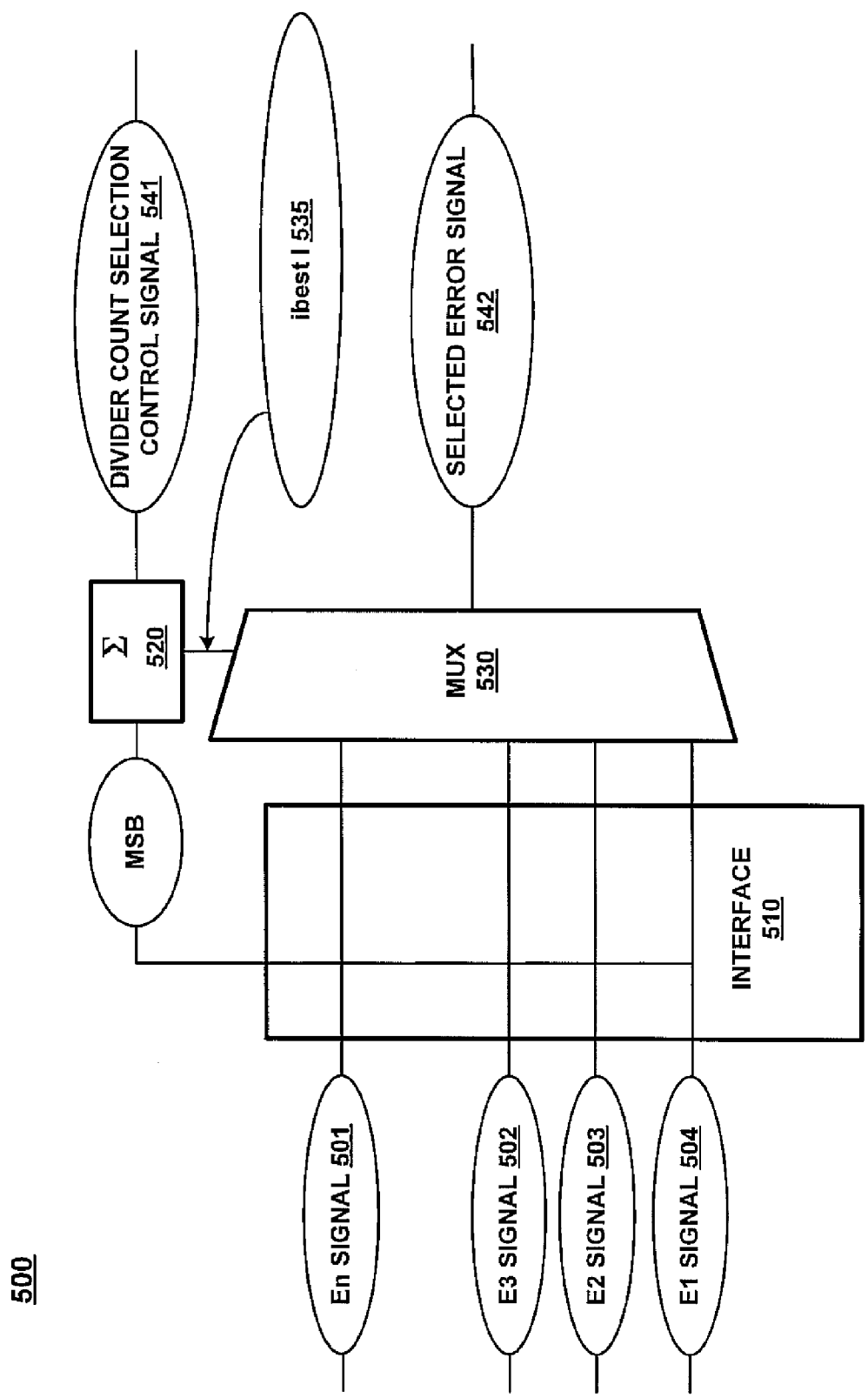
FIG. 5A is a block diagram of an exemplary cross zero best error selection system in accordance with one embodiment of the present invention.

FIG. 5A is a block diagram of exemplary cross zero best error selection system 500 in accordance with one embodiment of the present invention. In one embodiment, cross zero best error selection system 500 is utilized in error selection component 330 of system 300 shown in FIG. 3A. Cross zero best error selection system 500 includes error input interface 510, most significant bit (e.g., sign bit) summation component 520 and feed back multiplexer 530. Error input interface 510 is communicatively coupled to most significant bit summation component 520 which is communicatively coupled to feed back multiplexer 530.

The components of cross zero best error selection system 500 cooperatively operate to select a best error. Error input interface 510 receives a plurality of future error values. The target error value is zero or is manipulated to be so. The errors are arranged in a monotonic order for the multiplexer selection index. Most significant bit summation component 520 sums most significant bits of the future error values. In one embodiment, the most significant bit summation component is an adder that adds the sign bit. In one embodiment the sign bit is the most significant bit. In one exemplary implementation, the error is expressed in two's complimentary binary number and a negative number is indicated by a most significant bit with a logical one value. The position or index where the error crosses zero is indicated where the most significant bit changes from a logical one to a logical zero which corresponds to a sign change in the error. In one embodiment, the summation of the most significant bits corresponds to an identification of the selected error value. In one exemplary implementation, the summation of the most significant bits is an index value associated with the selected error value. Feedback multiplexer 530 feeds back a selected error value based upon the summation of the most significant bits.

Figure 5B:
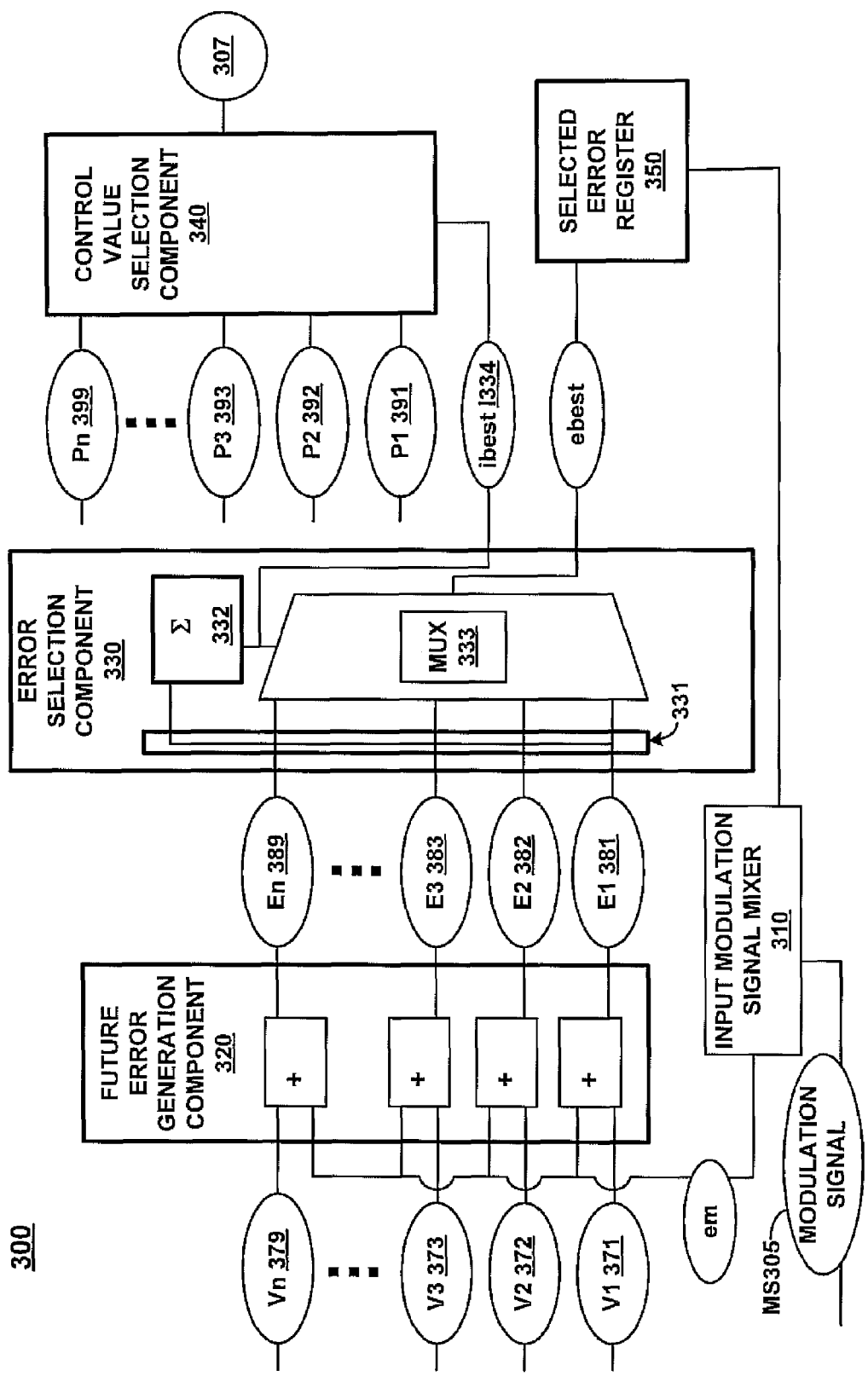
FIG. 5B is a block diagram of an exemplary implementation of frequency spreading control pattern generation system utilizing a cross zero best error selection system in accordance with one embodiment of the present invention.

It is appreciated that present invention cross zero selection systems can be incorporated in a variety of modulation control pattern generation systems. FIG. 5B is a block diagram of an exemplary implementation of frequency spreading control pattern generation system 300 utilizing a cross zero best error selection system. In the present example, error selection component 330 is implemented with error input interface 331, most significant bit summation component 332 and feed back multiplexer 333 which are similar to error input interface 510, most significant bit summation component 520 and feed back multiplexer 530 of FIG. 5A. The sum of the most significant bits from most significant bit summation component 332 is forwarded to control value selection component 340 and to MUX 333 which forwards the selected error to selected error register 350.

Figure 6:
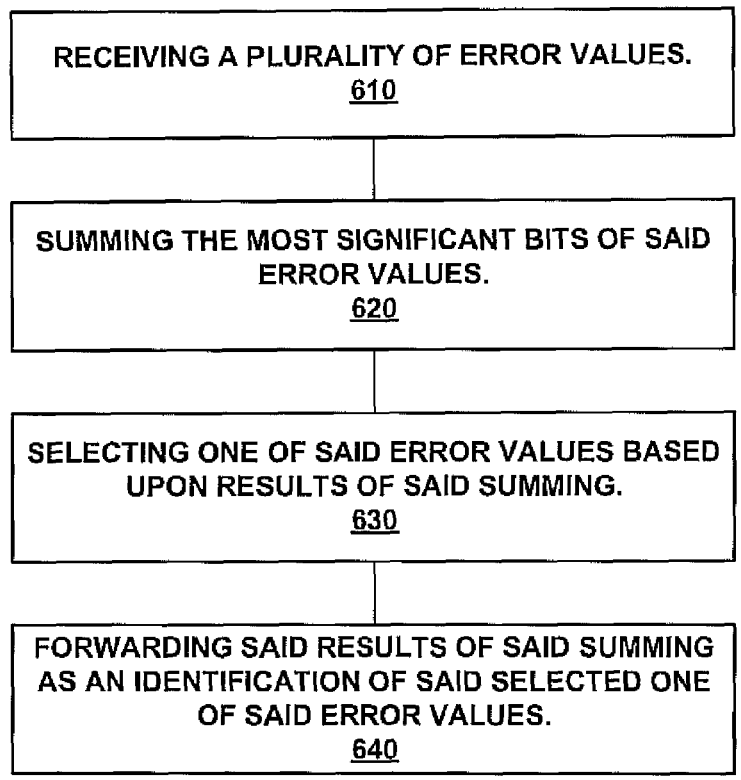
FIG. 6 is a flow chart of an exemplary cross zero best error selection method in accordance with one embodiment of the present invention.

Cross zero best error selection methods of the present invention can be utilized to select a "best" error indication. In one embodiment, an error corresponding to the point or close to the point where the "error" crosses zero is selected as the "best" error. In one embodiment, a present invention a cross zero best error selection method is implemented in software. In one exemplary implementation of multiple vector modulation, best error selection in accordance with the present invention achieves results similar to sophisticated logic, such as:

$i_{best}=i$ such that $(e_{i-1}<0$ and $e_i>=0)$ with relatively simple logic. A present invention cross zero selection can be implemented in hardware, firmware and/or software. FIG. 6 is a flow chart of exemplary cross zero best error selection method 600 in accordance with one embodiment of the present invention.

In one embodiment similar to FIG. 5A, n errors are received. The range of the most significant bit summation is 0 to n. There are n+1 numbers for the sum. The multiplexer is designed to be able to handle this potential n+1 selections. If errors $e_0, e_1, \ldots, e_n$ are sorted in ascending order, there are several methods to handle index selection. In one exemplary implementation the selected index comes from the most significant bit summation. In one embodiment, the summation n+1 is altered to n by logic. In another embodiment, the multiplexer uses index 0 to n to select inputs normally and uses n+1 to select the same input as index n. In another embodiment, the most significant bit summation of the errors excludes the largest error $e_n$ so that the index range is from 0 to n−1.

At block 610, a plurality of error values are received. In one embodiment the error values are "future" errors. In one embodiment, future contribution vectors are sorted in monotonic order and the future "errors" generated by them are also in a corresponding monotonic order and at some index the "error" crosses zero. For example, the plurality of received error can be a combination of a "current" error modulated with a modulation signal and adjusted by correction vectors. In one exemplary implementation, the plurality of error values are received from a future error generation component.

The most significant bits of the error values are summed at block 620. In one exemplary implementation, the result of summing the most significant bits is equal to an index of a cross zero point.

In block 630, one of the error values is selected based upon results of the summing. In one embodiment, the selected error is the error closest to the cross zero point. The selecting can include multiplexing the errors in accordance with the results of most significant bit summing of the error values.

In block 640, the results of the summing are forwarded as an identification of the selected one of the error values. In one embodiment, the identification of the selected error value is an index corresponding to the "position" of the selected value in a monotonic order. In one embodiment the result of the selecting is forwarded as an error feedback value.

In one embodiment of the zero-crossing best error selection method the errors are sorted in the monotonic order wherein the cross zero point is an index corresponding to a point in the monotonic order of errors.

Enhanced Noise Shaping in a Spread Spectrum Modulator

Figure 7:
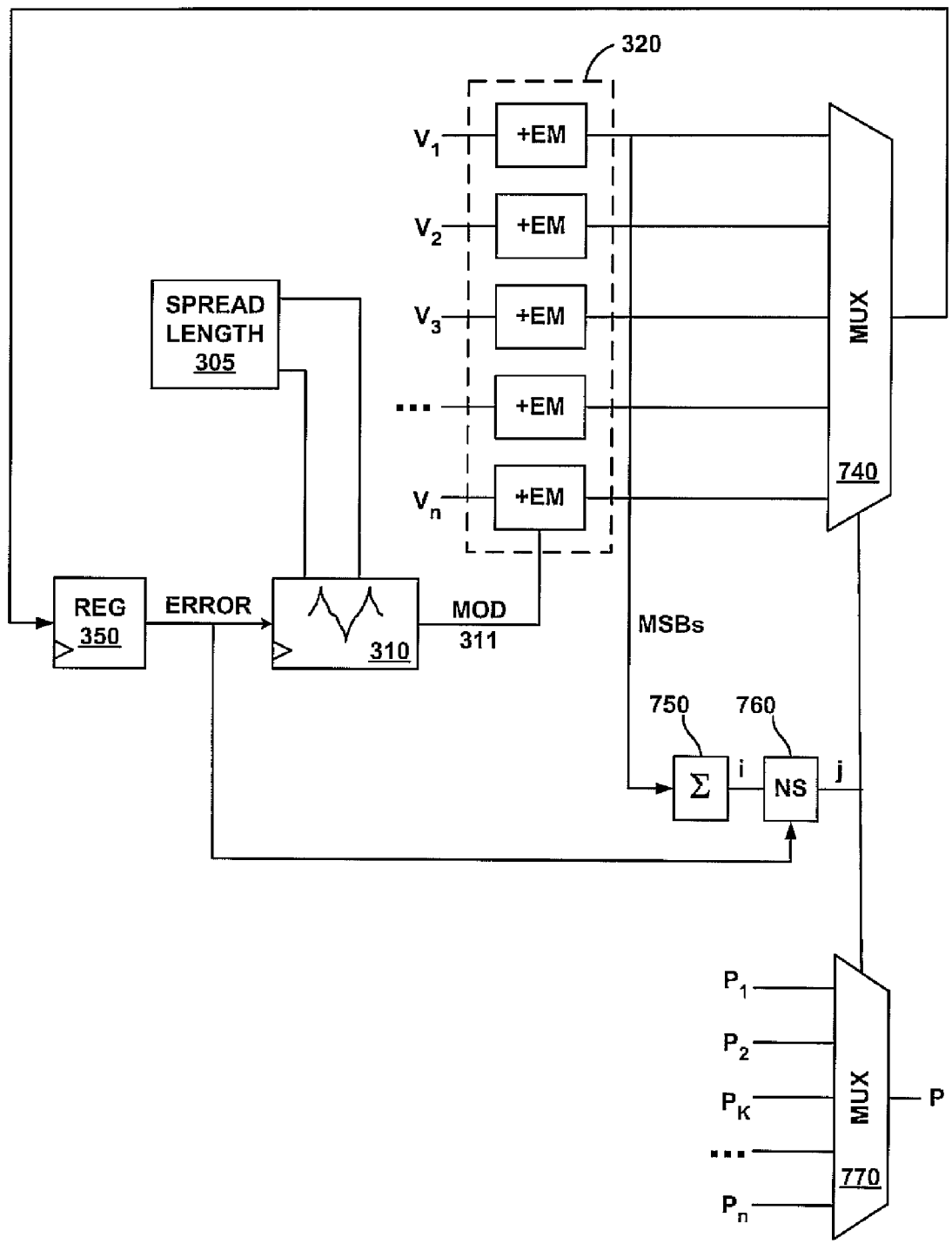
FIG. 7 is a block diagram of a spread spectrum modulator that is capable of enhanced noise shaping, in accordance with one embodiment of the present invention.

FIG. 7 is a block diagram of a spread spectrum modulator 700 that is capable of enhanced noise shaping, in accordance with one embodiment of the present invention. The modulator 700 is an extension of the frequency spreading control pattern generation system 300 of FIG. 3B, in one embodiment. As such, it is intended that similarly numbered blocks in FIGS. 3B and 7 perform similar functions. In other embodiments, the spread spectrum modulator 700 provides fractional-N synthesis with enhanced noise shaping features.

The modulator 700 includes a vector selector engine that iteratively selects amongst a plurality of vectors $V_1$ through $V_n$, dependent on which vector when summed with a modulated error produces the best error closest value nearest a target desired value.

The spread spectrum frequency modulator 700 includes an input modulation signal mixer 310, error combination component 320, selected error register 350, accumulator 750, multiplexer 740, multiplexer 770, and a noise shaping module 760 that are all communicatively coupled.

The components of the spread spectrum modulator 700 co-operatively operate to provide feedback loop divider information to a divider of a PLL of a frequency synthesizer, in one embodiment. In the present embodiment, the PLL comprises a divider. With spread spectrum modulator 700, the PLL is capable of synthesizing fractional-N or spread frequency in embodiments of the present invention.

In particular, the input modulation signal mixer 310 produces a modulated error signal from the current best error stored in register 350, and an input modulation signal 305 that acts as a target signal. The input modulation signal 305 is non-linear, in one embodiment. For example, the input modulation signal can have curves and peaks in which the spread spectrum of the synthesized signal has reduced amplitude and increased bandwidth. In another exemplary implementation, the input modulation signal 305 is linear (e.g., triangular).

The error combination component 320 produces a plurality of future and/or compensated error signals based upon the modulated error signal 311 from the input modulation signal mixer 310, as previously described in FIG. 3B.

In addition, in one embodiment, as shown in FIG. 7 the modulator 700 includes an accumulator 750 for selecting the index $i_{best}$. The index $i_{best}$ is associated with the best error, future $e_{best}$, of the next modulation step. That is, the index, $i_{best}$, provides an identification of the future best error, future $e_{best}$, of the next modulation cycle.

In one embodiment, the accumulator 750 implements a cross zero method for selecting the index, $i_{best}$, as previously described in relation to FIGS. 5A and 5B, in accordance with one embodiment of the present invention. The accumulator 750 sums the most significant bits of the errors as outputted by the error combination component 320. As the value of the accumulator 750 crosses zero, the index, $i_{best}$, that corresponds to the best error, future $e_{best}$, of the next modulation cycle can be determined. In other embodiments, the index, $i_{best}$, is selected using other types of selectors, such as the error selection component 330 of FIG. 3.

Additionally, the spread spectrum modulator 700 includes a noise shaping modulator circuit 760 that is coupled to the PLL of a frequency synthesizer for increasing a rate of sign change of a plurality of errors used to select a divider count value. The divider count value is based upon an accumulated error of the plurality of errors, as will be described more fully below.

In particular, the noise shaping modulator 760 takes as inputs the index, $i_{best}$, from the accumulator 750 and the best error of the current modulation cycle, current $e_{best}$. More specifically, when clocked, the current best error, current $e_{best}$, is obtained from the multiplexer 740 and stored in the register 350. Thereafter, the current best error, current $e_{best}$, is accessed from the register 350 by the noise shaping modulator 760.

In addition, during the same clock cycle, the current best error, current $e_{best}$, is modulated by the input modulation signal at the mixer 310 to produce the modulated error signal 311. Also, the error combination component 320 produces a plurality of error signals, which is delivered to the accumulator 750 to determine index, $i_{best}$, as previously described. The index, $i_{best}$, is then delivered to the noise shaping modulator 760 in the same clock cycle.

Thereafter, the noise shaping modulator 760 modulates the index, $i_{best}$, based on the accumulated error of the plurality of errors, as will be described below in relation to FIGS. 8A and 8B. In particular, the noise adjusted $i_{best}$ is denoted by noise adjusted index, j.

The noise adjusted index, j, is used for selecting feedback loop divider count values used for dividing a frequency of the output signal from the frequency synthesizer. In particular, the phase count selection component 770 selects a feedback loop divider count value, P, based upon the noise adjusted index, j. This feedback loop divider count value, P, is then fed to a divider (e.g., divider 224 of FIG. 1B) of a PLL in the frequency synthesizer.

The spread spectrum modulator 700 also includes a multiplexer 740 that selects the noise adjusted best error, noise adjusted $e_{best}$, also known as the future error, of the next modulation cycle according to the noise adjusted index, j. This best error, noise adjusted $e_{best}$, of the next modulation cycle is held until the next clock cycle. With the next clock cycle (e.g., leading or falling edge), the best error of the next modulation cycle, noise adjusted $e_{best}$, is stored in the register 350 to become the current error, current $e_{best}$, of the next modulation cycle.

Figure 8A:
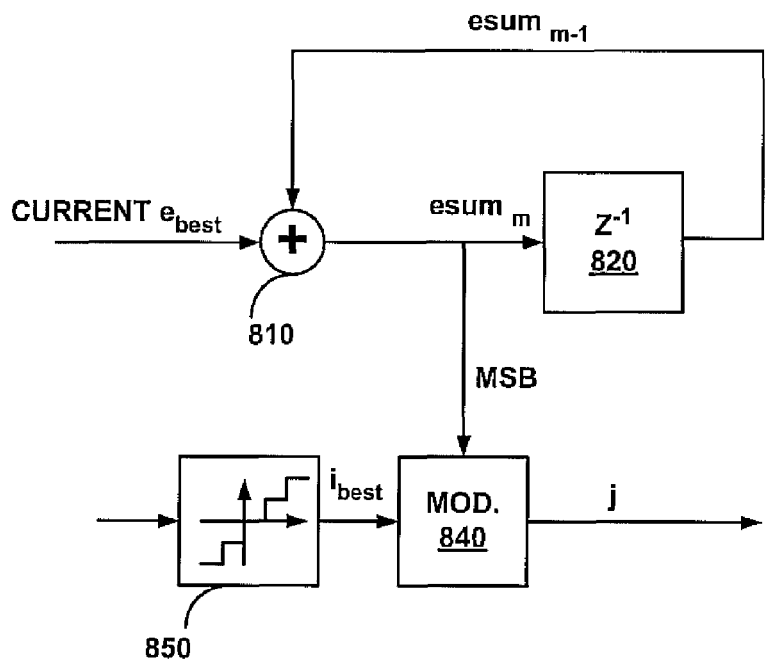
FIG. 8A is a block diagram of the noise shaping modulator of FIG. 8, in accordance with one embodiment of the present invention.

FIG. 8A is a block diagram of the noise shaping modulator 760 of FIG. 7, in accordance with one embodiment of the present invention. The noise shaping modulator 760 is capable of shaping the noise of the signal output of an associated frequency synthesizer by shifting the noise to a higher frequency and providing an increased rate of sign change of the noise around a target signal, in embodiments of the present invention. As such, the spread spectrum modulator 700 of FIG. 7 has better frequency profile and improved EMI performance.

As described previously, the noise shaping modulator 760 takes as inputs, the index, $i_{best}$, from the accumulator 750, and the current best error, current $e_{best}$ from the register 350. The noise shaping modulator 760 is able to increase the rate of sign change of the plurality of errors.

The noise shaping modulator 760 includes an accumulator 810 for summing a plurality of errors from the modulator circuit 700 of FIG. 7. As such, the accumulator 810 generates an error sum value ($esum_m$). In particular, the accumulator 810 sums the current error, current $e_{best}$, and a previously summed error, $esum_{m-1}$, from the previous modulation step.

As described previously, the current error, current $e_{best}$, is selected from one of a plurality of error values compensated by positive and negative vector values from an average value, $P_{AVERAGE}$, equal to a fraction by which a divider in a phased lock loop divides a frequency of an output signal of a frequency synthesizer, in one embodiment.

In addition, a delay module 820 is shown in the noise shaping modulator 760. The delay module 820 stores the previously summed error, $esum_{m-1}$, from the previous modulation step. In addition, the delay module 820 provides the previously summed error, $esum_{m-1}$, to the accumulator 810 in the next modulation step.

As shown in FIG. 8A, the noise shaping modulator 760 also includes an error signal modulator 840 that is coupled to the accumulator 810. The error signal modulator 840 modulates the index, $i_{best}$, based on the error sum value to determine the noise adjusted index, j. The noise adjusted index, j, is used for selecting feedback loop divider count values used for dividing a frequency of the output signal from a frequency synthesizer, as previously described.

In particular, the error signal modulator 840 modulates the index, $i_{best}$, based on the most significant bit (MSB) output of the error sum value, $esum_m$. Specifically, the MSB indicates the sign of the summed error, $esum_m$, from the accumulator 810.

In one embodiment, the error signal modulator 840 increases the index, $i_{best}$, by one when the MSB indicates the sign of the summed error, $esum_m$, is negative (e.g., MSB=1). As such, the noise adjusted index, j, is determined as follows: $j=i_{best}+1$. The noise adjusted index, j, is used to select the P value as the feedback loop divider count value in the PLL of the frequency synthesizer.

In another embodiment, the error signal modulator 840 decreases the index, $i_{best}$, by one when the MSB indicates the sign of the summed error, $esum_m$, is positive (e.g., MSB=0). As such, the noise adjusted index, j, is determined as follows: $j=i_{best}-1$. The noise adjusted index, j, is used to select the P value as the feedback loop divider count value in the PLL of the frequency synthesizer.

Figure 8B:
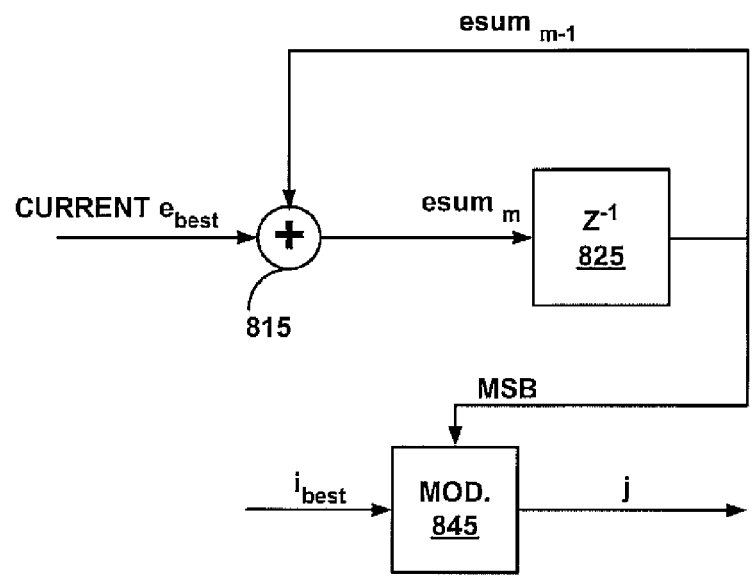
FIG. 8B is a block diagram of the noise shaping modulator of FIG. 8, in accordance with one embodiment of the present invention.

FIG. 8B is a block diagram of the noise shaping modulator 760 of FIG. 7, in accordance with one embodiment of the present invention. The noise shaping modulator 760 is capable of shaping the noise of the signal output of an associated frequency synthesizer by shifting the noise to a higher frequency and providing an increased rate of sign change of the noise around a target signal, in embodiments of the present invention. As such, the spread spectrum modulator 700 of FIG. 7 has better frequency profile and improved EMI performance.

As described previously, the noise shaping modulator 760 takes as inputs, the index, $i_{best}$, from the accumulator 750, and the current best error, current $e_{best}$ from the register 350. The noise shaping modulator 760 is able to increase the rate of sign change of the plurality of errors.

The noise shaping modulator 760 includes an accumulator 815 for summing a plurality of errors in the modulator circuit 700 of FIG. 7. As such, the accumulator 815 generates an error sum value (esum$_m$). In particular, the accumulator 815 sums the current error, current $e_{best}$, and a previously summed error, esum$_{m-1}$, from the previous modulation step.

As described previously, the current error, current $e_{best}$, is selected from one of a plurality of error values compensated by positive and negative vector values from an average value, $P_{AVERAGE}$, equal to a fraction by which a divider in a phased lock loop divides a frequency of an output signal of a frequency synthesizer, in one embodiment.

In addition, a delay module 825 is shown in the noise shaping modulator 760. The delay module 825 stores the previously summed error, esum$_{m-1}$, from the previous modulation step. In addition, the delay module 825 provides the previously summed error, esum$_{m-1}$, to the accumulator 815.

As shown in FIG. 8B, the noise shaping modulator 760 also includes an error signal modulator 845 that is coupled to the delay module 825. The error signal modulator 845 modulates the index, $i_{best}$, based on the error sum value to determine the noise adjusted index, j. The noise adjusted index, j, is used for selecting feedback loop divider count values used for dividing a frequency of the output signal from a frequency synthesizer, as previously described.

In particular, the error signal modulator 845 modulates the index based on the most significant bit (MSB) output of the previously summed error value, esum$_{m-1}$. Specifically, the MSB indicates the sign of the previously summed error value, esum$_{-1}$, as obtained from the delay module 825.

In one embodiment, the error signal modulator 845 increases the index, $i_{best}$, by one when the MSB indicates the sign of the previously summed error value, esum$_{m-1}$, is negative (e.g., MSB=1). As such, the noise adjusted index, j, is determined as follows: j=$i_{best}$+1. The noise adjusted index, j, is used to select the P value as the feedback loop divider count value in the PLL of the frequency synthesizer.

In another embodiment, the error signal modulator 845 decreases the index, $i_{best}$, by one when the MSB indicates the sign of the previously summed error value, esum$_{m-1}$, is positive (e.g., MSB=0). As such, the noise adjusted index, j, is determined as follows: j=$i_{best}$−1. Again, the noise adjusted index, j, is used to select the P value as the feedback loop divider count value in the PLL of the frequency synthesizer.

Although the embodiments of FIGS. 8A and 8B are described with the index increasing and decreasing by one according to the sign of the MSB, other embodiments are capable of supporting increasing and decreasing the index by one according to the opposing sign of the MSB. That is, when the MSB=0, the index, $i_{best}$, is increased by one, and when the MSB=1, the index, $i_{best}$, is decreased by one. Also, other embodiments are capable of increasing or decreasing the index by a value other than one. Still other embodiments are capable of increasing or decreasing the index by a variable number. That is, the index may be increased by a first value, and decreased by a second value.

In still another embodiment, the range of the index is limited. That is, the range of the index is limited to a maximum value. As such, the modulated index cannot exceed the maximum value of the index on the upper range. For example, if $i_{best}$=$i_n$, then the noise adjusted index, j, is also equal to in.

Also, the range of the index is limited to a minimum value. As such, the modulated index cannot exceed the minimum value of the index on the lower range. As such, the modulated index cannot go lower than the minimum value of the index on the lower range. For example, if $i_{best}$=$i_1$, then the noise adjusted index, j, is also equal to $i_1$.

Still other embodiments are able to implement other techniques for limiting the range of the index and modulated index.

Figure 9:
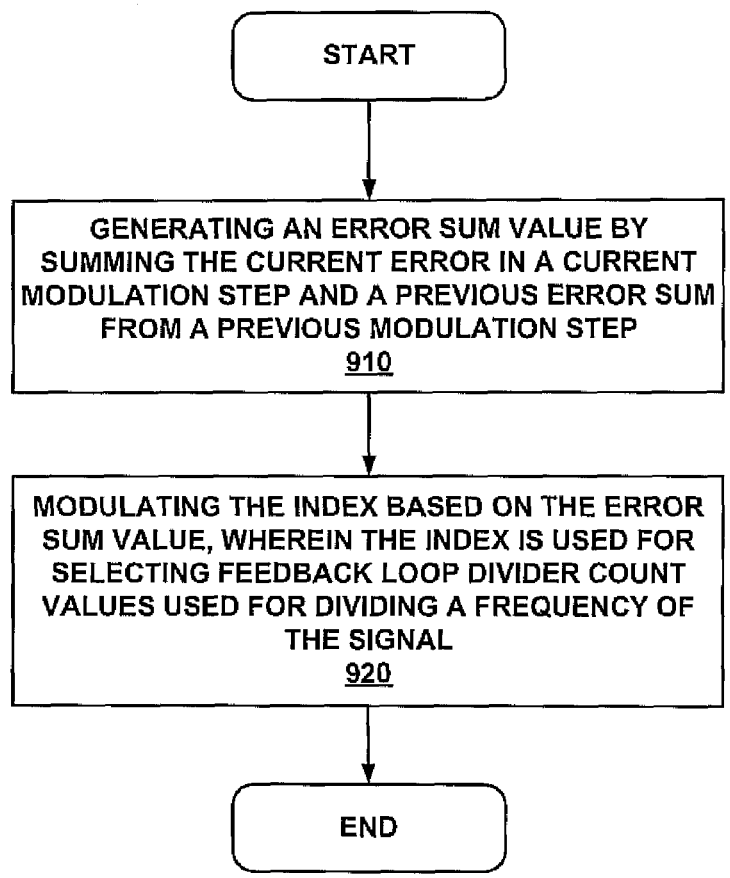
FIG. 9 is a flow chart in a method for producing a signal of selectable frequency with enhanced noise shaping, in accordance with one embodiment of the present invention.

FIG. 9 is a flow chart of exemplary frequency spreading control pattern generation method 900 in accordance with one embodiment of the present invention. In particular, the method of FIG. 9 produces a signal of selectable frequency with enhanced noise shaping, in accordance with one embodiment of the present invention. The method of FIG. 9 can be implemented within a spread spectrum modulator of a frequency synthesizer. For instance, the method of FIG. 9 can be combined with the method of FIGS. 4 and 6 to generate a frequency spreading control pattern for use in a PLL, in one embodiment.

At 910, the present embodiment generates an error sum value by summing a current error in a current modulation step and a previous error (e.g., previous error sum) from a previous modulation step. As such, the error sum value is a sum of all the error values in previous modulation steps and the current modulation step. Introduction of the error sum value enables the present embodiments to achieve a higher frequency of a change of sign of the error from a target signal, thereby obtaining better frequency profile and improved EMI reduction.

In addition, the error sum value is quantized by determining a most significant bit (MSB) of the error sum value. In particular, the index is increased by one when the MSB indicates a sign of the error sum value is negative, in one embodiment. Also, the index is decreased by one when the MSB indicates a sign of the error sum value is positive, in another embodiment.

At 920, the present embodiment modulates an index that is associated with a current error based on the error sum value. The current error is chosen from the best error associated with a vector of a P value that generates the least error when compared with a target signal. In particular, the modulated index is used for selecting feedback loop divider count values used for dividing a frequency of said signal. That is, the index that is modulated is fed to a feedback divider of a PLL.

In one embodiment, a range of the index is limited to a maximum value. In another embodiment, the range of the index is limited to a minimum value.

In another embodiment, current error is modified based on the error sum value. As such, the next error (e.g., next previous error) is generated that is associated with the next modulation step.

Figure 10A:
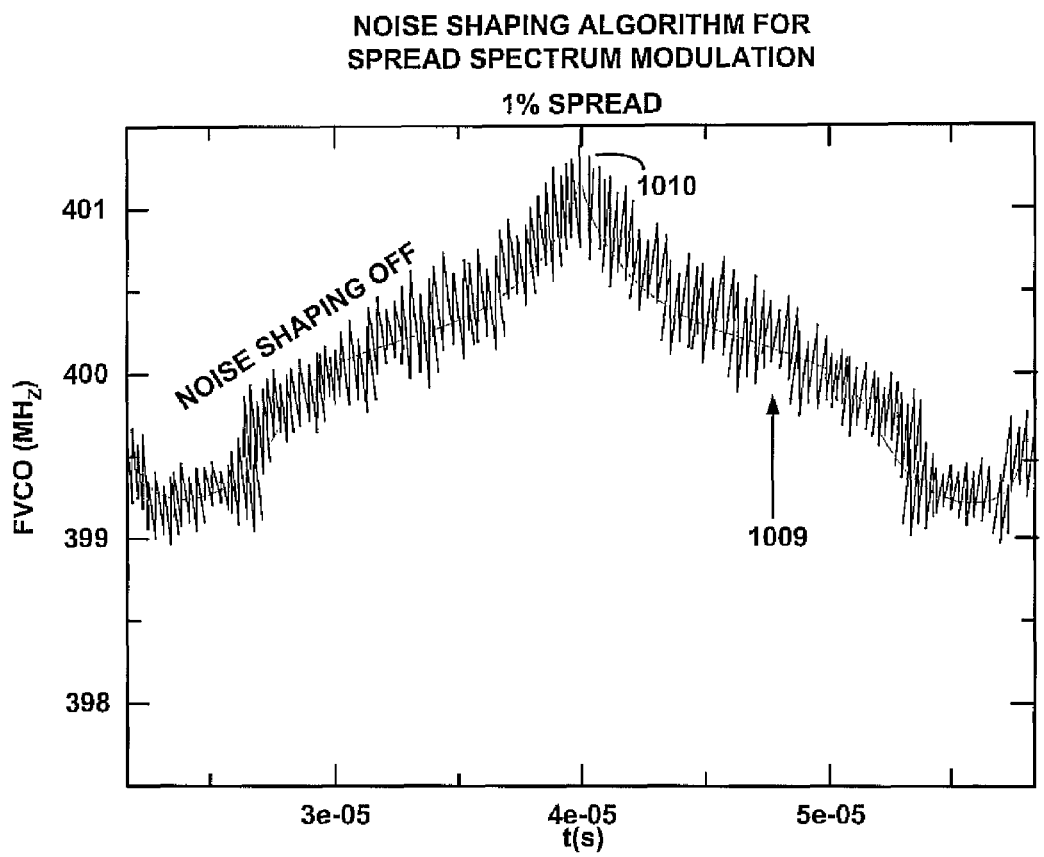
FIG. 10A is a diagram of a frequency response of the output frequency from a frequency synthesizer without any noise enhancements, in accordance with one embodiment of the present invention.

FIG. 10A is a diagram of the frequency response of a frequency synthesizer without any noise enhancements of the present invention, in accordance with one embodiment of the present invention. The diagram of FIG. 10A illustrates that the modulated frequency of the output signal 1010 from the frequency synthesizer does not follow the underlying target signal 1009. In addition, the frequency jittering is not high, because the frequency of the change of sign of the error is not very high.

Figure 10B:
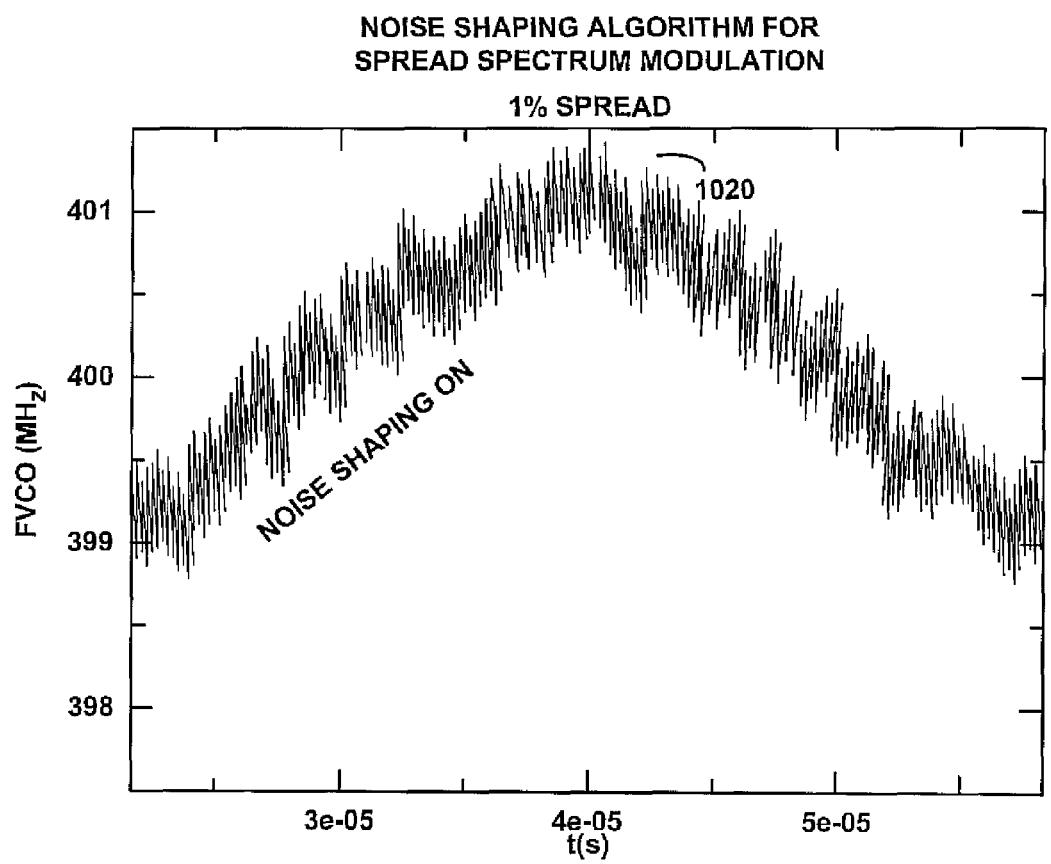
FIG. 10B is a diagram of the frequency response of a frequency synthesizer with noise enhancements of the present invention.

FIG. 10B is a diagram of the frequency response of a frequency synthesizer with noise enhancements of the present invention. The diagram of FIG. 10B illustrates that the modulated frequency of the output signal 1020 from the frequency synthesizer follows the same underlying target signal as in FIG. 10A better than modulated frequency of the output signal 1010 of FIG. 10A. Also, the frequency jittering is much higher, because the frequency of the change of the sign of the error is much higher than that of FIG. 10A. As such, with the enhanced noise shaping of the present invention, the frequency synthesizer is able to achieve better EMI performance with better shape tracking. That is, the frequency synthesizer exhibits an improved reduction in EMI when compared to frequency synthesizers that do not implement the enhanced noise shaping of the present invention.

Figure 11A:
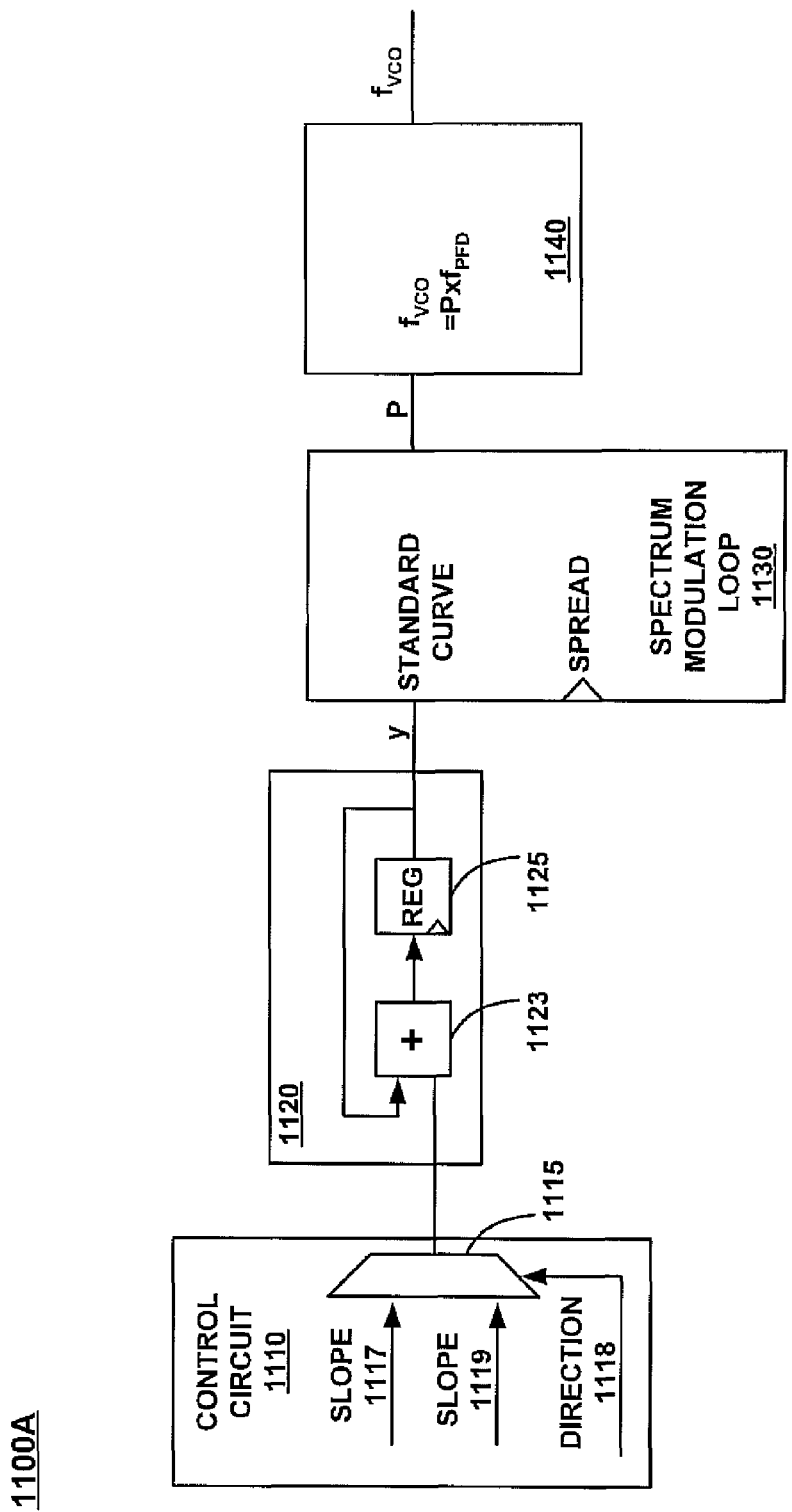
FIG. 11A is a block diagram of a spread spectrum frequency synthesizer including a first order accumulator for generating a linear standard curve, in accordance with one embodiment of the present invention.

First Order Accumulation for Generating a Standard Curve that is Further Modulated to Generate a Desired Frequency Profile FIG. 11A is a block diagram of a frequency synthesizer 1100A that implements first order accumulation to generate a linear standard curve that is further modulated to generate a frequency profile, in accordance with one embodiment of the present invention. The frequency synthesizer is capable of performing spread spectrum synthesis when generating a P-sequence of values used in a phase-locked loop of the frequency synthesizer, in accordance with one embodiment of the present invention.

The frequency synthesizer 1100A comprises a system for modulating a signal to generate a standard curve. As shown in FIG. 11A, the frequency synthesizer 1100A comprises a control circuit 1110, an accumulator 1120, a spread spectrum modulation loop 1130, and a phase-locked loop 1140, all of which are communicatively coupled. The spread spectrum modulation loop 1130 modulates the standard curve to generate a P-sequence of values, which are then used to generate a desired frequency profile. In one embodiment, the spread spectrum modulation loop 1130 is analogous to the frequency spreading control pattern generation system 300 of FIG. 3B, and the spread spectrum modulator 700 of FIG. 7.

The control circuit 1110 produces a plurality of input signals that is scalable for generating any type of frequency profile. For example, the plurality of input signals is capable of generating a standard curve that is linear, in one embodiment. In another embodiment, the plurality of input signals is capable of generating a standard curve that is non-linear.

The control circuit 1110 outputs the plurality of input signals. More specifically, the frequency synthesizer 1100A of FIG. 11A produces a standard curve that is linear in shape. This is because the control circuit 1110 generates input signals in the plurality of input signals that exhibit a constant slope value. As such, the absolute value of the slope does not change.

However, the sign of the slope value may change. That is, in one input signal, the slope value is a positive constant value 1117. In addition, in another input signal of the plurality of input signals, the slope value is a negative constant value 1119.

As shown in FIG. 1100A, the control circuit 1110 comprises a multiplexer 1115 for selecting the proper slope value, either the positive slope value 1117, or the negative slope value 1119, when the absolute value of the slope is a constant. The direction 1118 of the slope instructs the multiplexer 1115 to select either the positive slope value 1117, or the negative slope value 1119.

As such, the output of the control circuit 1110 is the plurality of input signals that is arranged in a sequence. Each of the plurality of input signals comprises a slope and direction of the slope. That is, each of the input signals either is a positive slope value 1117, or a negative slope value 1119. In other words, each of the slopes in the plurality of input signals comprises a constant slope value. Each of the plurality of input signals also comprises a direction of the slope, wherein the direction of the slope varies between input signals, in one embodiment.

The plurality of input signals is sent to an accumulator 1120, which generates a standard curve. The standard curve is input into the spread spectrum modulation loop 1130. The spread spectrum modulation loop 1130 modulates the standard curve to generate a P-sequence of values that consists of feedback loop divider information. More specifically, the P-sequence of values is input into a divider of the phase-locked loop 1140 of the frequency synthesizer 1110A to generate a desired frequency profile $f_{VCO}$, as described previously. Furthermore, the spread spectrum modulation loop can produce control signal sequence containing multiple signals, which is defined as control state.

As shown in FIG. 11A, the accumulator 1120 comprises an adder 1123 and a register 1125. The accumulator sums the plurality of input signals in order to generate a standard curve.

In particular, for each cycle, the accumulator receives an input signal from the control circuit 1110 at an adder 1123. The input signal is part of the plurality of input signals delivered in sequence. The accumulator receives one input signal in the sequence per cycle.

More specifically, the adder 1123 sums the received input signal and a previously summed value of received input signals to generate a current summed value, y, of received input signals. The previously summed value of received input signals is received by the adder from the register 1125 through a loop.

The current summed value of received input signals is then stored in the register 1125. The current summed value of received input signals in the register can then be provided through the loop back to the adder in the next cycle as the previously summed value of received input signals. For instance, in the next cycle, the loop in the accumulator 1120 sends the summed value of received input signals stored in the register 1125 back to the adder 1123, for use as the previously summed value of received input signals.

In addition, the output of the accumulator 1120 is the current summed value, y. The current summed value, y, forms part of the standard curve that is sent to the spread spectrum modulation loop 1130. That is, the sequence of values, y, that is output by the accumulator 1120 forms the standard curve that is input to the spread spectrum modulation loop 1130.

Thereafter, the spread spectrum modulation loop 1130 modulates the standard curve to generate a P-sequence of values that are used to generate the desired frequency profile. More particularly, the P-sequence of values is delivered to a divider of the phase-locked loop 1140.

In embodiments of the present invention, the frequency synthesizer is capable of tracking the standard curve at the output of the phase-locked loop 1140. That is, if the standard curve is a linear curve, the generated frequency profile, $f_{VCO}$, at the output of the phase-locked loop will also be linear as it closely tracks the standard curve. In addition, if the standard curve is a non-linear curve, then the generated frequency profile, $f_{VCO}$, at the output of the phase-locked loop will also be non-linear as it closely tracks the standard curve.

In one embodiment, the standard curve is repeatable. That is, plurality of input signals comprises a repeatable sequence. As such, the plurality of input signals that are input to the spread spectrum modulation loop 1130 will generate a P-sequence that generates a repeatable frequency profile at the output, $f_{VCO}$, of the phase-locked loop 1140.

In another embodiment, the standard curve is non-repeatable. That is, the plurality of input signals comprises a non-repeatable sequence. As such, the plurality of input signals that are input to the spread spectrum modulation loop 1130 will generate a P-sequence that generates a non-repeatable frequency profile, $f_{VCO}$, at the output of the phase-locked loop 1140.

In still another embodiment, the start condition of the frequency synthesizer is zero. That is, the register 1125 holds a value of zero. In another embodiment, the register 1125 holds a non-zero value for the start condition.

Figure 11B:
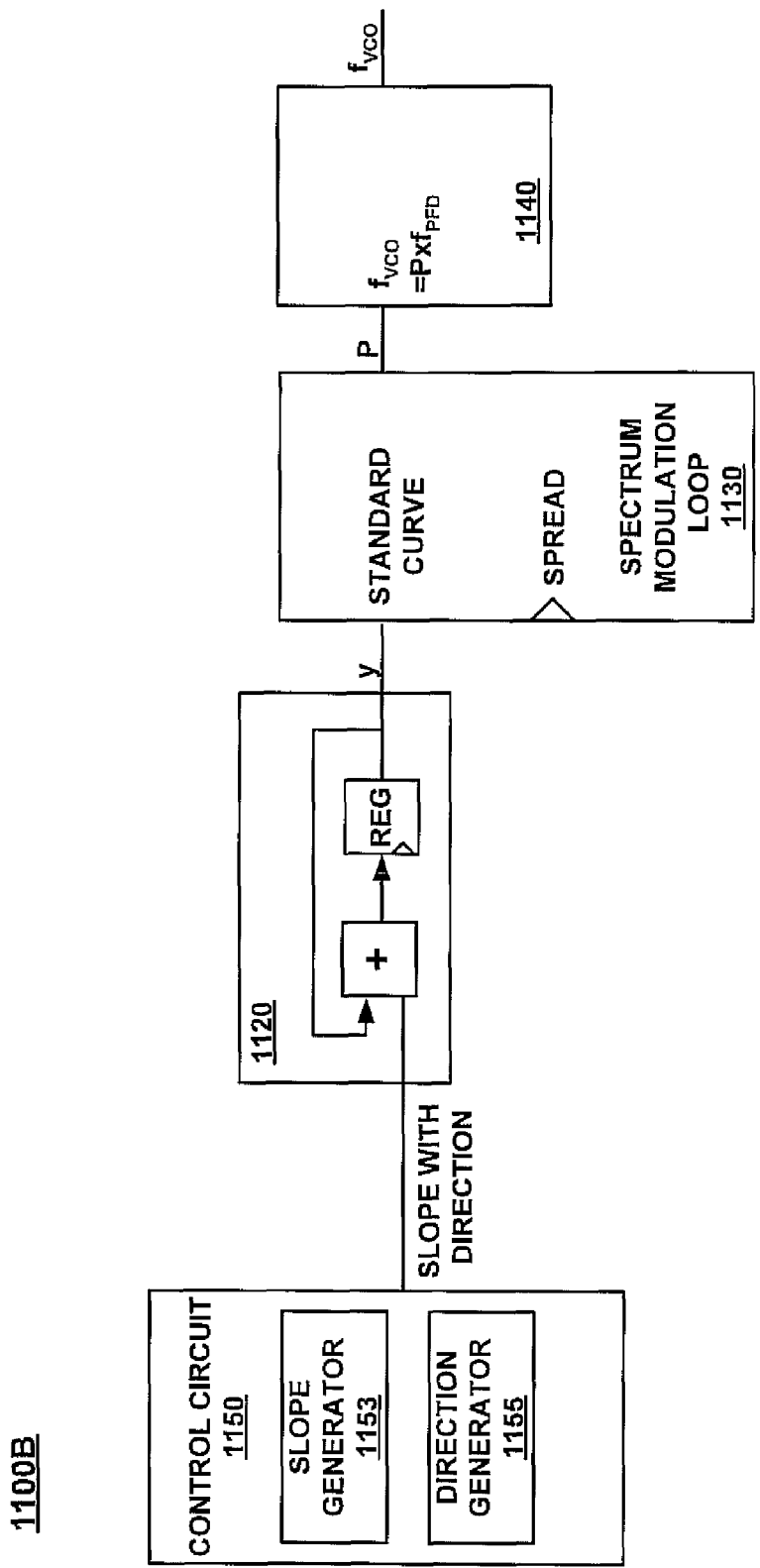
FIG. 11B is a block diagram of a spread spectrum frequency synthesizer including a first order accumulator for generating a non-linear standard curve, in accordance with one embodiment of the present invention.

FIG. 11B is a block diagram of a frequency synthesizer 1100B that implements first order accumulation to generate a non-linear standard curve that is further modulated to generate a frequency profile, in accordance with one embodiment of the present invention. The frequency synthesizer is capable of performing spread spectrum synthesis when generating a P-sequence of values used in a phase-locked loop of the frequency synthesizer, in accordance with one embodiment of the present invention.

In one embodiment, the frequency synthesizer 1100B is analogous to the frequency synthesizer 1100A of FIG. 11A. As such, it is intended that similarly numbered elements of FIGS. 11A and 11B perform similar functions.

The frequency synthesizer 1100B comprises a system for modulating a signal to generate a standard curve. As shown in FIG. 11B, the frequency synthesizer 1100B comprises a control circuit 1150, an accumulator 1120, a spread spectrum modulation loop 1130, and a phase-locked loop 1140, all of which are communicatively coupled. In summary, the spread spectrum modulation loop 1130 modulates the standard curve outputted by the accumulator 1120 to generate a P-sequence of values, which are then used to generate a desired frequency profile.

As shown in FIG. 11B, the control circuit 1110 produces a plurality of input signals that is scalable for generating any type of frequency profile. For instance, in the present embodiment, the plurality of input signals is used to generate a standard curve that is non-linear.

In particular, the control circuit 1150 outputs the plurality of input signals. Specifically, the control circuit 1150 comprises a slope generator for generating the plurality of input signals that exhibit a varying slope. As such, the absolute value of the slope values between input signals can change, in one embodiment. More particularly, the slope is capable of varying between input signals. Because of the varying slope for the input signals, the frequency synthesizer 1100B of FIG. 11B produces a standard curve that is non-linear in shape, in one embodiment.

In one embodiment, the slope generator 1153 comprises an RC circuit that varies the slope between input signals. As such, the RC circuit is able to generate a repeatable pattern that is used as slope values for the input signals. In other embodiments, other means for generating the varying slope values are implemented, such as a look-up tables of slope values, by calculation, etc.

In addition, the control circuit 1150 also comprises a direction generator 1155. Specifically, the direction generator 1155 generates a sign of the slope value for the input signal. In one embodiment, the slope value for an input signal is a positive value. In another embodiment the slope value for an input signal is a negative value. More particularly, the sign of the slope values is capable of varying between input signals.

As such, the output of the control circuit 1150 is the plurality of input signals that is arranged in a sequence. Each of the plurality of input signals comprises a slope and direction of the slope. That is, each of the input signals comprises a variable slope value and a direction (e.g., positive or negative) of the slope value. In other words, each of the input values comprises a slope and direction, wherein the slope and direction both are capable of varying between input signals, in one embodiment.

As previously described, the plurality of input signals is sent to the accumulator 1120, which generates a non-linear standard curve, in the present embodiment. The standard curve is input into the spread spectrum modulation loop 1130, which modulates the standard curve to generate a P-sequence of values. The P-sequence is input into a divider of the phase-locked loop 1140 of the frequency synthesizer 1100B to generate a desired frequency profile, $f_{VCO}$.

In embodiments of the present invention, the frequency synthesizer is capable of tracking the standard curve at the output of the phase-locked loop 1140. That is, since in the present embodiment the standard curve is a non-linear curve, the generated frequency profile, $f_{VCO}$, at the output of the phase-locked loop 1140 will also be non-linear as it closely tracks the standard curve.

Also, as previously described, the standard curve is repeatable in one embodiment. As such, the standard curve that is input to the spread spectrum modulation loop 1130 will generate a repeatable frequency profile at the output, $f_{VCO}$, of the phase-locked loop. In another embodiment, the standard curve is non-repeatable. That is, the plurality of input signals comprises a non-repeatable sequence. As such, the standard curve that is input to the spread spectrum modulation loop 1130 will generate a P-sequence that generates a non-repeatable frequency profile, $f_{VCO}$, at the output of the phase-locked loop 1140. For example, this non-repeating frequency profile is used in communication devices implementing encryption.

Figure 12A:
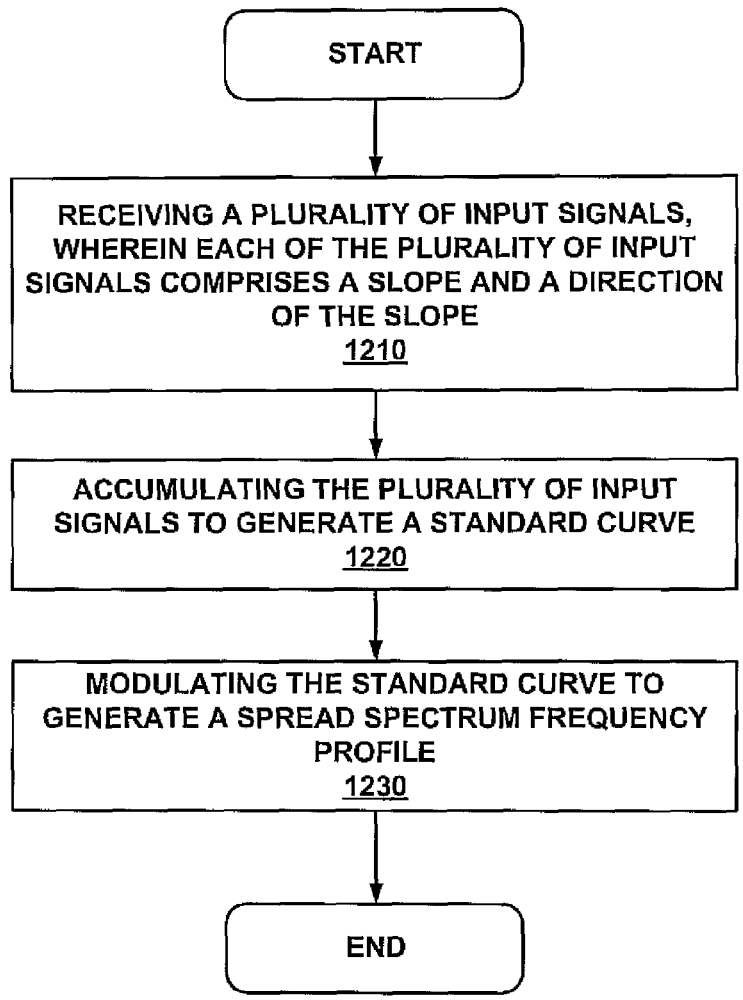
FIG. 12A is a flow chart illustrating steps in a method for generating a standard curve that modulates a PLL to generate a spread spectrum frequency profile, in accordance with one embodiment of the present invention.

FIG. 12A is a flow chart 1200A illustrating steps in a method for modulation that implements first order accumulation to generate a standard curve that is further modulated to generate a frequency profile, in accordance with one embodiment of the present invention. In one embodiment, the method of flow chart 1200A is capable of performing fractional-N synthesis when generating a P-sequence of values used for generating a frequency profile in a frequency synthesizer.

At 1210, the present embodiment receives a plurality of input signals. Each of the plurality of input signals comprises a slope value and a direction (positive or negative) of the slope value. The plurality of input signals is scalable for generating any type of frequency profile (e.g., linear, non-linear, etc.), in one embodiment.

In one embodiment, the slope values between input signals are kept constant. That is, the slopes of the plurality of input signals is constant.

The present embodiment varies the directions between input signals of the plurality of input signals. That is, even between two input signals, the direction may change. As such, one input signal may be a positive slope value, while the next input signal may be a negative slope value. As a result, the generated frequency profile will be linear.

In another embodiment, the slope values vary between input signals of the plurality of input signals. That is, the absolute value of slope values between input signals can vary and be different. In addition, the present embodiment varies the directions between input signals of the plurality of input signals. That is, between two input signals, the direction (positive or negative) may change. As such, one input signal may be a positive slope of a first slope value, while the next input signal may be a negative slope of a second slope value.

At 1220, the present embodiment accumulates the plurality of input signals to generate a standard curve. The standard curve is used by a spread spectrum modulation loop to generate a P-sequence of values that consists of feedback loop divider information.

At 1230, the present embodiment modulates the standard curve to generate a spread spectrum frequency profile. More particularly, the present embodiment modulates the standard curve to generate a P-sequence. The P-sequence is used by a feedback divider of a phase-locked loop for generating the spread spectrum frequency profile, as previously described in relation to FIGS. 11A and 11B.

Figure 12B:
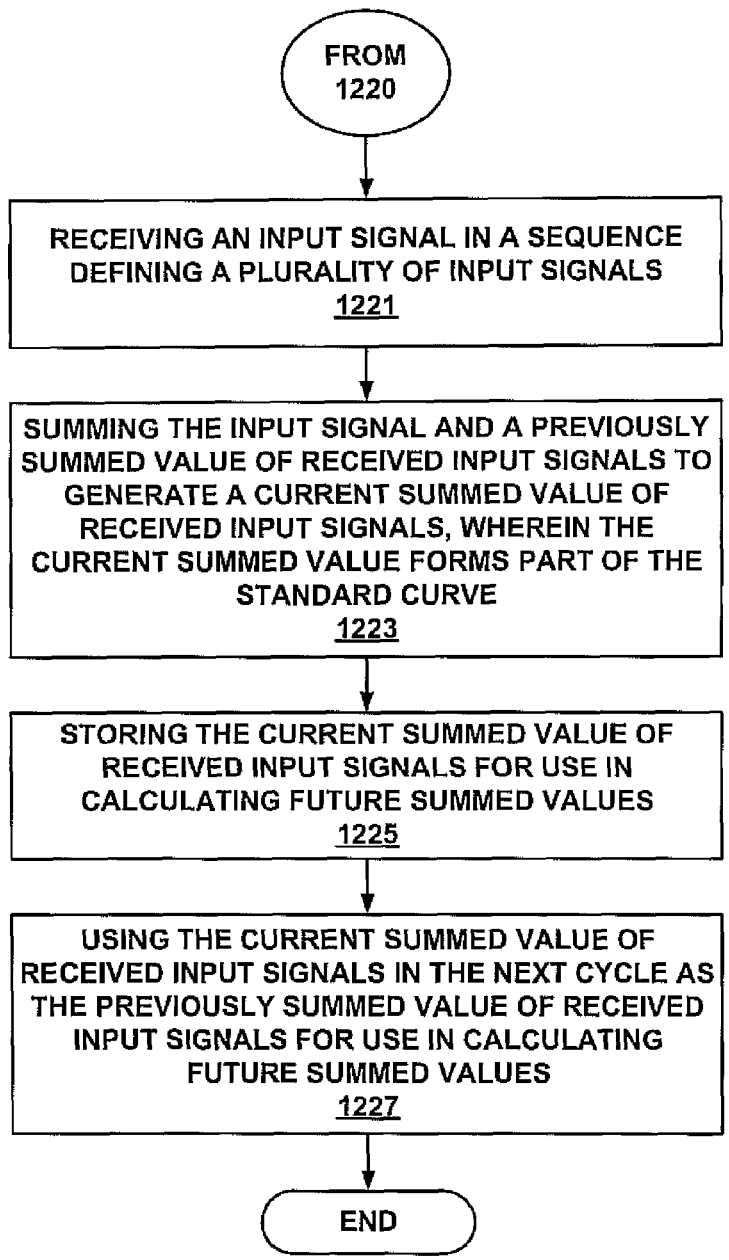
FIG. 12B is a flow diagram illustrating steps in a method for generating a standard curve from the plurality of input signals, in accordance with one embodiment of the present invention.

FIG. 12B is a flow diagram 1200B illustrating steps in a method for generating the standard curve from the plurality of input signals, in accordance with one embodiment of the present invention. FIG. 12B is a further description of 1220 of FIG. 12A, in one embodiment.

At 1221, the present embodiment receives an input signal. The input signal is part of a sequence that defines the plurality of input signals.

At 1223, the present embodiment sums the input signal with a previously summed value of received input signals to generate a current summed value of received input signals. As such, with each additional input signal of the sequence that is received, the present embodiment accumulates the input signal along with the previously summed value of the received input signals, in order to generate a current summed value. Each of the current summed values in sequence form the standard curve.

At 1225, the current summed value of the received input signal is stored. As such, the current summed value of received input signals can be retrieved for use in forming the standard curve.

Additionally, at 1227, the current summed value of received input signals is used in calculating future summed values. That is, the current summed value is fed back to 1260 in the next cycle to be summed with the next input signal.

Figure 13A:
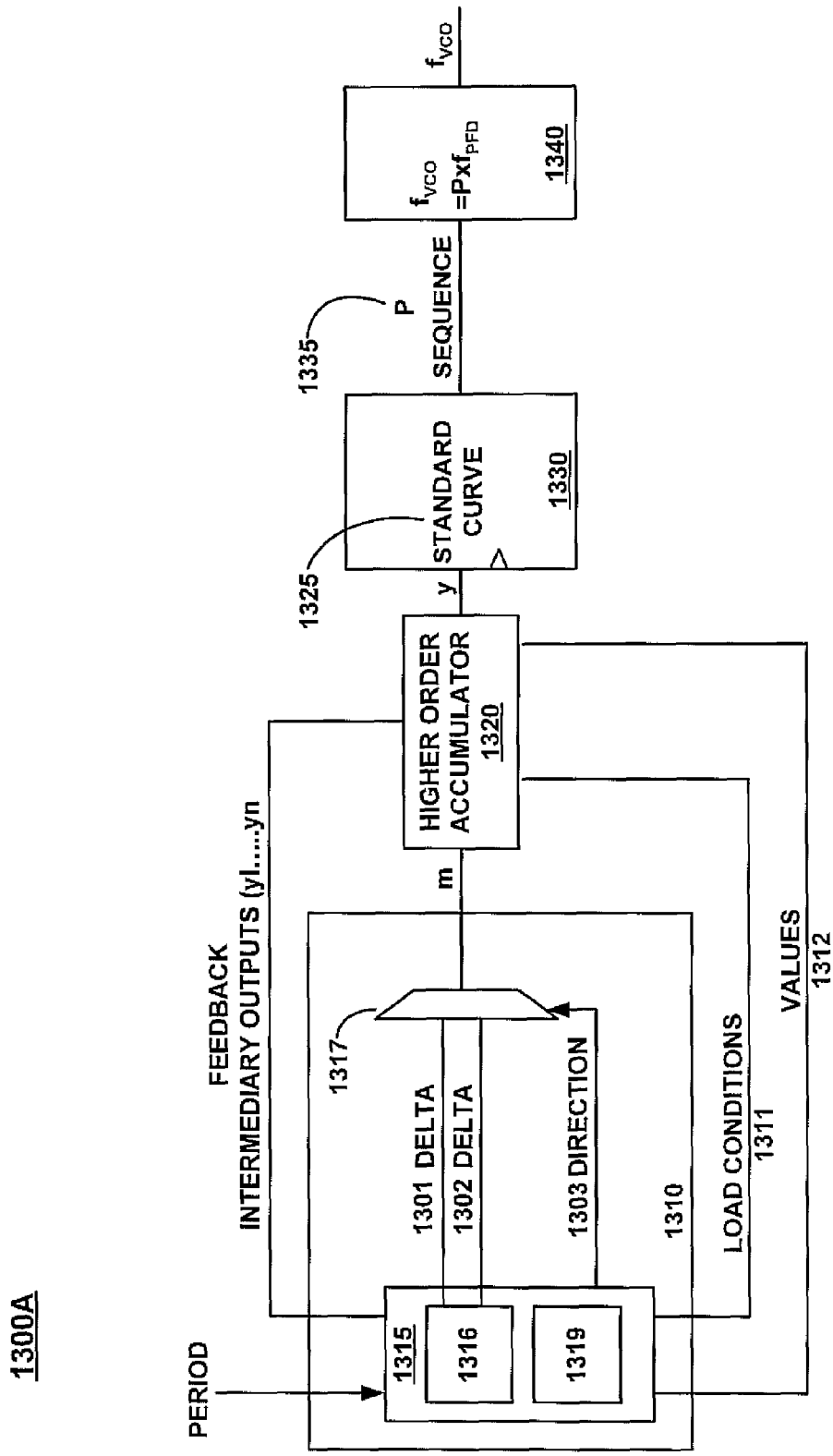
FIG. 13A is a block diagram of a spread spectrum frequency synthesizer including a higher order accumulator block for generating a non-linear standard curve, in accordance with one embodiment of the present invention.

Higher Order Accumulation for Generating a Standard Curve that is Further Modulated to Generate a Desired Frequency Profile FIG. 13A is a block diagram of a spread spectrum frequency synthesizer 1300A including a high or higher order accumulator block for generating a non-linear standard curve, in accordance with one embodiment of the present invention. The terms high and higher order can be used interchangeably. The frequency synthesizer is capable of performing spread spectrum synthesis when generating a P-sequence of values used in a phase-locked loop of the frequency synthesizer, in accordance with one embodiment of the present invention.

The frequency synthesizer 1300A comprises a system for modulating a signal to generate a standard curve 1325. As shown in FIG. 13A, the frequency synthesizer 1300A comprises a control circuit 1310, a higher order accumulator 1320, a spread spectrum modulation loop 1330, and a phase-locked loop 1340, all of which are communicatively coupled.

In particular, the spread spectrum modulation loop 1130 modulates the standard curve 1325 to generate a P-sequence of values 1335, which are then used to generate a desired frequency profile, $f_{VCO}$. In one embodiment, the spread spectrum modulation loop 1130 is analogous to the frequency spreading control pattern generation system 300 of FIG. 3B, and the spread spectrum modulator 700 of FIG. 7, for example.

The control circuit 1310 generates a plurality of input signals that is scalable for generating any type of frequency profile. That is, the control circuit 1310 outputs the plurality of input signals. For example, the plurality of input signals is capable of generating a standard curve 1325 that is non-linear, in one embodiment.

In particular, the control circuit 1310 comprises control logic 1315 and a multiplexer 1317 for generating the plurality of input signals, in accordance with one embodiment. It is to be understood that other embodiments of the control circuit 1310 are capable of generating the plurality of input signals.

The control logic 1315 generates and delivers delta signals, direction signals, load condition signals, and value signals. The control logic 1315 also receives a period signal, and intermediary output signals (e.g., $y_1, y_2, \ldots, y_n$) that are fed back from the higher order accumulator 1320, as will be described below.

Figure 15:
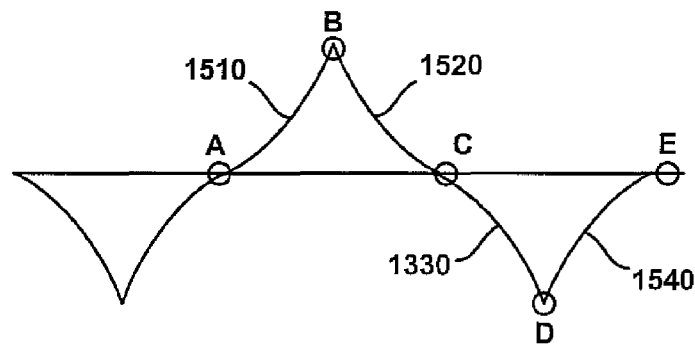
FIG. 15 is a diagram of a standard non-linear curve, in accordance with one embodiment of the present invention.

The period signal indicates how many phases define the standard curve 1325. In particular, FIG. 15 is a graph illustrating the four phases of a standard curve, 1325. As shown in FIG. 15, the standard curve 1325 is defined by four phases. The first phase 1510 begins at point A and ends at the positive peak denoted by point B. The second phase 1520 begins at point B and ends at the zero crossover at point C. The third phase begins at point C and ends at the negative peak at point D. The fourth phase beings at point D, and ends at the zero cross-over at point E.

As shown in FIG. 15, each phase may be broken down into a plurality of cycles, each of which produces a value y used in sequential order to produce the standard curve 1325. For instance, each of the four phases of the standard curve 1325 may be defined by 100 cycles. As such, the first phase is defined by cycles 0-99. The second phase is defined by cycles 100-199. The third phase is defined by cycles 200-299. The fourth phase is defined by cycles 300-399.

Returning now to FIG. 13A, the control logic 1315 comprises a slope generator 1316 and a direction generator 1319, in accordance with one embodiment. In particular, the slope generator 1316 generates the slope value, delta, for the plurality of input signals. The direction generator 1319 generates the direction assigned to a corresponding slope value in a corresponding input signal.

In one embodiment, the slope value, delta, is constant. As such, the input signal, m, for a particular cycle that is output from the control circuit 1310 would be either the positive delta value 1301, or the negative delta value 1302, where the absolute value of the slope is delta.

The direction signal 1303 provided by the direction generator 1319 instructs the multiplexer 1317 to select either the positive delta value 1301 or the negative slope value 1302. As such, the sign of the slope value, delta, may change. That is, between input signals, the direction, or sign, of the slopes may be different. For instance, in one cycle, the input signal, m, may be positive delta 1301. In the following cycle, the input signal, m, may be negative delta 1302.

In another embodiment, the slope value, delta, is varying. That is, the slope value, delta, may change between input signals. As such, the slope generator 1316 generates the slope value, delta, for each input signal, or cycle. Thereafter, the slope generator 1316 delivers both the positive delta 1301, and the negative delta 1302 to the multiplexer 1317. Selection of either the positive delta 1301 or the negative delta 1302 depends on the direction signal 1303 generated by the direction generator 1319 for that input signal, or cycle.

As such, the output of the control circuit 1310 is the plurality of input signals that is arranged in a sequence. Each of the plurality of input signals comprises a slope and a direction of the slope. That is, each of the input signals either is a positive delta 1301, or a negative delta 1302. Each of the plurality of input signals also comprises a direction of the slope for selecting between the positive delta 1301 and the negative delta 1302, wherein the direction of the slope varies between input signals, in one embodiment.

The plurality of input signals is sent to a higher order accumulator block 1320. In particular, the higher order accumulator block 1320 receives the plurality of input signals from the control circuit 1310. The higher order accumulator block 1320 comprises at least two accumulators, in one embodiment. More specifically, the higher order accumulator block 1320 sums the plurality of input signals to generate a standard curve 1325 that is non-linear, in one embodiment.

As shown in FIG. 13A, the logic circuit 1310 generates and deliver load condition signals and value signals to the higher order accumulator 1320. The load condition signal 1311 is associated with a corresponding value signal 1312 that comprises a load value. The load condition signal 1311 instructs the higher order accumulator to load the load value and is used for controlling the shape of the standard curve, as will be further described below.

The spread spectrum modulation loop 1130 receives the standard curve 1325. In particular, the spread spectrum modulation loop 1330 modulates the standard curve 1325 to generate a P-sequence 1335 of values that consists of feedback loop divider information. The P-sequence 1335 of values in one embodiment is a spread spectrum control sequence. More specifically, the P-sequence 1335 of values is input into a divider of the phase-locked loop 1340 of the frequency synthesizer 1110A to generate a desired frequency profile $f_{VCO}$, as described previously.

Figure 13B:
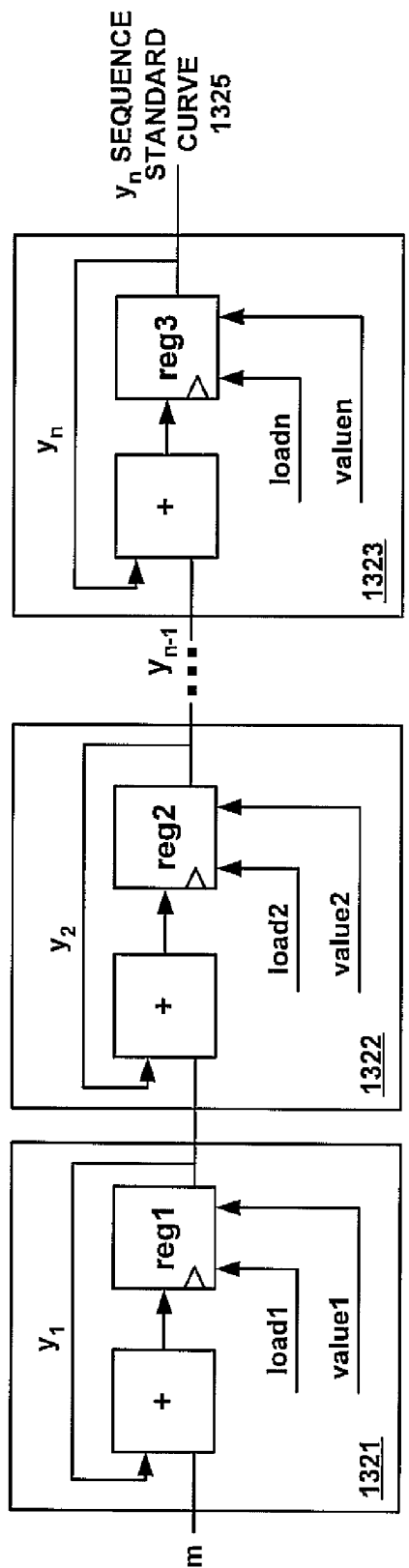
FIG. 13B is a block diagram of the higher order accumulator block of FIG. 13A comprising a plurality of accumulators coupled in series for generating a non-linear standard curve that is modulated to generate a frequency profile, in accordance with one embodiment of the present invention.

FIG. 13B is a block diagram of a higher order accumulator block 1320A comprising a plurality of accumulators coupled in series for generating a non-linear standard curve that is modulated to generate a frequency profile, in accordance with one embodiment of the present invention. In one embodiment, the higher order accumulator block 1320A of FIG. 13B provides further details to the higher order accumulator block 1320 of FIG. 13A.

In particular, the higher order accumulator block 1320A of FIG. 13B comprises at least two accumulators in series. For example, in one embodiment, the higher order accumulator block 1320 comprises a first accumulator that is coupled in series with a second accumulator.

In one embodiment, the first accumulator receives the plurality of input signals, and generates a first plurality of outputs. The second accumulator receives the first plurality of outputs and generates a second plurality of outputs. In one embodiment, the second plurality of outputs comprises the standard curve 1325.

In another embodiment, the higher order accumulator block 1320A comprises n accumulators that are coupled in series, where n is equal to or greater than two. In particular, as shown in FIG. 13B, the higher order accumulator block 1320A comprises a first accumulator 1321 that receives a plurality of input signals from the control circuit 1310.

More specially, in one cycle, the first accumulator 1321 receives an input signal, m, from the control circuit 1310. The first order accumulator sums the plurality of input signals and generates a first plurality of output signals. That is, in the present cycle, the first accumulator 1321 generates a first output, $y_1$.

In addition, the higher order accumulator block 1320A comprises a second accumulator 1322 coupled to the first accumulator 1321 in series. In one cycle, the second accumulator 1322 receives the first output, $y_1$, and sums the first output with previously received first outputs to generate a second output, $y_2$. That is, over many cycles, the second order accumulator sums the plurality of inputs that comprises a plurality of first outputs, $y_1$. As such, the second order accumulator 1322 sums the plurality of received inputs, $y_1$, and generates a second plurality of outputs.

As shown in FIG. 13B, the higher order accumulator includes n accumulators coupled in series. The $n^{th}$ accumulator 1323 receives the output from the $n-1^{th}$ accumulator. In particular, the $n^{th}$ accumulator receives the $n-1^{th}$ output and generates the $n^{th}$ output, $y_n$. The $y_n$ sequence of outputs from the $n^{th}$ accumulator 1323 forms the standard curve 1325 over many cycles.

In one embodiment, the higher order accumulation block 1320A of FIG. 13B is capable of loading conditions at each of the accumulators for controlling the shape of the standard curve 1325. In one embodiment, each of the accumulators can load conditions independently, as directed by the control circuit 1310. For example, the description of loading conditions for accumulator 1390 of FIG. 13D is equally applicable to the accumulators of the higher order accumulator block 1320A of FIG. 13D. That is, a load signal can instruct a corresponding register to load an associated value.

Load conditions are asserted at critical points in the formation of the standard curve 1325. For example, in one embodiment, load conditions are asserted when the standard curve changes phases in a period. In another embodiment, load conditions are asserted mid-phase. As such, the asserted load conditions are asserted to better shape the standard curve 1325 at any point in the standard curve 1325.

Figure 13C:
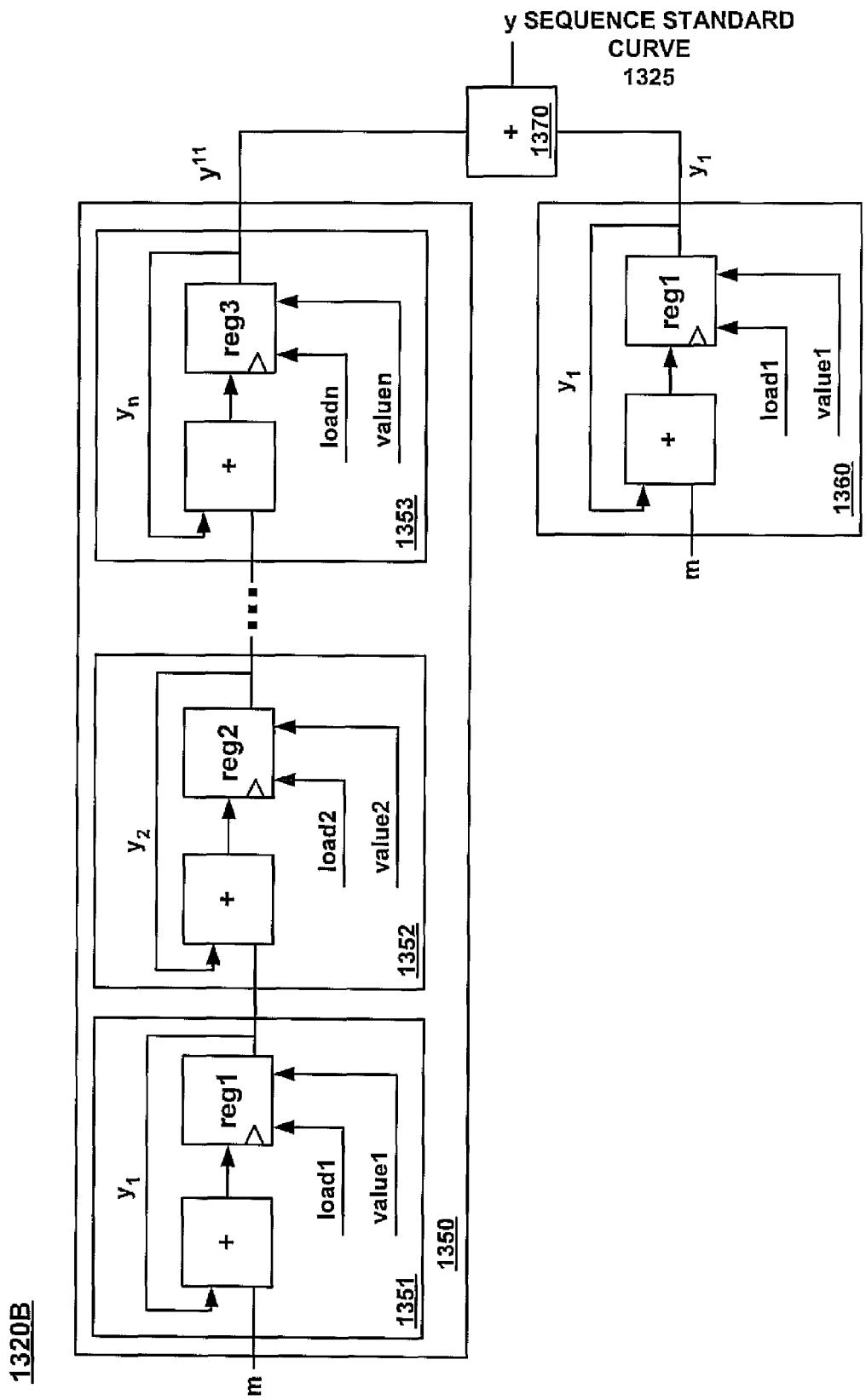
FIG. 13C is a block diagram of the higher order accumulator block of FIG. 13A that sums a non-linear curve and a linear curve for generating a non-linear standard curve that is modulated to generate a frequency profile, in accordance with one embodiment of the present invention.
Figure 13D:
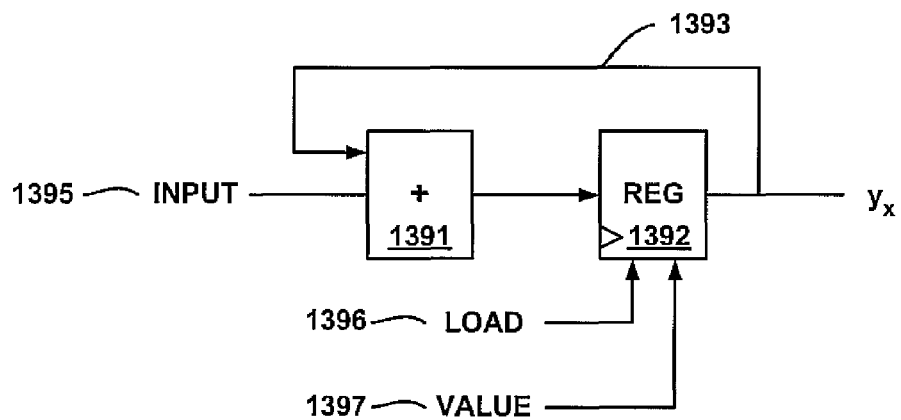
FIG. 13D is block diagram of an accumulator used in the higher order accumulator block of FIG. 13A, in accordance with one embodiment of the present invention.

FIG. 13C is a block diagram of a higher order accumulator block 1320B comprising a plurality of accumulators coupled in series for generating a non-linear standard curve that is modulated to generate a frequency profile, in accordance with one embodiment of the present invention. In one embodiment, the higher order accumulator block 1320B of FIG. 13C provides further details to the higher order accumulator block 1320 of FIG. 13A.

In particular, the higher order accumulator block 1320B of FIG. 13C is coupled to the control circuit 1310 of FIG. 13A. The control circuit 1310 generates a plurality of input signals that is scalable to a frequency profile. Each of the input signals comprises a slope and a direction of the slope. More specifically, the higher order accumulator block 1320B receives a plurality of input signals (e.g., an m sequence) for summing a non-linear curve with a linear curve to generate a standard curve 1325 that is non-linear, in accordance with one embodiment of the present invention.

In accordance with one embodiment of the present invention, a spread spectrum modulation loop receives the standard curve 1325. The spread spectrum modulation loop comprises a phase-locked loop, and modulates the standard curve 1325 to generate a P-sequence in order to generate a desired frequency profile that tracks the standard curve.

As shown in FIG. 13C, the higher order accumulator block 1320B comprises a first path 1350 and a second path that comprise an accumulator 1360. The first path 1350 comprises at least two accumulators coupled in series. More specifically, the first path 1350 receives a first plurality of input signals (e.g., an m sequence) from the control circuit 1310, and sums the first plurality of input signals to generate a non-linear curve y".

As shown in FIG. 13C, the first path 1350 comprises n accumulators that are coupled in series, where n is equal to or greater than two. In particular, as shown in FIG. 13C, the first path 1350 comprises a first accumulator 1351 that receives a plurality of input signals (e.g., m sequence) from the control circuit 1310.

More specifically, in one cycle, the first accumulator 1351 receives an input signal, m, from the control circuit 1310. In the present cycle, the first accumulator 1321 generates a first output, $y_1$. Over many cycles, the first accumulator 1321 generates a $y_1$ sequence.

In addition, the first path 1350 comprises a second accumulator 1352 coupled to the first accumulator 1351 in series. In one cycle, the second accumulator 1322 receives the first output, $y_1$, and sums the first output with previously received first outputs to generate a second output, $y_2$. That is, over many cycles, the second accumulator 1352 sums the received inputs that comprise a $y_1$ sequence. As such, the second accumulator 1352 sums the $y_1$ sequence, and generates a second plurality of outputs, $y_2$ sequence.

As shown in FIG. 13C, the first path comprises an $n^{th}$ accumulator 1353. The $n^{th}$ accumulator 1353 receives the output from the $n-1^{th}$ accumulator. In particular, the $n^{th}$ accumulator 1353 receives the $n-1^{th}$ output and generates the $n^{th}$ output, $y_n$. The $y_n$ sequence of outputs from the $n^{th}$ accumulator 1353 forms the non-linear curve, y" over many cycles.

The second path comprises another accumulator block 1360. The accumulator 1360 receives a second plurality of input signals from the control circuit 1310 and sums the second plurality of input signals to generate a linear curve, y'. In one embodiment, the first plurality of input signals and the second plurality of input signals from the control circuit 1310 is substantially similar. As such, the first accumulator 1351 and the accumulator 1360 would receive the same input signal, m, per cycle, and generate the same output, $y_1$.

In one embodiment, the accumulators 1351, 1352, 1353, and 1360 are similar in configuration with the accumulator 1390 of FIG. 13D. As such, the functions and operations of the accumulator 1390 are applicable to the accumulators of the higher order accumulator block 1320B of FIG. 13C.

As shown in FIG. 13B, the higher order accumulator block 1320B also comprises an adder 1370. The adder 1370 is coupled to the first path 1350 and the accumulator 1360. Specifically, the adder 1370 sums the y" sequence that forms the non-linear curve that is output from the first path 1350 with the y' sequence that forms the linear curve that is output from the accumulator 1360 from the second path. As such, the adder 1370 generates the y sequence that forms the standard curve 1325.

In particular, the accumulator 1360 of the second path acts to average out and smooth the shape of the non-linear curve, y" of the first path 1350. Without the contribution of the accumulator 1360, the non-linear curve, y", may be too slow at the beginning of the first phase (e.g., point A of FIG. 15), and may climb too fast when approaching the peak at the beginning of the second phase (e.g., point B of FIG. 15).

As such, the linear curve y' would increase the output values of the standard curve 1325 at the beginning of the first phase. In addition, the linear curve y' would decrease the output values of the standard curve 1325 when approaching the beginning of the second phase.

In one embodiment, the higher order accumulation block 1320B of FIG. 13C is capable of loading conditions at each of the accumulators for controlling the shape of the standard curve 1325. In one embodiment, each of the accumulators can load conditions independently, as directed by the control circuit 1310. For example, the description of loading conditions for accumulator 1390 of FIG. 13D is equally applicable to the accumulators of the higher order accumulator block 1320B of FIG. 13C. That is, a load signal can instruct a corresponding register to load an associated value.

Load conditions are asserted at critical points in the formation of the standard curve 1325. For example, in one embodiment, load conditions are asserted when the standard curve changes phases in a period. In another embodiment, load conditions are asserted mid-phase, as previously described. As such, the asserted load conditions are asserted to better shape the standard curve 1325 at any point in the standard curve 1325.

For purposes of clarity and brevity, FIG. 13D is a block diagram of an exemplary accumulator 1390 used within the higher order accumulator 1320 of FIG. 13A, in accordance with one embodiment of the present invention. For instance, each of the accumulators in the higher order accumulator block 1320 of FIG. 13A, or the higher order accumulator block 1320A of FIG. 13B is analogous to the accumulator 1390.

In particular, the accumulator 1390 comprises an adder 1391 and a register 1392, in accordance with one embodiment of the present invention. More specifically, the adder 1390 receives an input 1395. In one embodiment, the adder 1391 may receive an input, m, as input 1395, from the control circuit 1310. In another embodiment, the adder 1390 may receive an input, $y_x$, as input 1395, from a previous accumulator coupled in series. For instance, the second accumulator 132 of FIG. 13B may comprise the adder 1391 and receive the input, $y_1$, from the first accumulator 1321.

The adder sums the input 1395 and a previously summed value of received inputs to generate a current summed value of received inputs.

A register 1392 is coupled to the adder 1391. The register stores the current summed value of received inputs. In addition, in one embodiment, the current summed value of received inputs comprises an output signal that is used for one cycle of the standard curve 1325, if the accumulator is the $n^{th}$ accumulator. In another embodiment, the current summed value is used as another input for a following accumulator.

In addition, the accumulator 1390 comprises a feedback loop 1393. The feedback loop 1393 sends the previously summed value of received inputs, that were previously stored in the register back to the adder 1391. That is, in one cycle, the accumulator 1390 receives the input 1395, sums the input with the previously summed value of received inputs stored in the register 1392 to generate a current summed value of received inputs, and stores the current summed value of received inputs into the register 1392.

In one embodiment, the higher order accumulation block 3120 of FIG. 13A is capable of loading conditions at each of the accumulators for controlling the shape of the standard curve 1325. In one embodiment, each of the accumulators can load conditions independently, as directed by the control circuit 1310. For purposes of clarity and brevity, the following description of the accumulator 1390 of FIG. 13D for receiving load conditions is applicable to loading conditions in all of the accumulators in the higher order accumulator 1320 of FIGS. 13A, 13B, and 13C.

As shown in FIG. 13D, the register 1392 is instructed by the control logic 1315 of the control circuit 1310 to receive a load condition using control signals. That is, the load signal 1396 instructs the register 1392 whether to load a condition, or to receive the current summed value of received inputs from the adder 1391. Specifically, if the load signal is asserted, then the register 1392 loads the corresponding value 1397 that is provided by the control circuit 1310. On the other hand, if the load signal is not asserted, then the register 1392 ignores the value 1392 and loads or stores the current summed value of received inputs from the adder 1391.

Load conditions are asserted at critical points in the standard curve 1325. For example, in one embodiment, load conditions are asserted when the standard curve changes phases in a period. Referring to FIG. 15, load conditions are asserted at corresponding accumulators of the higher order accumulator block 1320 when the standard curve reaches points A, B, C, and D for each period generated for the standard curve 1325.

For instance, in a higher order accumulator block 1320 that includes accumulators in series, for a constant input m that is positive through the first phase, the sequential output of $y_n$ that generates the standard curve 1325 will start out slowly at point A, then quickly ramp up exponentially until reaching point B. Asserting load conditions at points A and B will help shape the standard curve so that the standard curve increases more quickly past point A, and can set the conditions for the accumulators such that at point B the standard curve enters the next phase correctly.

In addition, in another embodiment, load conditions are asserted mid-phase (e.g., between points A and B). For example, without load conditions, the shape of the standard curve 1325 may increase too quickly when approaching point B. As such, a mid-phase load condition may be asserted to better shape the standard curve 1325 at any point in the standard curve 1325.

In still another embodiment, a reset condition is an example of one load condition. That is, at reset, the starting load conditions for each accumulator in the higher order accumulator block 1320 is asserted. For instance, all the registers in the accumulators in the higher order accumulator block 1320 can be reset to zero.

Figure 14:
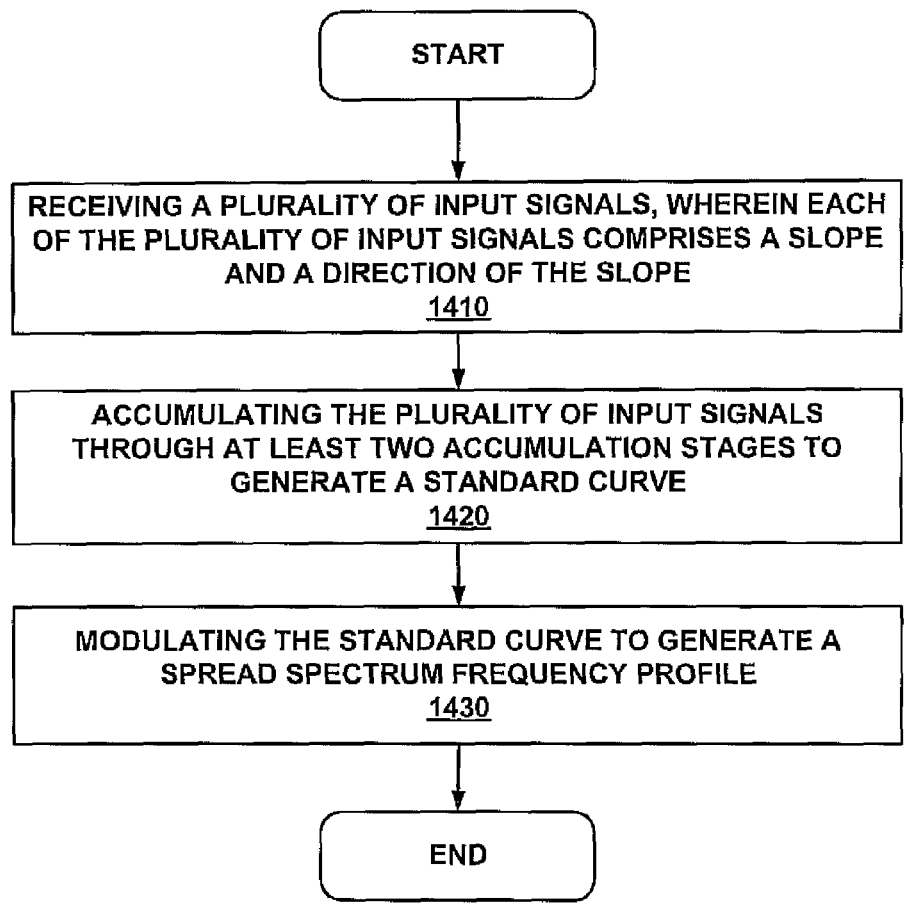
FIG. 14 is a flow diagram illustrating steps in a computer implemented method for generating a non-linear standard curve that is modulated to generate a spread spectrum frequency profile, in accordance with one embodiment of the present invention.

FIG. 14 is a flow chart 1400 illustrating steps in a method for modulation that implements higher order accumulation to generate a frequency profile, in accordance with one embodiment of the present invention. In one embodiment, the method of flow chart 1400 is capable of performing fractional-N synthesis when generating a P-sequence of values used for generating a frequency profile in a frequency synthesizer.

At 1410, the present embodiment receives a plurality of input signals. Each of the plurality of input signals comprise a slope value and a direction (positive or negative) of the slope value. The plurality of input signals is scalable for generating any type of frequency profile (e.g., linear, non-linear, etc.), in one embodiment.

In one embodiment, the slope values between input signals are kept constant. That is, the slopes, deltas, of the plurality of input signals are constant. The present embodiment varies the directions between input signals of the plurality of input signals. That is, even between two input signals, the direction may change. As such, one input signal may be a positive slope value, while the next input signal may be a negative slope value.

In another embodiment, the slope values vary between input signals of the plurality of input signals. That is, the absolute value of slope values between input signals can vary and be different.

At 1420, the present embodiment, accumulates the plurality of input signals through at least two accumulation stages to generate a standard curve. In particular, in one embodiment, the standard curve that is generated is non-linear. The standard curve is used by a spread spectrum modulation loop to generate a P-sequence of values that consists of feedback loop divider information.

In one embodiment, the present embodiment, accumulates the plurality of input signals through at least two accumulation stages that are communicatively coupled in series. In particular, at each of the accumulation stages, the accumulation stage receives an input from either the plurality of input signals, or from a previous accumulation stage.

Thereafter, the input is summed with a previously summed value of received inputs to generate a current summed value of received inputs. As such, with each additional input of a sequence that is received, the present embodiment accumulates the input along with a previously summed value of inputs, in order to generate a current summed value. The current summed value comprises an output that can be used as the standard curve or as another input for a following accumulation stage.

In addition, the present embodiment, stores the current summed value of received inputs for use in calculating future summed values. For instance, the current summed value is used fed back in the next cycle to be summed with the next input that is received by the corresponding accumulator.

In another embodiment, the output from the two or more accumulators coupled in series is summed with a linear curve that is generated from a single accumulator. That is, the present embodiment, sums a non-linear curve generated from the accumulators coupled in series with a linear curve from the single accumulator in order to generate the standard curve that is also non-linear.

At 1430, the present embodiment modulates the standard curve to generate a spread spectrum frequency profile. More particularly, the present embodiment, modulates the standard curve to generate the P-sequence. The P-sequence is used by a feedback divider of a phase-locked loop for generating the spread spectrum frequency profile, as previously described in relation to FIGS. 13A, 13B, and 13C.

In still another embodiment, load conditions are asserted in the accumulation stages. Specifically, the asserted load conditions shape the output curve to generate a desired standard curve. The load conditions are independently asserted at each of the accumulation stages, in one embodiment.

Spread Spectrum Frequency Synthesizer with Improved Frequency Shape for Spread Spectrum Modulation Accordingly, embodiments of the present invention provide for the generation of improved frequency profiles by adjusting the length of a standard curve used to modulate an input signal when performing spread spectrum modulation. The term "length of a standard curve" is the number of points used in one modulation cycle, a convention from look-up table style modulation where length of a standard curve usually refers to number of points in one standard curve cycle.

Figure 16:
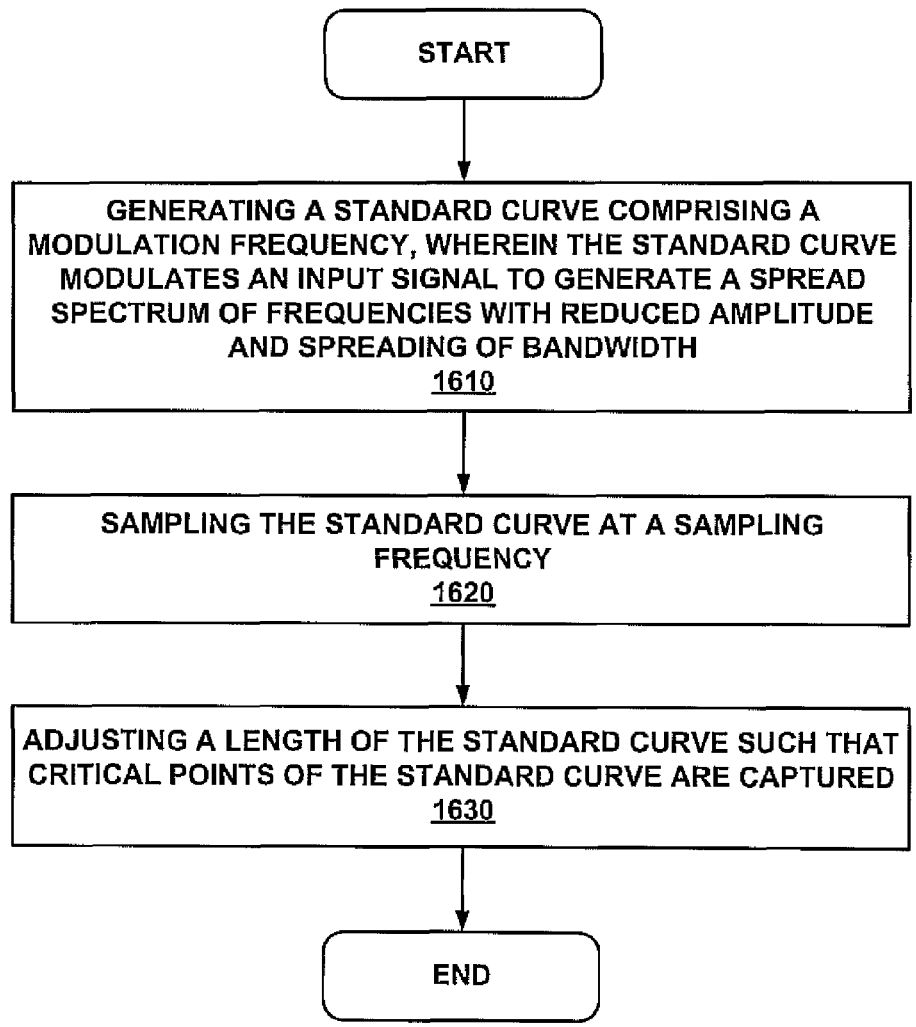
FIG. 16 is a flow diagram illustrating steps in a computer implemented method for modulating a standard curve in a spread spectrum modulator such that peaks of the standard curve are captured, in accordance with one embodiment of the present invention.
Figure 17:
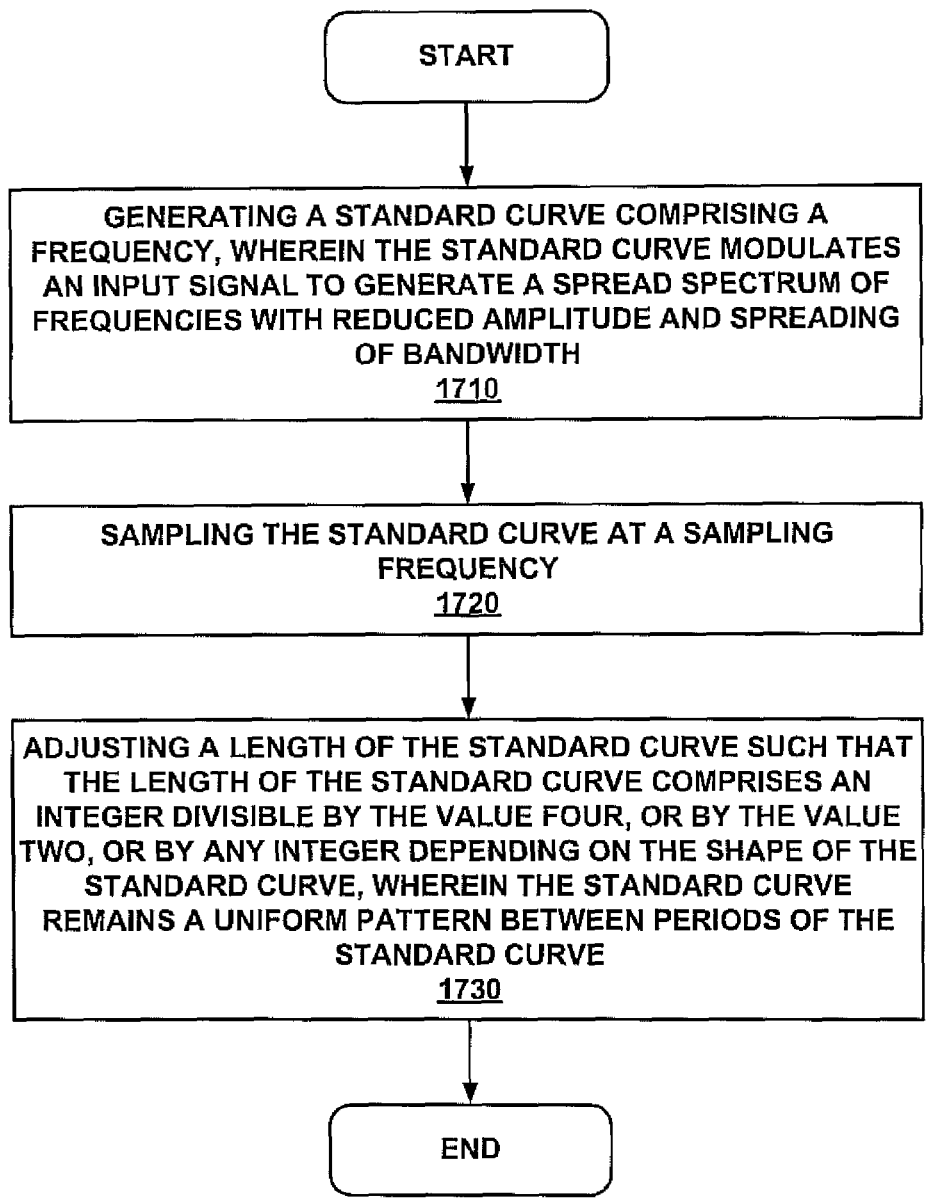
FIG. 17 is a flow diagram illustrating steps in a computer implemented method for modulating a standard curve in a spread spectrum modulator such that a length of the standard curve comprises an integer that captures peaks of the standard curve depending on the shape of the standard curve, in accordance with one embodiment of the present invention.

FIGS. 16 and 17 in combination with the previously discussed Figures, and in particular, FIGS. 1A, 1B, 1C, 2, 3A, 3B, 11A and 11B illustrate embodiments of the present invention in which a length of a standard curve is manipulated in such a manner to improve the frequency shape of the standard curve when performing spread spectrum modulation. In particular, FIGS. 16 and 17 are flow charts illustrating steps in computer implemented methods for adjusting the length of the standard curve to provide for improved EMI reduction when performing spread spectrum modulation.

Referring now to FIG. 16, a flow diagram 1600 is shown illustrating steps in a computer implemented method for sampling a standard curve in a spread spectrum modulator such that critical points of the standard curve are captured, in accordance with one embodiment of the present invention.

At 1610, a standard curve is generated. In one embodiment, the standard curve is determined by software from a function. The software generates values representing the standard curve for inclusion into a look-up table, for example. In another embodiment, the standard curve is generated by hardware. That is, values representing the standard is determined through combinational logic for inclusion. For instance, FIGS. 11A, 11B, 12A, 12B, 13A, 13B, 13C, 13D, 14, and 15 and their corresponding discussions provide means for generating the standard curve. The standard curve is associated with a frequency or period defining a shape of the standard curve. This frequency or period becomes a modulation frequency or period when modulating the VCO frequency.

In one embodiment, the standard curve is repeatable with a shape that is repeatable every four phases of equal length. For instance, the standard curve is a non-linear curve (e.g., a Hershey Kiss curve in FIG. 15 with four phases points A to B, points B to C, points C to D, and points D to E of equal length). In another embodiment, the standard curve is repeatable with a shape that is repeatable every two phases. For instance, the standard curve is a linear (e.g., triangular) curve. In other embodiments, the standard curve has an average value of zero. In still other embodiments, the standard curve is periodic. In other embodiments, the standard curve is non-periodic, or random.

The standard curve is analogous to the input modulation signal MS305 in FIG. 3B, in one embodiment. Additionally, the standard curve is analogous to the standard curve that is output from the accumulator 1120, and input to the spread spectrum modulation loop 1130 of FIGS. 11A and 11B. It is appreciated that the input modulation signal or standard curve can have a variety of different configurations, including standard and/or non-standard schemes (e.g., patterns, curves, etc.). As such, the standard curve modulates an input signal (e.g., input clock signal generated by the oscillator 211) to generate a spread spectrum of frequencies with reduced amplitude and spreading of bandwidth, in accordance with one embodiment of the present invention.

At 1620, the present embodiment samples the standard curve at a sampling frequency. In other words, the standard curve is modulated for use in the spread spectrum frequency modulator of embodiments of the present invention. In particular, in one embodiment, the standard curve is sampled at a sampling frequency that comprises a frequency of a phase frequency detector (PFD) in a PLL loop of the spread spectrum frequency modulator. In another embodiment, the standard curve is sampled at a sampling frequency that comprises a frequency of a P-counter in a PLL loop of the spread spectrum frequency modulator. As such, as shown in FIG. 1B, the frequency of the PFD 221 is analogous to the sample rate, or the modulation frequency of the standard curve. Furthermore, as shown in FIGS. 11A and 11B, the frequency of the PFD 221 is equal to the frequency of the voltage controlled oscillator ($f_{VCO}$) divided by the feedback loop divide value (also referred to as "P") within the feedback loop divider 224 of FIG. 1B.

At 1630, the present embodiment adjusts a length of the standard curve such that critical points of the standard curve are captured. The length defines the number of points of the standard curve that are sampled in one modulation cycle. In one embodiment, the length is an integer value. In another embodiment, the length is determined by dividing the sampling frequency ($f_{sampling}$) by the modulation frequency ($f_m$), as described in Equation 1:

$$l = f_{sampling}/f_m \quad (1)$$

As shown in Equation 1, the length (l) can be adjusted by adjusting the frequency variables. In one embodiment, the length of the standard curve is adjusted by adjusting the modulation frequency ($f_m$) of the standard curve. In another embodiment, the length of the standard curve is adjusted by adjusting the sampling frequency ($f_{sampling}$). In still another embodiment, the length of the standard curve is adjusted by adjusting the modulation frequency ($f_m$) and the sampling frequency ($f_{sampling}$). In embodiments of the present invention, the length (l) is determined to be an integer divisible by a value two, or value four, or by any integer, as will be described below.

Figure 18A:
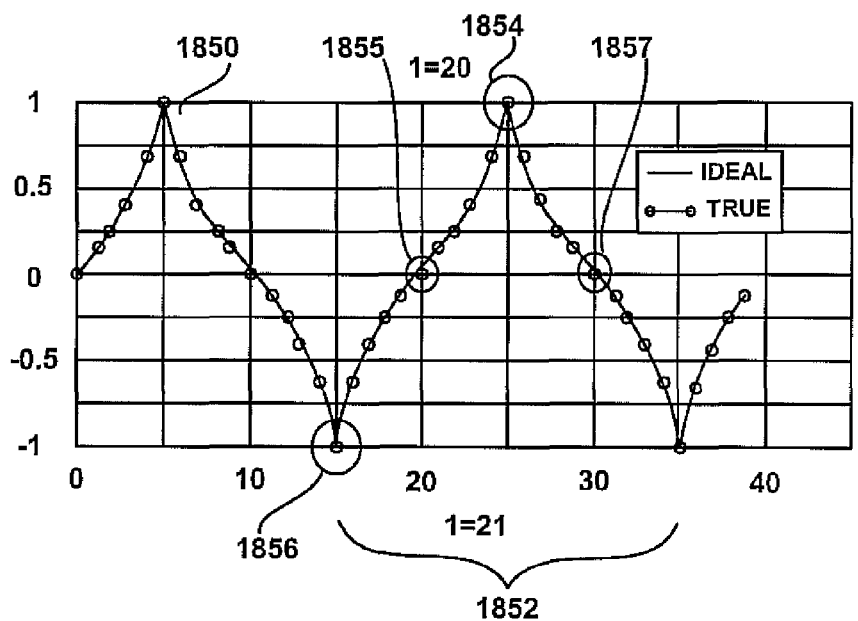
FIG. 18A is a graph illustrating the manipulation of the length of the standard curve in order to improve EMI reduction, where the length is 20, in accordance with one embodiment of the present invention.

In each of these embodiments, the goal is to determine a length (l) that captures the critical points of the standard curve, in embodiments of the present invention. In accordance with one embodiment of the present invention, the length of the standard curve is adjusted such that the length comprises an integer divisible by a value of four, when the standard curve comprises a non-linear curve, whose shape is repeatable every four phases, as is shown in FIG. 18A. In another embodiment, the length of the standard curve is adjusted such that the length comprises an integer divisible by a value of two, when the standard curve comprises a linear curve, whose shape is repeatable every two phases.

FIG. 18A is a graph illustrating an example length of a standard curve that is used for spread spectrum modulation with improved EMI performance. As shown, FIG. 18A is a graph illustrating the proper sampling of the non-linear standard curve, in accordance with one embodiment of the present invention. The example of FIG. 18A is shown to illustrate the capture of critical points in a standard curve. While the embodiment of the present invention as shown in FIG. 18A is directed to the adjusting of the length of a non-linear standard curve, other embodiments of the present invention are well suited to adjusting the length of a linear standard curve to capture critical points. That is, the critical points shown in FIG. 18A are illustrative of critical points for a non-linear curve and a linear curve, in embodiments of the present invention.

As shown in FIG. 18A, the horizontal axis represents an index indicating the sampled points of the standard curve. The vertical axis indicates the normalized y value of the standard curve, between −1 and +1. As described before in relation to FIGS. 11A and 11B, the y value can be the current value of generated by the accumulator 1120 and forms part of the standard curve that is sent to the spread spectrum modulation loop 1130, in one embodiment. As such, the plurality of y values generates the standard curve.

In FIG. 1800A, the standard curve 1850 is represented by the solid line. Sample points of the standard curve 1850 are represented by open-circles. Because of the proper length selected, critical points of the standard curve 1850 are captured, thereby giving a true representation of the standard curve 1850. As shown in FIG. 18A, the length of the standard curve 1850 is shown, wherein l=20. In accordance with embodiments of the present invention, the length of a standard curve that is non linear (e.g., standard curve 1850) is divisible by a value of four. As such, with a length, l=20, the standard curve 1850 is sampled twenty times over a period 1852.

In particular, in one embodiment, peaks of the standard curve are captured. For instance, isolation area 1854 and 1856 show peaks of the ideal standard curve 1850 which are captured. Also, in another embodiment, zero cross-over points of the standard curve are captured. For instance, isolation areas 1855 and 1857 show open-circles representing zero cross-over points that are captured. This results in proper shaping of the ideal standard curve 1850 and improved performance of EMI reduction.

Figure 18B:
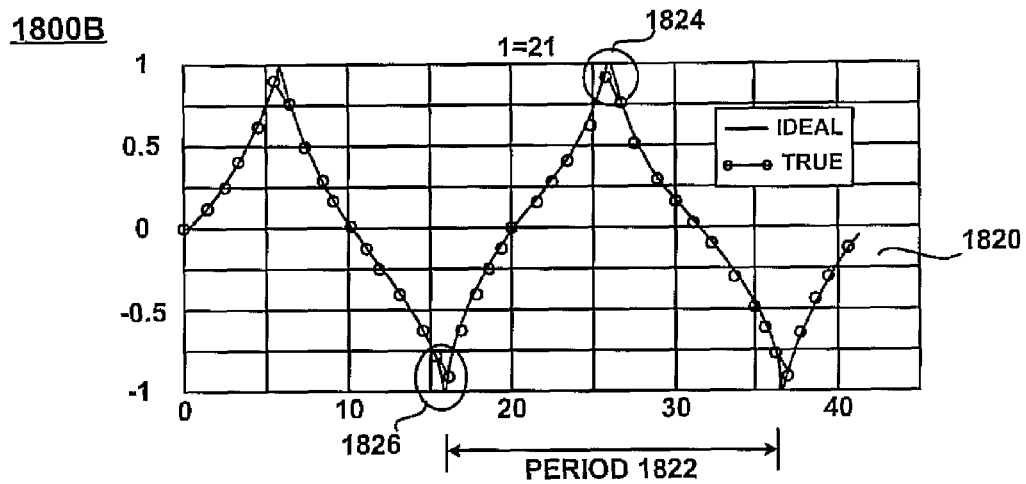
FIG. 18B is a graph illustrating the poor sampling of the standard curve during modulation when the length is 21, in accordance with one embodiment of the present invention.
Figure 18C:
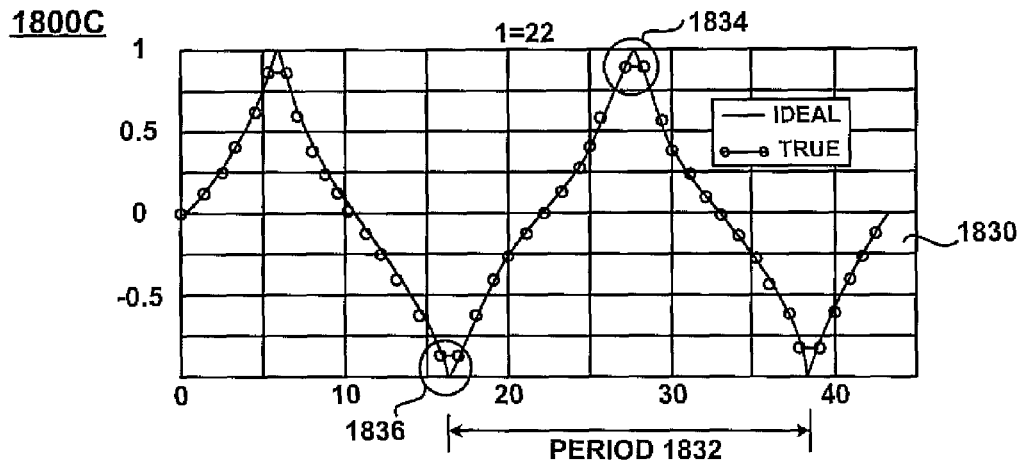
FIG. 18C is a graph illustrating the poor sampling of the standard curve during modulation when the length is 22, in accordance with one embodiment of the present invention.
Figure 18D:
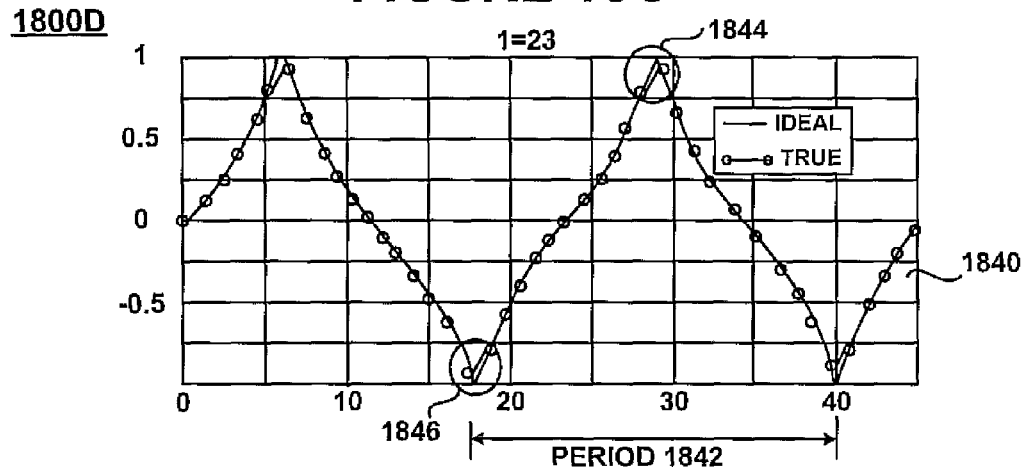
FIG. 18D is a graph illustrating the poor sampling of the standard curve during modulation when the length is 23, in accordance with one embodiment of the present invention.
Figure 18E:
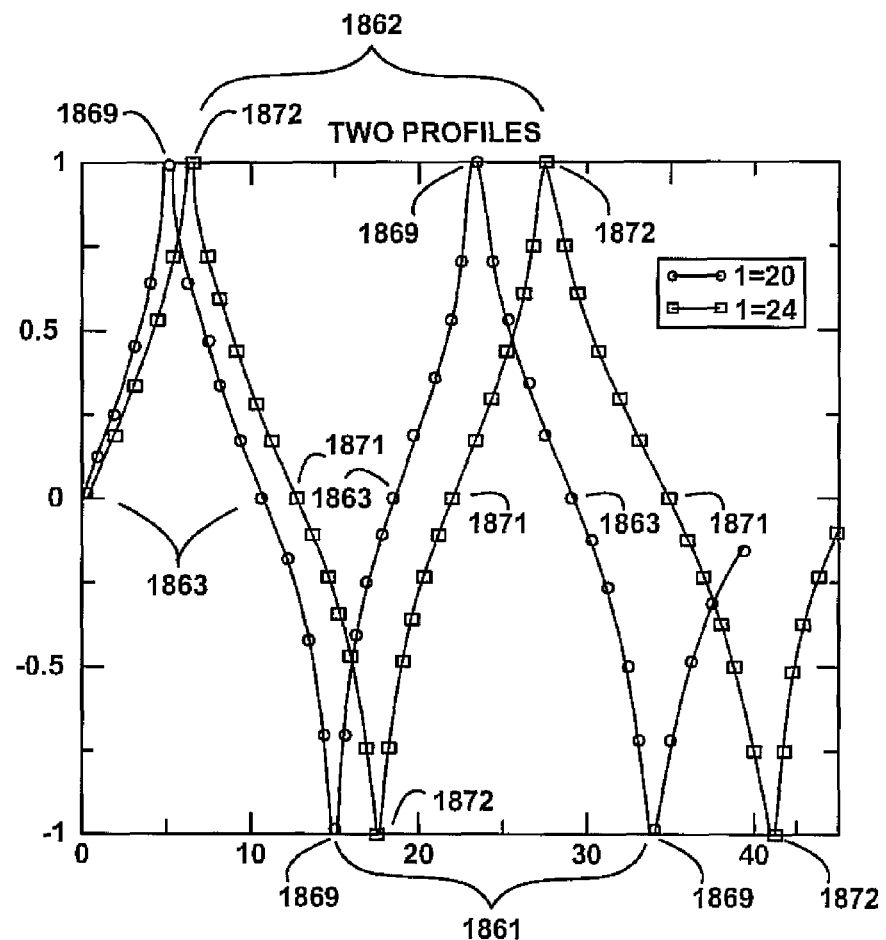
FIG. 18E is a graph illustrating the manipulation of the length of the standard curve, where the length is 20 and 24, in accordance with one embodiment of the present invention.

FIG. 18E shows proper selection of the length for a non-linear curve. As previously described, for a non-linear curve of four phases, the length should achieve a ratio between the sampling frequency ($f_{sampling}$) and the modulation frequency ($f_m$) that is divisible by a value of four, in accordance with one embodiment of the present invention. As shown in FIG. 18E, two lengths are shown for a standard curve (e.g., standard curve 1850), wherein the lengths are able to capture the critical points in the standard curve. For example, the length, l=20, and the length, l=24, both capture the critical points (e.g., zero cross-over and peak points).

In particular, in accordance with embodiments, of the present invention, the length of the non-linear standard curve (e.g., standard curve 1850) is divisible by a value of four. As such, the plot of open-circles represents the sampling of the standard curve when l=20. As such, with a length, l=20, the standard curve is sampled twenty times over a period 1861. As shown in FIG. 18E, the critical zero cross-over points (e.g., points 1863) and peak points (points 1864) are captured when l=20. In addition, the plot of open-squares represents the sampling of the standard curve when l=24. As such, with a length, l=24, the standard curve is sampled twenty-four times over a period 1862. As shown in FIG. 18E, the critical zero cross-over points (e.g., points 1871) and the peak points (e.g., points 1872) are captured when l=24.

On the other hand, in one technology, the length of the modulation frequency as used in spread spectrum control pattern generation is decided by performing an integer round up of the length based on the modulation frequency. This technique can result in the missing of critical sample points in the standard curve.

For instance, this technique for determining length can result in point missing of the standard shape. In particular, FIGS. 18B, 18C, and 18D are graphs illustrating the poor sampling of the standard curve during modulation. In each of the FIGS. 18B, 18C, and 18D, improper lengths are implemented for the modulation frequency of the standard curve, resulting in poor sampling of the standard curve. It is worse when the length is relatively small. This results in poor modulation of the spread spectrum of the input signal and poor EMI performance of the spread spectrum frequency modulator.

For example, FIG. 18B is a graph illustrating the poor sampling of the standard curve during modulation when the length is 21, in accordance with one embodiment of the present invention. As shown in FIG. 18B, the horizontal axis represents an index indicating the sampled points of the standard curve. The vertical axis indicates the normalized y value of the standard curve, between −1 and +1. As described before in relation to FIGS. 11A and 11B, the y value can be the current value of generated by the accumulator 1120 and forms part of the standard curve that is sent to the spread spectrum modulation loop 1130, in one embodiment. As such, the plurality of y values generates the standard curve.

As shown in FIG. 1800B, the ideal curve of the standard curve 1820 is shown by the solid line. The length of the ideal standard curve 1820 is shown, where l=21 for sampling. The length of the ideal standard curve 1820 is associated with the modulation frequency or sampling rate of the ideal standard curve 1820. As such, with a length of 21, the ideal standard curve 1820 is sampled twenty-one times over a period 1822 of the ideal standard curve 1820.

The actual or true standard curve is represented by the open circles at selected points. Because of the improper length selected, the shape of the true standard curve does not match that of the ideal standard curve 1820. For instance, isolation areas 1824 and 1826 show peaks of the ideal standard curve 1820 which are not captured by the true standard curve. This results in poor shaping of the ideal standard curve and poor performance of EMI reduction.

This problem of point missing of the ideal standard curve is also shown for various values of the length. For example, FIG. 18C is a graph illustrating the poor sampling of the standard curve during modulation when the length is 22. As shown in FIG. 18C, the ideal standard curve 1830 is shown by the solid line. The true standard curve is represented by the plot connected by the open-circles. As such, with a length of 22, the ideal standard curve is sampled twenty-two times over a period 1832 of the ideal standard curve. Because of the improper length selected, the shape of the true standard curve does not match that of the ideal standard curve 1830. For instance, isolation areas 1834 and 1836 show peaks of the ideal standard curve 1830 which are not captured by the true standard curve. This results in poor shaping of the ideal standard curve and poor performance of EMI reduction.

Additionally, FIG. 18D is a graph illustrating the poor sampling of the standard curve during modulation when the length is 23. As shown in FIG. 18D, the ideal standard curve 1840 is shown by the solid line. The true standard curve is represented by the plot connected by the open-circles. As such, with a length of 23, the ideal standard curve 1840 is sampled twenty-three times over a period 1842 of the ideal standard curve 1840. Because of the improper length selected, the shape of the true standard curve does not match that of the ideal standard curve 1840. For instance, isolation areas 1844 and 1846 show peaks of the ideal standard curve 1840 which are not captured by the true standard curve. This results in poor shaping of the ideal standard curve and poor performance of EMI reduction.

FIG. 17 is a flow diagram illustrating steps in a computer implemented method for sampling a standard curve in a spread spectrum modulator such that critical points of the standard curve are captured, in accordance with one embodiment of the present invention.

At 1710, the present embodiment generates a standard curve. The standard curve is associated with a modulation frequency defining a shape of the standard curve. In embodiments of the present invention, the standard curve is linear or non-linear. As described previously, the standard curve is analogous to the input modulation signal MS305 in FIG. 3B. Additionally, the standard curve is analogous to the standard curve that is output from the accumulator 1120, and input to the spread spectrum modulation loop 1130 of FIGS. 11A and 11B. It is appreciated that the input modulation signal or standard curve can have a variety of different configurations, including standard and/or non-standard schemes (e.g., patterns, curves, etc.), as described previously. As such, the standard curve modulates an input signal (e.g., input clock signal generated by the oscillator 211) to generate a spread spectrum of frequencies with reduced amplitude and spreading of bandwidth, in accordance with one embodiment of the present invention.

In one embodiment, a target modulation frequency is determined for modulating the standard curve. The target modulation frequency typically is found within a range of frequencies. In one embodiment, the target modulation frequency is determined by the manufacturer.

At 1720, the present embodiment samples the standard curve at a sampling frequency. In other words, the standard curve is modulated for use in the spread spectrum frequency modulator of embodiments of the present invention. In particular, in one embodiment, the standard curve is sampled at a sampling frequency that comprises a frequency of a phase frequency detector (PFD) in a PLL loop of the spread spectrum frequency modulator, as previously described. In another embodiment, the standard curve is sampled at a sampling frequency that comprises a frequency of a P-counter in a PLL loop of the spread spectrum frequency modulator, as previously described. As such, as shown in FIG. 1B, the frequency of the PFD 221 is analogous to the sample rate.

At 1730, the present embodiment adjusts a length of the standard curve such that critical points of the standard curve are captured. In particular, the length is adjusted, such that the length comprises an integer divisible by the value two, four or any other integer number, without remainder, depending on the shape of the standard curve. After adjusting the length, the sampled representation of the standard curve remains in a uniform pattern between periods, in one embodiment. In another embodiment, the length, as an integer, is adjusted to be divisible by the value of four when the standard curve comprises a non-linear curve of four equal length phases. In another embodiment, the length, as an integer, is adjusted to be divisible by two when the standard curve comprises a linear curve.

For example, in one case, one or more identical natural periods of the standard curve are combined to define a combined period of the standard curve. That is, the frequency shape of each of the one or more natural periods is identical. As such, the length of the combined period is divisible by any integer, in one embodiment. In another example, one or more non-identical natural periods are combined to define a combined period of the standard curve. That is, the frequency shape of each of the one or more natural periods is not identical. As such, the spread amount for each natural period of the standard curve is different. Again, the length of the combined period is divisible by any integer, in one embodiment. In a concrete example, the combined period comprises two natural periods including 8 phases. As such, the length comprises an integer divisible by the value of eight, without remainder, since there are 8 phases in the cycle or combined period.

In particular, as described previously, the length (l) is determined by dividing the sampling frequency by the frequency of the standard curve. As such, the length (l) can be adjusted by adjusting either or both of the modulation frequency ($f_m$) or the sampling frequency ($f_{sampling}$). For instance, the modulation frequency can be adjusted by rounding up or rounding down the target modulation frequency, in accordance with embodiments of the present invention.

In one embodiment, the standard curve is repeatable with a shape that is repeatable every four phases. For instance, the standard curve is a non-linear curve (e.g., a Hershey Kiss curve). The standard curve has an average value of zero. Examples of non-linear curves are provided in FIGS. 18A-D. As such, at 1730, the present embodiment determines a length that comprises an integer divisible by the value of four, without remainder, since there are four non-repeatable phases in the cycle.

In another embodiment, the standard curve is repeatable with a shape that is repeatable every two phases. For instance, the standard curve is a linear (e.g., triangular) curve. The standard curve has an average value of zero. As such, at 1730, the present embodiment determines a length that comprises an integer divisible by the value of two, without remainder, since there are two repeatable phases in a cycle.

Spread Spectrum Frequency Synthesizer with Improved Frequency Shape by Adjusting a Shape of a Standard Signal Used for Spread Spectrum Modulation Accordingly, embodiments of the present invention provide for the generation of improved frequency profiles by adjusting the shape of a standard curve when performing spread spectrum modulation.

FIGS. 19A, 19B, 19C, 20A, and 20B in combination with the previously discussed figures, and in particular, FIGS. 1A, 1B, 1C, 2, 3A, 3B, 11A and 11B illustrate embodiments of the present invention in which a standard curve is altered in such a manner to improve the frequency shape of the standard curve when performing spread spectrum modulation.

Figure 19A:
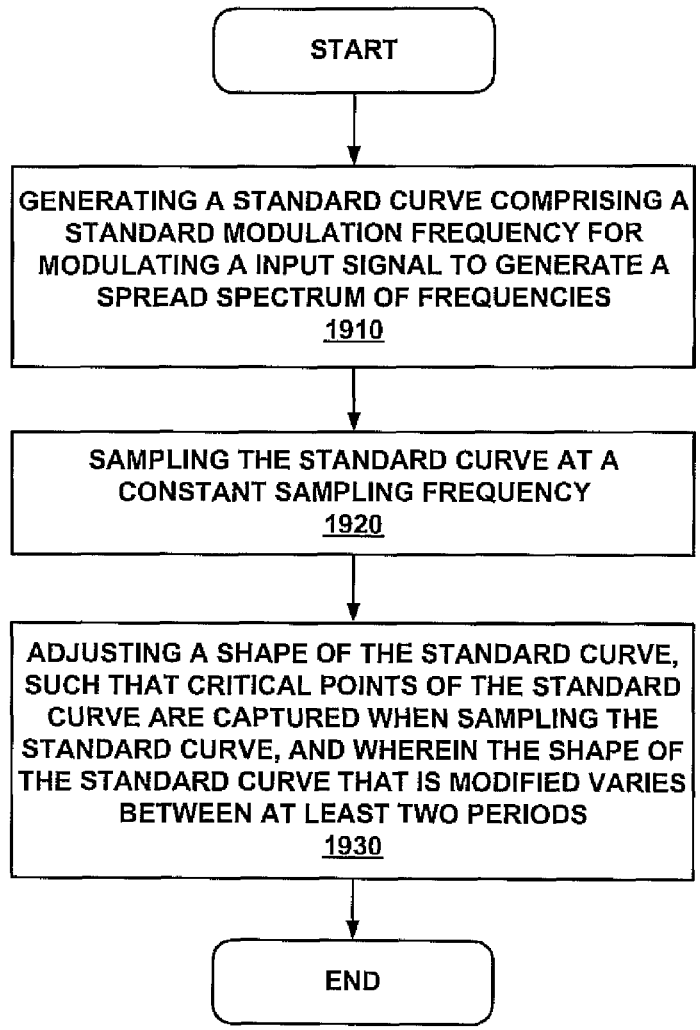
FIG. 19A is a flow diagram illustrating a computer implemented method for adjusting a shape of a standard curve in a spread spectrum modulator, in accordance with one embodiment of the present invention.

Referring now to FIG. 19A, a flow diagram 1900A is shown illustrating steps in a computer implemented method for sampling a curve, in accordance with one embodiment of the present invention. Specifically, the method of flow diagram 1900A adjusts a shape of a standard curve in a spread spectrum modulator such that critical points are captured when sampling the standard curve, in accordance with one embodiment of the present invention. The standard curve is adjusted such that critical points (peaks, zero-cross-over points, etc.) of the standard curve are captured when sampling the standard curve, in accordance with one embodiment of the present invention.

Previously, in some methods, some lengths that are associated with the standard curve can result in poor sampling of the standard curve. This is especially true when the modulation frequency of the standard curve is predetermined and substantially unvarying by design. For example, a modulation frequency is required to be 31.5 kHz by one manufacture. As such, with a pre-selected modulation frequency and a constant sampling frequency, the associated length defining sampled points is also relatively constant.

For example, as previously discussed, FIGS. 18B, 18C, and 18D each illustrate the poor sampling of the standard curve for various lengths. In particular, for a particular modulation frequency, the sample rate of the standard curve may not capture peaks and zero-cross-over points of the standard curve. In a concrete example, a frequency profile of the standard curve can be associated with a standard length of 23 of FIG. 18D. That is, for a given target modulation frequency, the standard length over a cycle of the standard curve is equal to 23. However, as shown in 18D, improper sampling of the standard curve occurs with a target modulation frequency that gives a length of 23. In particular, critical points at the peaks of the standard curve may be missed when sampling the standard curve. For instance, isolation areas 1844 and 1846 show peaks of the ideal standard curve 1840 which are not captured when sampling the ideal standard curve 1840. This results in poor shaping of the ideal standard curve and poor performance of EMI reduction.

However, in embodiments of the present invention, by altering the frequency shape (e.g., slopes, periods, and correspondingly frequencies) within at least one cycle of the standard curve, critical points are captured when sampling the standard curve.

At 1910, the present embodiment generates a standard curve. In one embodiment, the standard curve is determined by software from a function. The software generates values representing the standard curve for inclusion into a look-up table, for example. In another embodiment, the standard curve is generated by hardware. That is, values representing the standard curve are determined through combinational logic for inclusion. For instance, FIGS. 11A, 11B, 12A, 12B, 13A, 13B, 13C, 13D, 14, and 15 and their corresponding discussions provide means for generating the standard curve. The standard curve is associated with a frequency or period defining a shape of the standard curve. This frequency or period becomes a modulation frequency or period when modulating the VCO frequency. The standard curve is used for modulating an input signal to generate a spread spectrum of frequencies. In one embodiment, the unaltered standard curve is repeatable with a shape that is repeatable every four phases of equal length, in a four phase cycle or period of the standard curve. For instance, the standard curve is a non-linear curve (e.g., a Hershey Kiss curve). In another embodiment, the standard curve is repeatable with a shape that is repeatable every two phases of equal length, in a period of the standard curve. For instance, the standard curve is a linear (e.g., triangular) curve. In still other embodiments, the standard curve comprises a non-repeatable and non-linear curve. In other embodiments, the standard curve has an average value of zero.

The standard curve is analogous to the input modulation signal MS305 in FIG. 3B. Additionally, the standard curve is analogous to the standard curve that is output from the accumulator 1120, and input to the spread spectrum modulation loop 1130 of FIGS. 11A and 11B. It is appreciated that the input modulation signal or standard curve can have a variety of different configurations, including standard and/or non-standard schemes (e.g., patterns, curves, etc.). As such, the standard curve modulates an input signal (e.g., input clock signal generated by the oscillator 211) to generate a spread spectrum of frequencies with reduced amplitude and spreading of bandwidth, in accordance with one embodiment of the present invention.

At 1920, the present embodiment samples the standard curve at a constant sampling frequency. In other words, the sampling frequency sets the rate at which the standard curve is sampled. In one embodiment, the sampling frequency comprises a frequency of a P-counter in a PLL loop of the spread spectrum frequency modulator. Furthermore, as shown in FIGS. 11A and 11B, the frequency of the PFD 221 is equal to the frequency of the voltage controlled oscillator ($f_{VCO}$) divided by the feedback loop divide value (also referred to as "P") within the feedback loop divider 224 of FIG. 1B.

At 1930, the present embodiment adjusts a shape of the standard curve, such that critical points of the standard curve are captured when sampling the standard curve. In particular, the shape of the standard curve that is altered varies between at least two periods. That is, the shape of one period of the standard curve that is altered is different than the shape of another period of the standard curve that is altered. However, in one embodiment, the standard curve that is altered, is repeatable over one or more cycles.

In particular, the standard curve is altered in order to capture critical points when sampling the altered standard curve. As described previously with regards to FIG. 18A, sampled points of the altered standard curve is defined by length. That is, the length of the sampling rate is defined by dividing the sampling frequency of the standard curve by the modulation frequency, as previously shown in Equation 1.

In particular, at least one portion of the standard curve is modified such that the length in that portion is altered. In that manner, critical points in the standard curve for that particular portion are captured when sampling the standard curve, in accordance with one embodiment of the present invention. For instance, in one embodiment the standard curve is altered by stretching or shrinking the length of the standard curve in that portion so that peaks of the standard curve are captured. In another embodiment, the standard curve is altered by stretching or shrinking the length of the standard curve in that portion so that zero cross-over points of the standard curve are captured.

In accordance with one embodiment of the present invention, the average length is constant. That is, while the standard curve is altered to capture critical points, the average number of sampled points of a period of the standard curve that is altered remains a constant over one or more periods. As such, embodiments of the present invention provide for the proper adjustment of the shape of the standard curve in order to sample critical points.

Figure 19B:
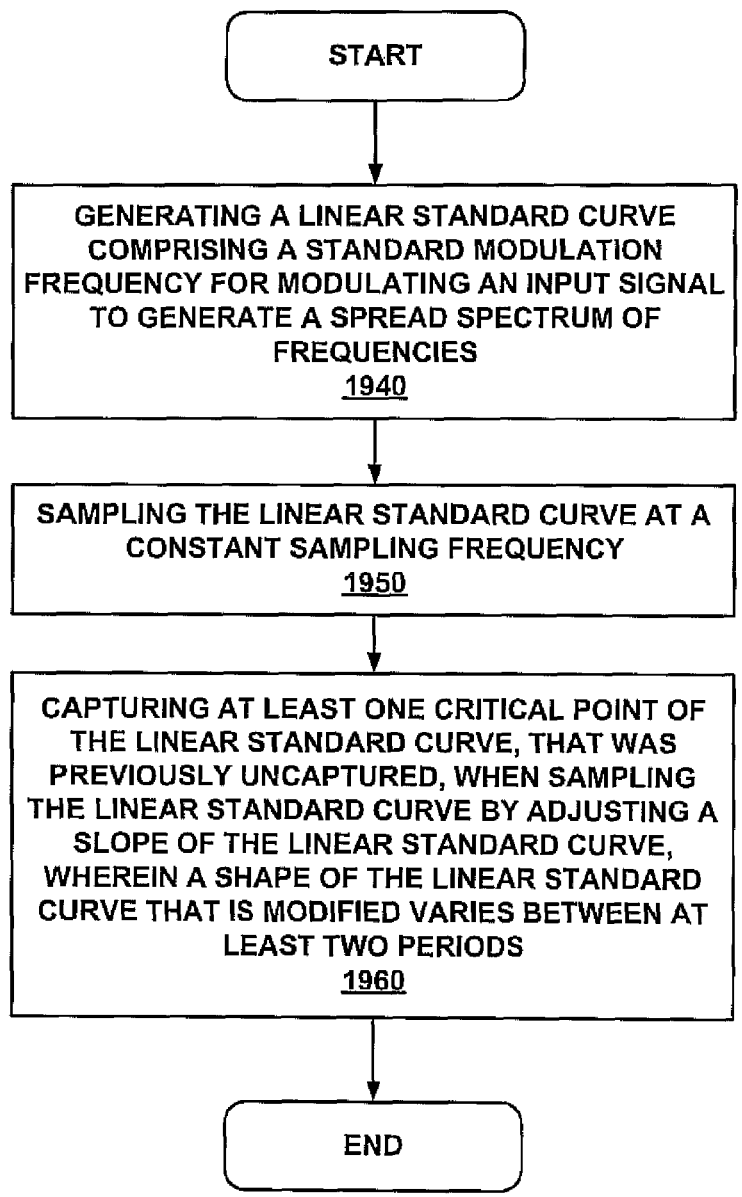
FIG. 19B is a flow diagram 1900B illustrating a computer implemented method for sampling a linear curve, in accordance with one embodiment of the present invention.

FIG. 19B is a flow diagram 1900B illustrating a computer implemented method for sampling a linear curve, in accordance with one embodiment of the present invention. Specifically, the method of flow diagram 1900B adjusts a slope of the linear standard curve in a spread spectrum modulator, such that critical points are captured when sampling the standard curve that this altered, in accordance with one embodiment of the present invention.

At 1940, the present embodiment generates a linear standard curve. For instance, FIGS. 11A, 11B, 12A, 12B, 13A, 13B, 13C, 13D, 14, and 15 and their corresponding discussions provide means for generating the standard curve. The standard curve is associated with a standard modulation frequency defining the shape of the standard curve. In addition, the standard curve is used for modulating an input signal to generate a spread spectrum of frequencies. In the present embodiment, the standard curve is a linear standard curve. That is, the linear standard curve (e.g., triangular) is repeatable every two phases in a period of the standard curve.

At 1950, the present embodiment samples the linear standard curve at a constant sampling frequency. In other words, the sampling frequency sets the rate at which the standard curve is sampled. In one embodiment, the operation performed at 1950 is analogous to the operation performed at 1920, and as such, the description provided in the discussion of 1920 of flow diagram 1900A is not repeated.

At 1960, the present embodiment captures at least one critical point of the linear standard curve that was previously uncaptured. That is, when sampling the linear standard curve, critical points of the linear standard curve are captured. Specifically, the at least one critical point is captured by adjusting a slope of the linear standard curve. More particularly, the shape of the linear standard curve varies between at least two periods. However, in one embodiment, the standard curve that is altered is repeatable over one or more cycles.

In one embodiment, the at least one critical point is captured by modifying the slope for one phase of a period of the linear standard curve. More specifically, the shape of the standard curve is adjusted such that the slope for one phase of a period of the linear standard curve is altered from the standard slope associated with the standard modulation frequency.

In particular, any deviation of the slope, or correspondingly the frequency, in any portion of one or more periods of the standard curve is implemented to capture critical points when sampling the standard curve, in accordance with embodiments of the present invention.

Figure 20A:
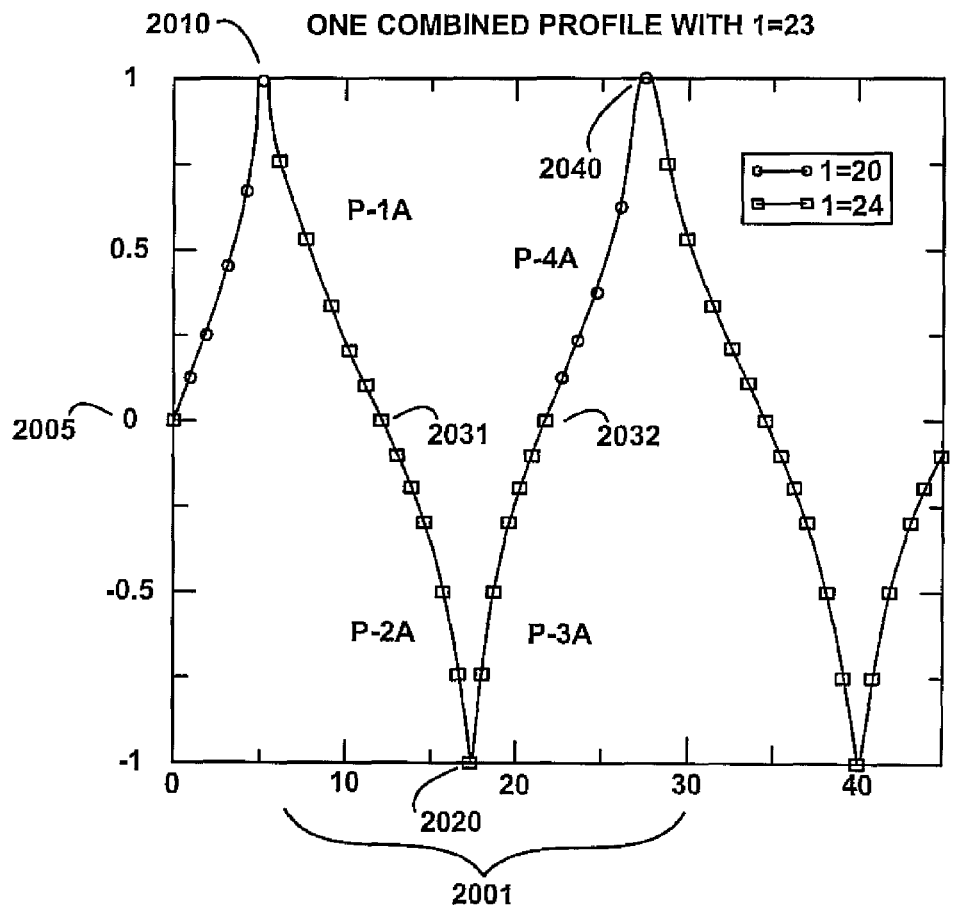
FIG. 20A is a graph illustrating the manipulation of periods within a non-linear standard curve in order to improve EMI reduction, in accordance with one embodiment of the present invention.
Figure 20B:
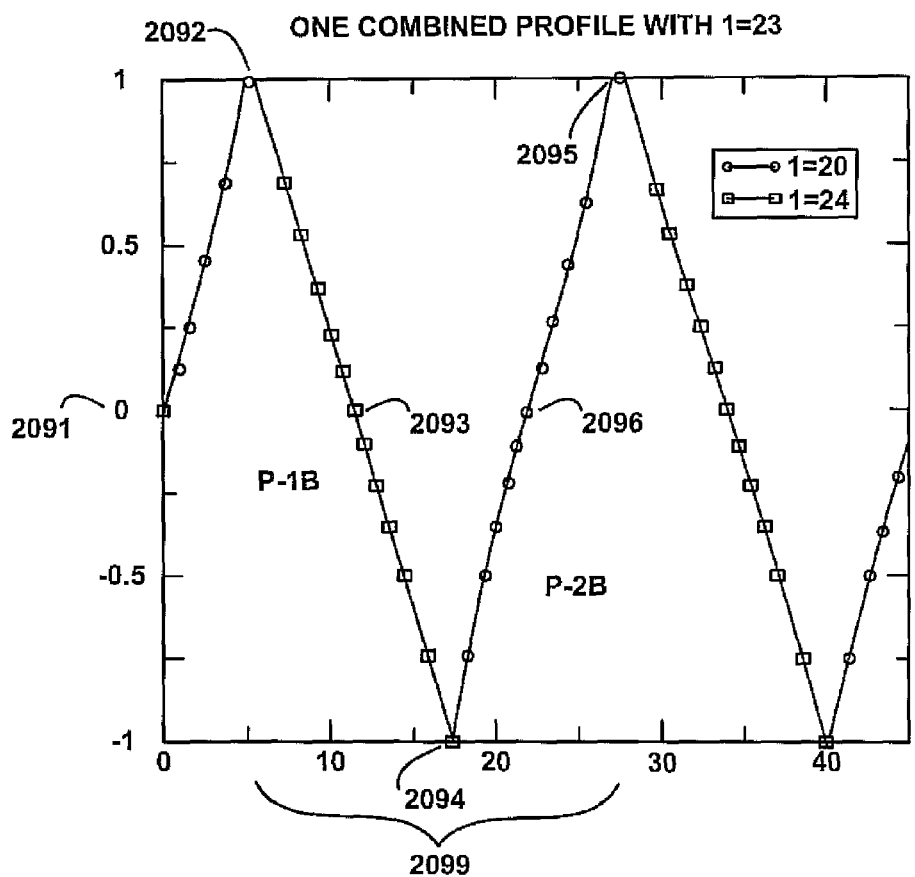
FIG. 20B is a graph illustrating the manipulation of periods within a linear standard curve in order to improve EMI reduction, in accordance with one embodiment of the present invention.

For instance, FIG. 20B is a graph illustrating the manipulation of the standard curve in order to improve EMI reduction. In other words, FIG. 20B is a graph illustrating the proper sampling of the linear standard curve, in accordance with one embodiment of the present invention. Specifically, the slope is adjusted in one phase of the linear standard curve in FIG. 20B.

As shown in FIG. 20B, the horizontal axis represents an index indicating the sampled points of the standard curve. The vertical axis indicates the normalized y value of the standard curve between −1 and +1. As described before in relation to FIGS. 11A and 11B, the y value can be the current value generated by the accumulator 1120 and forms part of the standard curve that is sent to the spread spectrum modulation loop 1130, in accordance with one embodiment of the present invention. As such, the plurality of y values generates the standard curve.

As shown in FIG. 2000B, the combined frequency profiles of the standard curve is associated with a length of twenty-three, where l=23. In other words, the average length of the altered standard curve is substantially equal to the standard length defined by dividing the standard modulation frequency by the sampling frequency, as provided in previously described Equation 1. That is, the standard curve is sampled at 23 points in one period of the standard curve. Previously, without any adjusting of the slope of the linear standard curve, critical points re not captured. However, in embodiments of the present invention, by altering the slope of the standard curve, critical points are captured.

In particular, the multi-phase standard curve comprises two phases in one period 2099 of the altered linear standard curve: phase P-1B and phase P-2B. Period 2099 begins at, but does not include, point 2092. Period 2099 ends at, and includes, point 2095.

Specifically, phase P-1B includes all points between points 2092 to 2094, to include point 2094. Phase P-1B includes critical point, zero cross-over point 2093 and critical point, peak 2094. Phase P-1B is sampled twelve times, and is associated with a length, where l=24. That is, phase P-1B is set to a first slope, where the length is defined by l=24. Phase P-1B is represented by the line connected by the open squares.

Correspondingly, phase P-2B includes all points between points 2094 to 2095, to include point 2095. Phase P-2B includes critical point, zero cross-over point 2096 and critical point, peak 2095. Phase-P-2B is sampled eleven times, and is associated with a length, where l=22. That is, phase P-2B is set to a second slope, where the length is defined by l=22. Phase P-2B is represented by the line connected by the open circles.

As shown in FIG. 20B, the critical points (e.g., peaks and zero cross-over points) of the standard curve are captured. This is accomplished by adjusting the slope of a phase of the linear standard curve. In addition, the average length of the standard curve that is altered is substantially identical to the length of the standard curve that is not altered, where l=23.

While the present embodiment of FIG. 20B describes the adjusting of a slope of a phase of a period of a standard curve, other embodiments of the present invention are well suited to the manipulation of the slope of the linear standard curve in a point-by-point implementation. That is, the linear standard curve is modified over a portion of the linear standard curve that is contained within one or more phases of one or more periods. For instance, one portion in which the slope is adjusted corresponds to a smaller subset of phase P-1B. That is, the slope is modified within a phase P-1B of a period 2099 of the linear standard curve. In another embodiment, another portion in which the slope is adjusted corresponds to a subset of phase P-1B and phase P-2B. That is, the slope is modified between phases of a period of the linear standard curve, in one embodiment. Also, the slope is modified between phases of one or more periods of the linear standard curve, in another embodiment.

In another embodiment of the present invention, the linear standard curve is manipulated on a period-by-period basis. That is, the linear standard curve is modified over an entire cycle of the standard curve. For instance, the slopes of one period of the altered standard curve are associated with a first length. Also, the slopes of a second period of the altered standard are associated with a second length. That is the slope for a period of the linear standard curve is consistently modified throughout all phases in that period, and is associated with a first length. Also, the slope for another period of the linear standard curve is consistently modified throughout all phases in that period, and is associated with a second length.

Figure 19C:
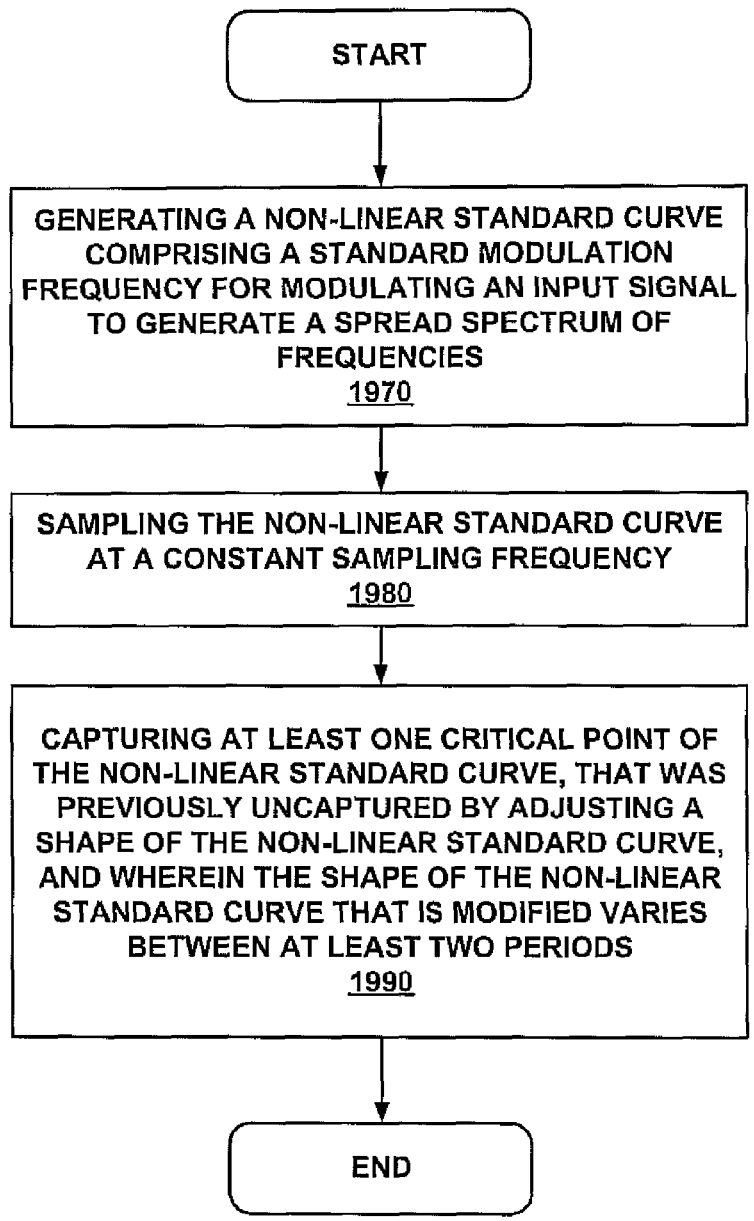
FIG. 19C is a flow diagram 1900C illustrating a computer implemented method for sampling a non-linear curve, in accordance with one embodiment of the present invention.

FIG. 19C is a flow diagram 1900C illustrating a computer implemented method for sampling a non-linear curve, in accordance with one embodiment of the present invention. Specifically, the method of flow diagram 1900C adjusts a shape of the non-linear standard curve in a spread spectrum modulator, such that critical points are captured when sampling the standard curve that this altered, in accordance with one embodiment of the present invention.

At 1970, the present embodiment generates a non-linear standard curve. For instance, FIGS. 11A, 11B, 12A, 12B, 13A, 13B, 13C, 13D, 14, and 15 and their corresponding discussions provide means for generating a standard curve. The standard curve is associated with a standard modulation frequency defining the shape of the standard curve. In addition, the standard curve is used for modulating an input signal to generate a spread spectrum of frequencies. In the present embodiment, the standard curve is a non-linear standard curve. That is, the non-linear standard curve (e.g., Hershey Kiss curve) is repeatable every four phases in a period of the standard curve.

At 1980, the present embodiment samples the non-linear standard curve at a constant sampling frequency. In other words, the sampling frequency sets the rate at which the non-linear standard curve is sampled. In one embodiment, the operation performed at 1950 is analogous to the operation performed at 1920, and as such, the description provided in the discussion of 1920 of flow diagram 1900A is not repeated.

At 1990, the present embodiment captures at least one critical point of the non-linear standard curve that was previously uncaptured. That is, when sampling the non-linear standard curve, critical points of the non-linear standard curve are captured. Specifically, the at least one critical point is captured by adjusting a shape of the non-linear standard curve. More particularly, the shape of the non-linear standard curve varies between at least two periods. However, in one embodiment, the non-linear standard curve that is altered is repeatable over one or more cycles.

In one embodiment, the at least one critical point is captured by modifying the shape for one phase of a period of the non-linear standard curve. More specifically, the shape of the non-linear standard curve is adjusted such that the shape for one phase of a period of the linear standard curve is altered from the standard shape associated with the standard modulation frequency. Also, the average length of one period of the standard curve is substantially equal to the standard length, wherein the standard length is determined by dividing the modulation frequency of the unaltered standard curve by the sampling frequency.

In particular, any deviation of the period, or correspondingly the frequency, in any portion of one or more periods of the standard curve is implemented to capture critical points when sampling the standard curve, in accordance with embodiments of the present invention.

For instance, FIG. 20A is a graph illustrating the manipulation of the non-linear standard curve in order to improve EMI reduction. In other words, FIG. 20A is a graph illustrating the proper sampling of the non-linear standard curve, in accordance with one embodiment of the present invention. Specifically, the shape is adjusted in one phase of the linear standard curve in FIG. 20A.

As shown in FIG. 20A, the horizontal axis represents an index indicating the sampled points of the standard curve. The vertical axis indicates the y value of the standard curve between −1 and +1. As described before in relation to FIGS. 11A and 11B, the y value is the current value generated by the accumulator 1120 and forms part of the standard curve that is sent to the spread spectrum modulation loop 1130, in one embodiment. As such, the plurality of y values generates the standard curve.

Also shown in FIG. 2000A, the combined frequency profiles of the standard curve is associated with a length of twenty-three, where l=23. In other words, the average length of the altered non-linear standard curve is substantially equal to the standard length, where the standard length is defined by dividing the standard modulation frequency by the sampling frequency, as provided in previously described Equation 1. That is, the standard curve is sampled at 23 points in one period of the standard curve. Previously, without any adjusting of the shape of the non-linear standard curve, critical points re not captured. However, in embodiments of the present invention, by altering the slope of the standard curve, critical points are captured.

In particular, the multi-phase, non-linear standard curve comprises four phases in one period 2001 of the altered non-linear standard curve: phase P-1A, phase P-2A, phase P-3A, and phase P-4A. Period 2001 begins at, but does not include, point 2010. Period 2001 ends at, and includes, point 2040.

Specifically, phase P-1A includes all points between points 2010 to 2031, to include point 2094. Phase P-1A includes critical point, zero cross-over point 2031. Also, phase P-2A occupies the portion of the standard curve after point 2031 up to and including critical, peak point 2020. In addition, phase P-3A occupies the portion of the standard curve after point 2020 up to and including critical, zero cross-over point 2032. In each of the phases P-1A, P-2A, and P-3A, the corresponding phase is sampled six times, and is associated with a length, where l=24. That is, each of the phases P-1A, P-2A, and P-3A is set to a first modulation frequency, where the length is defined by l=24. Each of the phases P-1A, P-2A, and P-3A is represented by the line connected by the open squares.

On the other hand, Phase P-4A occupies a portion of the standard curve after point 2032 up to and including critical, peak point 2040. Phase D is sampled 5 times, and is associated with a length, where l=20. That is, Phase D is set to a second period, where L=20 over a full cycle. Phase D is represented by the line connected by the open circles.

As such, for three of the four phases (P-1A, P-2A, and P-3A) of a period, the standard curve is sampled at a rate where the length of the standard curve over one period is l=24, where 6 points are sampled per phase. In the remaining phase (P-4A), the standard curve is sampled at a rate of five points per phase, in order to capture at least one critical point of the standard curve in that phase. In that manner, over one period, the length of the standard curve that is altered is substantially equal to the length of the unaltered standard curve, l=23. As a result, in FIG. 20A, the critical points (e.g., peaks and zero cross-over points) of the standard curve are captured. This is accomplished by adjusting the shape of a phase of the non-linear standard curve.

While the present embodiment of FIG. 20A describes the adjusting of a shape of a phase of a period of a non-linear standard curve, other embodiments of the present invention are well suited to the manipulation of the shape of the non-linear standard curve in a point-by-point implementation. That is, the non-linear standard curve is modified over a portion of the linear standard curve that is contained within one or more phases of one or more periods. For instance, one portion in which the slope is adjusted corresponds to a smaller subset of phase P-1A. That is, the shape is modified within phase P-1A of a period 2001 of the non-linear standard curve. In another embodiment, another portion in which the shape is adjusted corresponds to a subset of phase P-1A and phase P-2A. That is, the shape is modified between phases of a period of the linear standard curve, in one embodiment. Also, the shape is modified between phases of one or more periods of the linear standard curve, in another embodiment.

In another embodiment of the present invention, the linear standard curve is manipulated on a period-by-period basis. That is, the non-linear standard curve is modified over an entire period of the standard curve. For instance, the shapes of one period of the altered standard curve is associated with a first length. Also, the shapes of a second period of the altered standard are associated with a second length. That is the shape for a first period of the linear standard curve is consistently modified throughout all phases in that first period, and is associated with a first length. Also, the shape for the second period of the non-linear standard curve is consistently modified throughout all phases in that second period, and is associated with a second length. For example, to achieve an average length of twenty-three, where l=23, the frequency shape of three periods is associated with a length, l=24. A fourth period has a frequency shape that is associated with a length, l=20. As a result, the average length of the altered standard curve is associated with a length, l=23. As such, the critical points (e.g., peaks and zero cross-over points) of the standard curve are captured by adjusting the shape of a phase of the non-linear standard curve.

Spread Spectrum Modulation with Non-Consequitive Feedback Divide Values

In a spread spectrum modulated PLL, the number of different P's used by the P counter is often limited by the hardware. In one embodiment, a frequency modulated PLL is limited to use of four different P's. The P values can be P=50, 51, 52 and 53 in one implementation and P=60, 61, 62 and 63 in another implementation. It is appreciated that the values can be different and the values 50 though 53 and 60 through 63 are just examples. The different P values are sorted and arranged in ascendant order in the present example. With four different P values, a P sequence like 52, 51, 52, 50, 52, 53, 53, 52, 52, 51, . . . can be used to modulate the PLL frequency. In one embodiment with a limited number of different P's, the frequency spread percentage is limited. For example, with P=50, 51, 52 and 53 and one frequency configuration, the spread percentage can only be no more than 5%.

Non-consecutive P values (or P value spread) can be utilized to increase frequency spread in accordance with one embodiment of the present invention. In one embodiment, non-consecutive P values, arranged in ascendant order, have a P value step larger than minimum divider step between two adjacent P values. In other words, at least one spread between the P values are larger than minimum spread decided by the P counter. For example, the minimum step of an integer divider is one as seem in P=50, 51, 52 and 53. With spread adjustment or manipulation P values with a step of two or larger is non-consecutive, for example P=50, 52, 54 and 56. For another example, the minimum step of a half integer divider is 0.5. P values with a step of 1 or 1.5 is non-consecutive. The differences between two adjacent numbers can be the same or vary. For example, P values can increase by 3 (e.g., 50, 53, 56, 59) or can vary (e.g., 50, 52, 57, 58). In this patent application, when referring to consecutive or non-consecutive P, it means the relationship of different P values said above. Similar concept is also used for offset P value PO or index of control value.

In one embodiment, a non-consecutive P value is directly used in generating a P sequence. In one embodiment, the P sequence generation is implemented in software. In another embodiment, the P sequence generation is implemented in hardware, for example, using exemplary modulator architectures shown in FIGS. 3A, 3B and 5B.

In one embodiment, a P sequence is generated indirectly by adjusting an initial P sequence to a different P value spread. In one exemplary implementation, adjustments or manipulations are made to sorted unique values associated with a control pattern. It is appreciated the sorted unique values associated with a control pattern can include an index, P value or P offset value.

In one embodiment, first an initial P sequence using consecutive P values is generated. For example, it can be generated by exemplary modulator architecture shown in FIGS. 3A, 3B and 5B. Then the consecutive P value spread can be adjusted to non-consecutive P values. For example, a consecutive P value spread of P=50, 51, 52 and 53 can be mapped to a non-consecutive P value spread of P=50, 52, 54 and 56. In one exemplary implementation a consecutive P sequence is 52, 51, 52, 50, 52, 53, 53, 52, 52, 51, . . . , is adjusted to a non-consecutive P sequence of 54, 52, 54, 50, 54, 56, 56, 54, 54, 52, . . . . In one embodiment the P value spread adjustment is left side aligned, where the most left P values in the spread are the same. There can be right side and center aligned adjustment too.

It is appreciated that spread adjustments in accordance with the present invention can operate on a variety of elements associated with P counter control patterns. For example, the element can be an index (e.g. $i_{best}$ in FIG. 5B an offset P value, the P value itself, etc. In one embodiment, the adjustment includes mapping between two sets of numbers. In another embodiment, the adjustment includes a binary number shifting operation to an index or offset P. In another embodiment, the adjustment includes arithmetic manipulation of an index or offset P value.

Figure 21A:
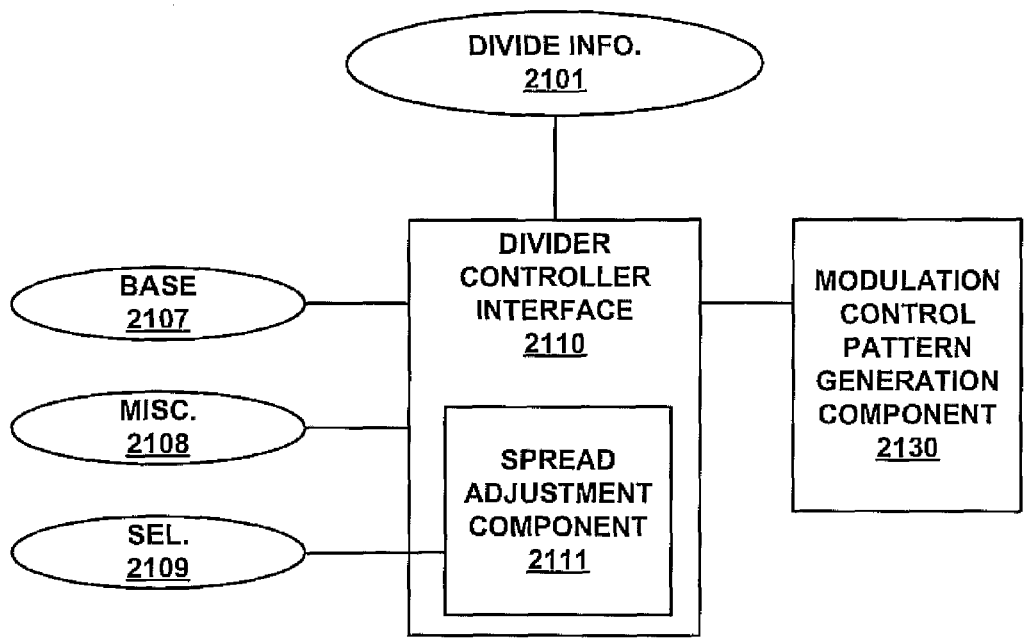
FIG. 21A is a block diagram of an exemplary phase lock loop controller in accordance with one embodiment of the present invention.

The FIG. 21A is a block diagram of exemplary phase lock loop controller 2100 in accordance with one embodiment of the present invention. Phase lock loop controller 2100 is similar to phase lock loop controller 290 except phase lock loop interface 2110 includes spread adjustment component 2111. Phase lock loop controller 2110 can be configured to implement control indications compatible with a spread spectrum control scheme. Phase lock loop controller 2100 includes divider controller interface 2110 and spread spectrum frequency control pattern generation component 2130. Divider controller interface 2110 is coupled to modulation control pattern generation component 2130.

The components of phase lock loop controller 2100 cooperatively operate to perform phase lock loop control. In one embodiment, modulation control pattern generation component 2130 generates a spread spectrum frequency modulated control pattern. In one exemplary implementation, modulation control pattern generation component 2130 is similar to modulation control pattern generation component 300. In one exemplary implementation, the feedback loop divider control value is adjustable between consecutive and non-consecutive. The spread adjusting component 2111 is controlled by non-consecutive indication signal 2109.

Figure 21B:
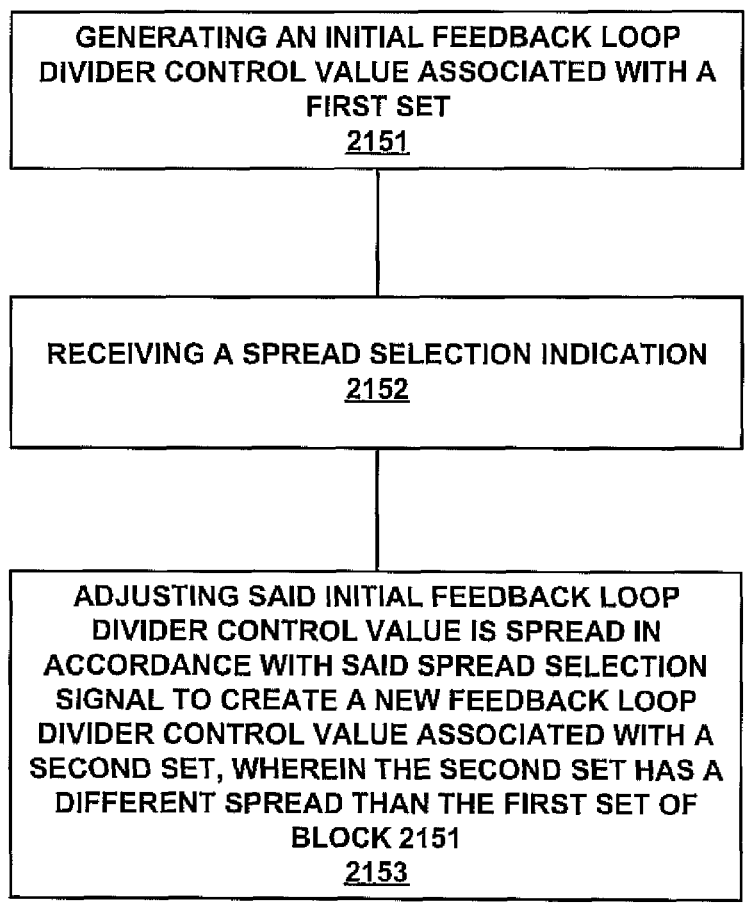
FIG. 21B is a flow chart of an exemplary feedback loop divider control value adjustment method in accordance with one embodiment of the present invention.
Figure 21C:
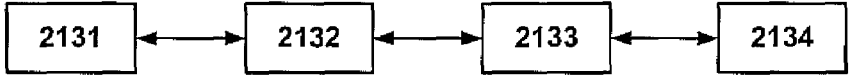
FIG. 21C is a block diagram of exemplary feedback loop divider control values in accordance with one embodiment of the present invention.
Figure 21C:
Figure 21C:
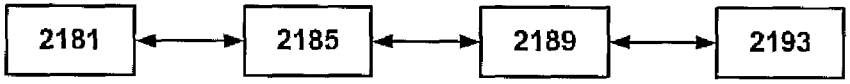

FIG. 21C is a block diagram of exemplary feedback loop divider control values in accordance with one embodiment of the present invention. Divider indication spread 2130 has a spread of 1 between the values of 2131, 2132, 2133 and 2134. Divider indication spread 2140 has a spread of 2 between the values of 2141, 2143, 2145 and 2147. Divider indication spread 2170 has a spread of 4 between the values of 2181, 2185, 2189 and 2193. The spread is the difference between two adjacent sorted unique numbers.

It is appreciated that spread adjusting component 2111 can adjust the spread in accordance with a variety of adjustment schemes. In one embodiment, spread adjusting component adjusts corresponding feedback loop divider control values or indexes based upon a predetermined relationship to a difference in consecutive feedback loop divider control values. In one exemplary implementation, the adjustments can be a multiple of an integer value. For example if a non-consecutive value is twice the difference of corresponding consecutive values or a multiple of 2 the values can increase from 50, 51, 52, 53 to 50, 52, 54, 56. In one embodiment the integer divider control value sequence is produced by a non-consecutive integer spread and a half integer divider control value sequence is produced by a consecutive integer spread. In one embodiment, the spread adjusting component 2111 is a shifter that shifts the P index or PO value to the left by 0, 1, 2 or 3 bits controlled by a 2-bit spread selection signal.

FIG. 21B is a flow chart of feedback loop divider control value adjustment method 2150 in accordance with one embodiment of the present invention. Feedback loop divider control value adjustment method 2150 permits a modulation spread amount to be increased or decreased. In one embodiment, non-consecutive feedback loop divider control values are generated for an integer divider (e.g., 50, 52, 54, 56) and a half integer divider (e.g., 50, 51, 52, 53).

In step 2151 an initial feedback loop divider control value associated with a first set is generated. In one embodiment, the initial feedback loop divider control value is generated by a modulation control pattern generation component (e.g., 2130).

In step 2152 a spread selection signal is received. The spread selection signal indicates a spread pattern. In one embodiment the spread selection signal can be utilized to indicate a non-consecutive spread.

In step 2153 the initial feedback loop divider control value is adjusted in accordance with said spread selection signal to create a new feedback loop divider control value associated with a second set, wherein the second set has a different spread than the first set of block 2151. In one embodiment, the adjustment utilizes a look-up table to map a P value associated with a first set of P values to another P value associated with a second set of P values that has a different spread. In one embodiment, the adjustment includes shifting a binary expression of an index value by a predetermined number of bits to the left.

A Simplified Phase Lock Loop Control Model System and Method

In one embodiment, a modulation control pattern generation component (e.g., modulation control pattern generation component 293) generates feedback divider control values, wherein a contribution of each of the feedback divider control values is proportional to the difference from each of the feedback divider control values to an average of the feedback divider control values. In one exemplary implementation, the contribution of each feedback divider control value in a simplified PLL modulation control model is governed by the relationship:

$$\text{contribution} \propto (P - \bar{P})$$

where $\bar{P}$ is the average P value. It is appreciated that the simplified model can be readily adapted to a variety of different implementations governed by a variety of simplified relationship expressions.

In one embodiment, the proportion is equal to a new feedback divider control value minus an average feedback divider control value divided by the average feedback divider control value. The contribution of each feedback divider control value in the simplified PLL modulation control model is governed by the relationship expressed as:

$$\text{contribution} \propto \frac{P - \bar{P}}{\bar{P}}$$

Specifically, for the exemplary modulator architecture shown in FIGS. 3A, 3B and 5B, the modulation control value is a scaled "phase error" or "error". It is governed by expression:

$$error = error + \Delta error$$

where $$\Delta error = \frac{P - \overline{P}}{\overline{P}} \text{normolized\_unit\_error}$$

or $$\Delta error = (P - \overline{P}) \cdot \text{unit\_error},$$

where the normalized_unit_error is an error contribution of an unit P (integer "one") normalized to average P; the unit_error is the error contribution of an unit P (integer one), which is actually vector resolution used in many previous examples.

In another embodiment, the control quantity is VCO frequency, and it is governed by expression:

$$f_{VCO} = f_{VCO} + \Delta f_{VCO}$$

where $$\Delta f_{VCO} = \frac{P - \overline{P}}{\overline{P}} \overline{f_{VCO}}$$

So with the simple PLL model, many expressions can be derived. They can be utilized to generate spread spectrum modulation patterns for frequency synthesizers. This can be implemented by hardware or software.

In one exemplary implementation, each feedback divider control value is associated with a contribution to the VCO phase error. In each modulation step P is selected so that its contribution changes the VCO phase error to the desired value. In one embodiment similar to FIGS. 3B and 5B, an integer vector contribution $v_i$ (i=1, 2, 3, . . . , n) and scaled phase error e can be used for easy hardware implementation. In one exemplary implementation, frequency control pattern generation system 300 uses an integer vector contribution $v_i$ and scaled phase error e to generate a spread spectrum modulation pattern for a frequency synthesizer. In each step, a best P is selected so that its contribution changes the VCO phase error to a desired value directed at reaching a goal or objective.

It is appreciated that embodiments operating in accordance with the simplified model can cause a VCO to track a variety of patterns. For example, the VCO frequency can track a Hershey Kiss curve, triangle curve, etc. It is also appreciated that the present model can be implemented with delta sigma enhancements, high order delta sigma enhancements, noise shaping, etc.

Figure 22:
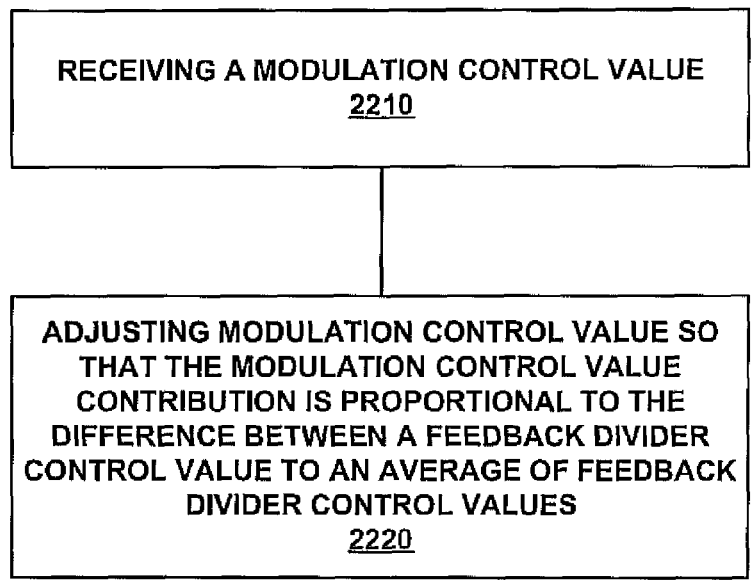
FIG. 22 is a flow chart of an exemplary simplified spread spectrum modulation pattern generation method in accordance with one embodiment of the present invention.

FIG. 22 is a flow chart of a simplified spread spectrum modulation pattern generation method 2200 in accordance with one embodiment of the present invention. In one embodiment, simplified spread spectrum modulation pattern generation method 2200 is similar to exemplary frequency spreading control patter generation method 400. In one embodiment, simplified spread spectrum modulation pattern generation method 2200 is implemented in software instructions stored a computer readable medium, where said instructions can be executed by a processor in a computer system.

In step 2210, a modulation control value is received. It is appreciated the modulation control value can have a variety of implementations. For example, a modulation control value can be a P value, a P offset, a frequency, a scaled error, etc.

In step 2200, the modulation control value is adjusted so that the modulation control value contribution is proportional to the difference between a feedback divider control value to an average of feedback divider control values. The proportion can also be defined by difference from each of the feedback divider control values to an average of the feedback divider control values divided by the average of feedback divider control values. In one embodiment, a best feedback divider control value is selected so that a VCO phase error is altered towards a target value.

It is appreciated the simplified feedback loop divider control value adjustment method can be implemented in software, hardware, firmware, etc. and/or a combination thereof. In one embodiment a computer readable medium stores instructions for directing a processor to implement a simplified feedback loop divider control value adjustment method (e.g., simplified spread spectrum modulation pattern generation method 2200).

It is appreciated that feedback loop divider control value modulation facilitates adjustment in frequency spread percentage. In one exemplary implementation, the frequency spread percentage can be increased from 3% to 5%. In one embodiment a spread spectrum modulation curve envelope (e.g., a Hershey curve) can be increased with minimal distortion.

Accordingly, embodiments of the present invention provide for the generation of improved frequency profiles by adjusting the modulation frequency or target frequency profile when performing spread spectrum modulation. Embodiments of the present invention provide the above accomplishments and provide for a method and system for modulating a standard signal implemented within a spread spectrum frequency synthesizer such that peaks of the standard curve are captured for improved EMI reduction. Embodiments of the present invention provide the above accomplishments and further provide for the generation of better frequency shapes for a spread spectrum modulation frequency synthesizer. Other embodiments provide the above accomplishments and are capable of improving the frequency shapes at peaks and valleys of a standard curve in order to improve EMI reduction, wherein the standard curve is used for modulation in the spread spectrum modulation frequency synthesizer. It is appreciated that the present invention can be implemented to facilitate generation of modulated signals that are compatible with a variety of difference modulation schemes. In one embodiment, present invention modulation is utilized in frequency synthesis. It is also appreciated that the present invention can be compatible with facilitating realization of a number of objectives, including EMI reduction, encryption, radio communication, etcetera.

The foregoing descriptions of specific embodiments of the present invention, a method and system for the generation of improved frequency profiles by adjusting the modulation frequency or target frequency profile when performing spread spectrum modulation, have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

What is claimed is:

1. A modulator circuit used for producing a signal of modulated frequency, comprising:
   an accumulator for summing a plurality of errors in said modulator circuit and generating an error sum value, wherein said accumulator increases the rate of sign change of said plurality of errors; and
   an error signal modulator coupled to said accumulator for modulating an index that is associated with a current error based on said error sum value, wherein said index that is modulated is used for selecting feedback loop divider count values used for dividing a frequency of said signal.

2. The modulator circuit of claim 1, wherein said accumulator sums a current error and a previously summed error, wherein said current error is selected from one of a plurality of error values compensated by positive and negative vector values extending from an average value equal to a fraction by which a divider in a phased lock loop divides a frequency of said signal.

3. The modulator circuit of claim 2, further comprising:
   a delay module coupled to said accumulator for providing said previously summed error from a previous modulation step.

4. The modulator circuit of claim 1, wherein said error signal modulator modulates said index based on a most significant bit output of said error sum value.

5. The modulator circuit of claim 4, wherein said index is changed to decrease said error when said most significant bit is positive, and wherein said index is changed to increase said error when said most significant bit output is negative.

6. The modulator circuit of claim 1, wherein said error signal modulator modulates said index based on a most significant bit output of said previously summed error.

7. The modulator circuit of claim 6, wherein said index is changed to decrease said error when said most significant bit output is positive, and wherein said index is changed to increase said error when said most significant bit output is negative.

8. The modulator circuit of claim 5, wherein a range of said noise adjusted index is limited to a maximum value and a minimum value.

9. The modulator circuit of claim 1, further comprising:
   a cross zero selector for determining said index.

10. The modulator circuit of claim 1, wherein said signal comprises a spread spectrum modulated frequency.

11. The modulator circuit of claim 1, wherein said signal comprises a fractional-N modulated frequency.

12. A frequency synthesizer circuit for producing a signal of modulated frequency, comprising:
   a phase-locked-loop comprising a fractional divider that fractionally divides a frequency of said signal corresponding to a fraction;
   a noise shaping modulator circuit coupled to said phase-locked-loop for increasing a rate of sign change of a plurality of errors used to select a fractional divider count value based upon an accumulated error of said plurality of errors.

13. The circuit of claim 12, wherein said noise shaping modulator circuit comprises:
   an accumulator for generating an error sum value by summing a current error in a current modulation step and a previously summed error from a previous modulation step; and
   an error signal modulator coupled to said accumulator for modulating an index that is associated with said current error based on said error sum value to determine a noise adjusted index, wherein said noise adjusted index is used for selecting feedback loop divider count values used for dividing a frequency of said signal.

14. The circuit of claim 13, wherein said current error is selected from one of said plurality of errors compensated by positive and negative vector values from an average value equal to a fraction by which a divider in a phased lock loop divides a frequency of said signal.

15. The circuit of claim 13, further comprising:
   a delay module coupled to said accumulator for providing said previously summed error from said previous modulation step.

16. The circuit of claim 12, further comprising:
   a zero cross selector for selecting said index.

17. A method for producing a signal of modulated frequency, comprising:
   generating an error sum value by summing a current error in a current modulation step and a previously summed error from a previous modulation step;
   modulating an index associated with said current error based on said error sum value to obtain a noise adjusted index, wherein said noise adjusted index is used for selecting feedback loop divider count values used for dividing a frequency of said signal.

18. The method of claim 17, wherein said modulating an index comprises:
   changing said index to increase a value of a future error when said most significant bit indicates a sign of said error sum value is negative; and
   changing said index to decrease said value of said future error when said most significant bit indicates said sign is positive.

19. The method of claim 18, wherein said changing said index to increase a value comprises:
   limiting a range of said noise adjusted index to a maximum value; and
   limiting a range of said noise adjusted index to a minimum value.

20. The method of claim 17, further comprising:
   receiving a modulation signal;
   mixing said modulation signal with an modulated error signal to produce an error modulated signal;
   mixing said modulated error signal with a plurality of compensation vectors to produce a plurality of errors, wherein said plurality of errors is associated with a plurality of indexes; and
   choosing said current error from said plurality of errors having a least error from a target signal, wherein said current error is associated with said index.

21. The method of claim 17, wherein said modulation signal exhibits a spread spectrum of frequencies with decreased amplitude and a spreading of bandwidth.

22. The method of claim 17, further comprising:
   determining a P-value based upon said noise adjusted index.

* * * * *